US012765385B2

(12) United States Patent
Fitzgerald

(10) Patent No.: US 12,765,385 B2
(45) Date of Patent: Oct. 13, 2026

(54) COAXIAL I/O DIE COMPRISING COAXIAL INPUT/OUTPUT (IO) CONNECTIONS, AND COAXIAL PROBING TOOLS FOR MEASURING RF SIGNAL PERFORMANCE AND INTEGRITY

(71) Applicant: BAE Systems Information and Electronic Systems Integration Inc., Nashua, NH (US)

(72) Inventor: Jeffrey Fitzgerald, Lunenburg, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 829 days.

(21) Appl. No.: 18/153,470

(22) Filed: Jan. 12, 2023

(65) Prior Publication Data

US 2024/0243074 A1 Jul. 18, 2024

(51) Int. Cl.

| | |
|---|---|
| ***H10W 42/20*** | (2026.01) |
| ***H10W 70/09*** | (2026.01) |
| ***H10W 70/60*** | (2026.01) |
| ***H10W 72/00*** | (2026.01) |
| ***H10W 72/90*** | (2026.01) |

(Continued)

(52) U.S. Cl.

CPC ......... *H10W 42/20* (2026.01); *H10W 74/014* (2026.01); *H10W 74/019* (2026.01); *H10W 90/00* (2026.01); *H10W 70/09* (2026.01); *H10W 70/60* (2026.01); *H10W 72/0198* (2026.01); *H10W 72/926* (2026.01); *H10W 72/931* (2026.01); *H10W 72/932* (2026.01); *H10W 72/936* (2026.01); *H10W 72/9415* (2026.01); *H10W 72/9445* (2026.01); *H10W 90/794* (2026.01)

(58) Field of Classification Search

CPC ... H01L 23/552; H01L 23/66; H01L 2224/19; H01L 24/19; H01L 24/05; H01L 24/06; H01L 24/08; H01L 2224/0603; H01L 2224/06051; H01L 2224/08237; H01L 2224/08238; H10W 72/90; H10W 72/931; H10W 70/09; H10W 70/60; H10W 90/794; H10W 72/9445; H10W 72/932; H10W 42/20; H10W 74/014; H10W 74/019; H10W 90/00; H10W 44/20; H10W 72/0198; H10W 72/926; H10W 72/936; H10W 72/9415

USPC ........................................................... 257/659

See application file for complete search history.

(56) References Cited

U.S. PATENT DOCUMENTS 5,151,769 A * 9/1992 Immorlica, Jr. .... H10W 70/093 257/659

5,535,084 A * 7/1996 Nakayama ............ H10D 89/60 361/111

(Continued)

*Primary Examiner* — Didarul A Mazumder

(74) *Attorney, Agent, or Firm* — Sand, Sebolt & Wernow LPA; Gary McFaline

(57) ABSTRACT

A semiconductor package that may comprise a mixed signal die having a first surface operably engaged with an interconnect and a second surface opposite to the first surface, and at least one set of input/output (IO) connections on the mixed signal die. The at least one set of IO connections is configured to be electromagnetically shielded in a non-linear geometry from at least another set of IO connections that is different from the at least one set of IO connections.

11 Claims, 33 Drawing Sheets

(51) Int. Cl.
*H10W 74/01* (2026.01)
*H10W 90/00* (2026.01)

(56) References Cited

U.S. PATENT DOCUMENTS

| | | | | |
|---|---|---|---|---|
| 8,017,943 | B2 | 9/2011 | Ojiro | |
| 8,242,613 | B2 | 8/2012 | Verma et al. | |
| 8,432,022 | B1 * | 4/2013 | Huemoeller | H10W 42/20 257/659 |
| 2008/0182120 | A1 | 7/2008 | Tan et al. | |
| 2013/0249075 | A1 * | 9/2013 | Tateiwa | H05K 1/185 257/734 |
| 2015/0130007 | A1 | 5/2015 | Kawamura | |

* cited by examiner

COAXIAL I/O DIE COMPRISING COAXIAL INPUT/OUTPUT (IO) CONNECTIONS, AND COAXIAL PROBING TOOLS FOR MEASURING RF SIGNAL PERFORMANCE AND INTEGRITY

TECHNICAL FIELD

The present disclosure generally relates to interconnecting various dies to create semiconductor packages, coaxial input/output (IO) connections provided on dies, and coaxial probing tools for measuring RF signal performance and integrity.

BACKGROUND

In the field of electronics, semiconductor packages or integrated circuit packages include one or more semiconductor materials and components that are encapsulated in a supporting case or package to prevent damage, corrosion, or other harmful events to the integrated circuit. Once manufactured, these semiconductor packages may be mounted and/or interconnected with a printed-circuit board (or PCB). Generally, however, mounting and/or interconnecting these semiconductor packages to a PCB require specific methods and techniques to ensure electrical designs, mechanical designs, and thermal designs are met as dictated by the implantation of the semiconductor packages.

To combat these design hurdles, semiconductor packages may use various devices, such as interposers, substrates, and other devices or the like, to interconnect semiconductor dies and other electrical devices in a single semiconductor packages. However, such methods of interconnecting electrical devices require various electrical, mechanical, and thermal designs. In one instance, a first set of electrical devices may need to be positioned at the perimeter of the interposer or substrate for electrical purposes while a second set of electrical devices may need to be positioned towards the center of the interposer or substrate; such specific design parameters may impede or hinder performance of the semiconductor package and/or increase the overall size, shape, and configuration of the semiconductor package. In another instance, conventional electrical connections, such as wiring bonding, solder balls, copper pillars, silicon bridges, etc., may be required to electrically interconnect various dies together along with other electrical component based on the implementation of the semiconductor package; such use of these electrical connections may impede or hinder performance of the semiconductor package and/or increase the overall size, shape, and configuration of the semiconductor package.

Furthermore, testing and/or probing of bond pads, such as bond pads of radio frequency input/output connections, as provided on the semiconductor dies is rather difficult and costly for users of these semiconductor pads. Given the size, shape, and configuration of specific bond pads on a small semiconductor die, the probing of these specific bond pads with convention coaxial probes may become tedious and time consuming. In conventional probe tips of coaxial probes, these probe tips generally comprise of a coaxial cable that transitions to independent spring fingers and/or tips in a ground-signal-ground coplanar wavelength configured to match general radio frequency input/output connections. However, these conventional probe tips may lack the specific characteristics of shielding for test purposes. Moreover, conventional coaxial probes used to test bond pads of radio frequency input/output connections are rather costly for users. Even with such costs, these conventional probes also lack in operating over a wider ranges of frequencies given the configuration of these coaxial probes.

SUMMARY

The present disclosure is generally directed towards non-rigid and/or curvilinear pad structures and layouts manufactured on a die for use of interconnects. In one example, the non-rigid and/or curvilinear pad structures and layouts manufactured on a die may be used to electrically connect said die with another separate die. In another example, the non-rigid and/or curvilinear pad structures and layouts manufactured on a die may be used for building at least another level on the die for an assembly of a semiconductor package. With such curvilinear and/or non-rigid structures, previous confinements of non-curvilinear structures and/or shapes of bond pad structures and layouts may be removed to create broader manufacturing capabilities for electrical connections. Moreover, the I/O features of the present disclosure may lend to creations of interconnects where topology is optimized for mass reduction, CTE compliance, electrical properties (such as shielding), reducing the effects of electromigration, and other optimization characteristics.

In one aspect, an exemplary embodiment of the present disclosure may provide a semiconductor package. The semiconductor package may include at least one section having at least one die and at least one electrical structure operably engaged directly with the at least one die. The semiconductor package may also include at least another section having at least another die and at least another electrical structure operably engaged directly with the at least another die. The at least one section and the at least another section directly engage with one another via wafer bonding of the at least one electrical structure and the at least another electrical structure. The at least one section and the at least another section are also formed entirely of metal materials.

This exemplary embodiment or another exemplary embodiment may further include that the at least one section comprises: at least one complaint support structure operably engaged with the at least one die and the at least one electrical structure; wherein the at least one die and the at least one electrical structure are encased by the at least one compliant support structure. This exemplary embodiment or another exemplary embodiment may further include that the at least one complaint support structure further includes a stochastic structure or a non-stochastic structure. This exemplary embodiment or another exemplary embodiment may further include that the at least another section comprises: at least another compliant support structure operably engaged with the at least another die and the at least another electrical structure; wherein the at least another die and the at least another electrical structure are encased by the at least another compliant support structure. This exemplary embodiment or another exemplary embodiment may further include that the at least another complaint support structure further includes a stochastic structure or a non-stochastic structure. This exemplary embodiment or another exemplary embodiment may further include at least one air cavity structure provided between the at least one die and the at least one electrical structure of the at least one section or the at least another die and the at least another electrical structure of the at least another section. This exemplary embodiment or another exemplary embodiment may further include that the at least one section further comprises: a first temporary carrier operably engaged at a first position with each of the at least one die and remote from the at least one electrical structure. This exemplary embodiment or another exemplary embodiment may further include that the at least one section further comprises: at least one air cavity structure provided between the at least one die and the at least one electrical structure of the at least one section; and a first temporary carrier operably engaged at a first position with each of the at least one air cavity structure and remote from the at least one electrical structure. This exemplary embodiment or another exemplary embodiment may further include that the at least one section further comprises: a second temporary carrier operably engaged at a second position with the at least one die and remote from the at least one electrical structure; wherein when the first temporary carrier is removed from the at least one die and the at least one electrical structure, the second temporary carrier operably engages with the at least one die, and wherein when the first temporary carrier engages the at least one die and the at least one compliant structure, the second temporary carrier does not engage the at least one die. This exemplary embodiment or another exemplary embodiment may further include that the at least another section further comprises: a third temporary carrier operably engaged at a first position with each of the at least another die and remote from the at least another electrical structure. This exemplary embodiment or another exemplary embodiment may further include that the at least another section further comprises: a fourth temporary carrier operably engaged at a second position with the at least another die and remote from the at least another electrical structure; wherein when the third temporary carrier is removed from the at least another die, the fourth temporary carrier operably engages with the at least another die.

In another aspect, an exemplary embodiment of the present disclosure may provide a method. The method may comprise steps of providing at least one die engaged directly with an end of at least one electrical structure that forms at least one section; providing at least another die engaged directly with an end of at least another electrical structure that forms at least another section; providing at least one compliant support structure positioned about the at least one die; providing at least another compliant support structure positioned about the at least another die; providing another end of the at least one electrical structure engaged directly with another end of the at least another electrical structure; wherein the another end of the at least one electrical structure is opposite to the end of the at least one electrical structure; and wherein the another end of the at least another electrical structure is opposite to the end of the at least another electrical structure; and producing a semiconductor package, wherein the at least one section and the at least another section are formed entirely of metal materials.

This exemplary embodiment or another exemplary embodiment may further include steps of providing at least one temporary carrier directly engaged with an end of the at least one die; and providing at least another temporary carrier directly engaged with the at least one compliant support structure and towards an opposite end of the at least one die; wherein the steps of providing the at least one temporary carrier directly engaged with the end of the at least one die and providing at least another temporary carrier directly engaged with the at least one compliant support structure and towards the opposite end of the at least one die are completed prior to the step of providing the at least one die directly with the end of the at least one electrical structure that forms the at least one section. This exemplary embodiment or another exemplary embodiment may further include a step of providing an air cavity structure between the at least one die one of the at least one temporary carrier. This exemplary embodiment or another exemplary embodiment may further include a step of removing the at least one temporary carrier from the at least one die and the at least one compliant support structure prior to the step of providing the at least one die directly engaged directly with the end of the at least one electrical structure that forms the at least one section. This exemplary embodiment or another exemplary embodiment may further include steps of providing at least one temporary carrier directly engaged with an end of the at least another die; and providing at least another temporary carrier directly engaged with the at least another compliant support structure and towards an opposite end of the at least another die; wherein the steps of providing at least one temporary carrier directly engaged with the end of the at least another die and providing at least another temporary carrier directly engaged with the at least another compliant support structure and towards the opposite end of the at least another die are completed prior to the step of providing the at least another die directly with the end of at least another electrical structure that forms the at least another section. This exemplary embodiment or another exemplary embodiment may further include a step of providing an air cavity between the at least another die and the at least one temporary carrier. This exemplary embodiment or another exemplary embodiment may further include a step of removing the at least one temporary carrier from the at least another die and the at least one compliant support structure prior to the step of providing at least another die directly with the end of the at least another electrical structure that forms the at least another section. This exemplary embodiment or another exemplary embodiment may further include steps of providing a plurality of solder balls with one of the at least one section and the at least another section; and testing the semiconductor package via the plurality of solder balls. This exemplary embodiment or another exemplary embodiment may further include steps of providing a plurality of solder balls with one of the at least one section and the at least another section; and providing a second semiconductor package with the semiconductor package.

In yet another aspect, an exemplary embodiment of the present disclosure may provide a semiconductor package. The semiconductor package may comprise an interconnect; a mixed signal die having a first surface operably engaged with the interconnect and a second surface opposite to the first surface; and at least one set of input/output (IO) connections on the mixed signal die. The at least one set of IO connections is configured to be electromagnetically shielded in a non-linear geometry from at least another set of IO connections that is different from the at least one set of IO connections.

This exemplary embodiment or another exemplary embodiment may further include that the at least one set of IO connections further comprises: at least one radio frequency (RF) connection formed on the mixed signal die; wherein at least one bond pad of the at least one RF connection is configured to be electromagnetically shielded in a non-linear geometry from the at least another set of IO connections adjacent to the at least one RF connection. This exemplary embodiment or another exemplary embodiment may further include that the at least one set of IO connections further comprises: at least one radio frequency (RF) connection formed on the mixed signal die; the at least one RF connection comprises: a first bond pad; and a second bond pad circumferentially surrounded by the first bond pad in a continuous, non-linear geometry to electromagnetically shield the second bond pad. This exemplary embodiment or another exemplary embodiment may further include that the at least one set of IO connections further comprises: at least one radio frequency (RF) connection formed to the second surface of the mixed signal die; the at least one RF connection comprises: a first bond pad; and a second bond pad circumferentially surrounded by the first bond pad in a continuous, curvilinear shape to electromagnetically shield the second bond pad. This exemplary embodiment or another exemplary embodiment may further include at least one electromagnetic interference (EMI) fence formed to the second surface of the mixed signal die and formed with the at least one RF connection; wherein the at least one EMI fence is configured to electromagnetically shield the second bond pad of the at least one RF connection. This exemplary embodiment or another exemplary embodiment may further include that the at least one EMI fence comprises: a first end formed with the first bond pad of the at least one RF connection; a second end opposite to the first end and remote from the first bond pad of the at least one RF connection; and at least one curve formed between the first end and the second end. This exemplary embodiment or another exemplary embodiment may further include that the at least one set of IO connections further comprises: at least another RF connection on the mixed signal die and positioned adjacent to the at least one RF connection; the at least another RF connection comprises: a first bond pad; and a second bond pad circumferentially surrounded by the first bond pad in a continuous, non-linear geometry to electromagnetically shield the second bond pad. This exemplary embodiment or another exemplary embodiment may further include at least another EMI fence on the mixed signal die and formed with the at least another RF connection; wherein the at least one EMI fence is configured to electromagnetically shield the second bond pad of the at least one RF connection. This exemplary embodiment or another exemplary embodiment may further include that the at least another EMI fence comprises: a first end formed with the first bond pad of the at least another RF connection; a second end opposite to the first end and remote from the first bond pad of the at least another RF connection; and at least another curve shape formed between the first end and the second end. This exemplary embodiment or another exemplary embodiment may further include that the first bond pad further comprises: a first surface; a second surface extending from the first surface; a circumferential wall extending between the first surface and the second surface; wherein each of the first surface, the second surface, and the circumferential wall is continuous and uninterrupted. This exemplary embodiment or another exemplary embodiment may further include that the mixed signal die comprises: a first peripheral edge; a second peripheral edge being perpendicular to the first peripheral edge; a third peripheral edge being parallel with the first peripheral edge and perpendicular to the second peripheral edge; and a fourth peripheral edge being parallel with the second peripheral edge and perpendicular to the third peripheral edge; wherein the at least one RF connection is located interior to the first peripheral edge, the second peripheral edge, the third peripheral edge, and the fourth peripheral edge. This exemplary embodiment or another exemplary embodiment may further include that the mixed signal die comprises: a first peripheral edge; a second peripheral edge being perpendicular to the first peripheral edge; a third peripheral edge being parallel with the first peripheral edge and perpendicular to the second peripheral edge; and a fourth peripheral edge being parallel with the second peripheral edge and perpendicular to the third peripheral edge; wherein the at least one RF connection is located proximate to at least one of the first peripheral edge, the second peripheral edge, the third peripheral edge, and the fourth peripheral edge.

In yet another aspect, an exemplary embodiment of the present disclosure may provide a method. The method may comprise steps of connecting a first surface of a mixed signal die to an interconnect; providing at least one bond pad of at least one input/output (IO) connection on the mixed signal die; providing at least another bond pad of the at least one IO connection on the mixed signal die, wherein the at least another bond pad is formed continuously about the at least one die pad in a non-linear geometry; providing at least another IO connection on the mixed signal die differing from the at least one IO connection; and shielding the at least one bond pad of the at least one IO connection, via the at least another bond pad of the at least one IO connection, from the at least another I/O connection.

This exemplary embodiment or another exemplary embodiment may further include that the at least one IO connection is a radio frequency (RF) connection. This exemplary embodiment or another exemplary embodiment may further include steps of engaging an inner conductor of a coaxial cable with the at least one bond pad of the at least one IO connection; and engaging an outer conductor of the coaxial cable with the at least one another pad of the at least one IO connection; wherein the coaxial cable is directly connected to the mixed signal die. This exemplary embodiment or another exemplary embodiment may further include a step of providing the at least one bond pad of the at least one IO connection and the at least one bond pad of the at least IO connection proximate to at least one of a first peripheral edge of the mixed signal die, a second peripheral edge of the mixed signal die, a third peripheral edge of the mixed signal die, and a fourth peripheral edge of the mixed signal die or remote from a first peripheral edge of the mixed signal die, a second peripheral edge of the mixed signal die, a third peripheral edge of the mixed signal die, and a fourth peripheral edge of the mixed signal die. This exemplary embodiment or another exemplary embodiment may further include a step of providing at least one electromagnetic interference (EMI) fence formed to the second surface of the mixed signal die and formed with the at least one IO connection; wherein the at least one EMI fence is configured to electromagnetically shield the first bond pad of the at least one IO connection. This exemplary embodiment or another exemplary embodiment may further include steps of providing at least one bond pad of a third input/output IO connection to the second surface of the mixed signal die; providing at least another bond pad of the third IO connection to the second surface of the mixed signal die, wherein the at least another bond pad of the third IO connection is formed continuously about the at least one die pad in a non-linear geometry; providing a fourth IO connection to the second surface of the mixed signal die differing from the at least one IO connection; and shielding the at least one bond pad of the third IO connection, via the at least another bond pad of the third IO connection, from the fourth I/O connection. This exemplary embodiment or another exemplary embodiment may further include steps of engaging an inner conductor of a second coaxial cable with the at least one bond pad of the third IO connection; and engaging an outer conductor of the second coaxial cable with the at least one another pad of the third IO connection; wherein the second coaxial cable is directly connected to the mixed signal die. This exemplary embodiment or another exemplary embodiment may further include a step of providing at least another EMI fence formed to the second surface of the mixed signal die and formed with the third IO connection; wherein the at least another EMI fence is configured to electromagnetically shield the at least one bond pad of the third IO connection.

In yet another aspect, an exemplary embodiment of the present disclosure may provide a coaxial pad probe for coupling with a preexisting coaxial cable having a first end and a second end opposite to the first end and remote from the analyzing device. The coaxial pad probe may comprise of a probe operably engaged with the second end of the preexisting coaxial cable. The probe may be configured to directly contact a coaxial input/output (IO) connection provided on a mixed signal die or a coplanar IO connection provided on the mixed signal die for measuring S-parameter measurement of the mixed signal die.

This exemplary embodiment or another exemplary embodiment may further include that the probe defines a tapered configuration. This exemplary embodiment or another exemplary embodiment may further include that the probe comprises: a support structure operably engaged with second end of the preexisting coaxial cable; and a probe tip operably engaged with the support structure and configured to directly contact with the selected coaxial IO connection provided on the mixed signal die or the coplanar IO connection provided on the mixed signal die. This exemplary embodiment or another exemplary embodiment may further include that the support structure comprises: a first end of the support structure operably engaged with the second end of the preexisting coaxial cable and defining a first diameter; and a second end of the support structure opposite to the first end of the support structure and operably engaged with the probe tip and defining a second diameter; wherein the first diameter is greater than the second diameter. This exemplary embodiment or another exemplary embodiment may further include that the probe tip comprises: a first end of the probe tip operably engaged with the second end of the support structure; a second end of the probe tip opposite to the first end of the probe tip and configured to directly contact with the selected coaxial IO connection provided on the mixed signal die or the coplanar IO connection provided on the mixed signal die; a first diameter defined at the first end; and a second diameter defined at the second end that is equal with the first diameter. This exemplary embodiment or another exemplary embodiment may further include that the support structure comprises: a first end of the support structure operably engaged with the second end of the preexisting coaxial cable and defining a first diameter; and a second end of the support structure opposite to the first end of the support structure and operably engaged with the probe tip and defining a second diameter; wherein the first diameter and the second diameter are equal with one another. This exemplary embodiment or another exemplary embodiment may further include that the support structure further comprises: a first outer connection operably engaged with an outer conductor of the preexisting coaxial cable at the second end of the preexisting coaxial cable. This exemplary embodiment or another exemplary embodiment may further include that the support structure further comprises: a first inner connection operably engaged to an inner conductor of the preexisting coaxial cable at the second end of the preexisting coaxial cable; wherein the first inner connection is positioned inside of the first outer connection and is free from connecting with the first outer connection. This exemplary embodiment or another exemplary embodiment may further include that the support structure further comprises: a dielectric component operably engaged with the first outer connection and the first inner connection; wherein the dielectric component suspends the first inner connection inside of the first outer connection. This exemplary embodiment or another exemplary embodiment may further include that the probe tip further comprises: a second outer connection operably engaged with the first outer connection; wherein the second outer connection and the outer conductor are in electrical communication with one another via the first outer connection. This exemplary embodiment or another exemplary embodiment may further include that the probe tip further comprises: a second inner connection operably engaged with the first inner connection; wherein the second inner connection is positioned inside of the second outer connection and is free from connecting with the second outer connection; wherein the second inner connection and the inner conductor are in electrical communication with one another via the first inner connection of the support structure. This exemplary embodiment or another exemplary embodiment may further include that the probe tip further comprises: a dielectric component operably engaged with the second outer connection and the second inner connection; wherein the air dielectric suspends the second inner connection inside of the second outer connection. This exemplary embodiment or another exemplary embodiment may further include a protruding structure extending from the support structure and the probe tip; wherein the protruding structure is configured to directly contact the coplanar IO connection provided on the mixed signal die for measuring S-parameter measurement of the mixed signal die. This exemplary embodiment or another exemplary embodiment may further include that the protruding structure further comprises: a first end operably engaged with the support structure and the probe tip; a second end opposite to the first end and remote from the support structure and the probe tip; and a side passageway extending between the first end and the second end. This exemplary embodiment or another exemplary embodiment may further include that the support structure further comprises: a first outer connection operably engaged with an outer conductor of the preexisting coaxial cable at the second end of the preexisting coaxial cable; and a first inner connection operably engaged to an inner conductor of the preexisting coaxial cable at the second end of the preexisting coaxial cable and is positioned inside of the first outer connection and is free from connecting with the first outer connection; wherein the probe tip further comprises: a second outer connection operably engaged with the first outer connection; and a second inner connection operably engaged to the first inner connection and is free from connecting with the first outer connection; wherein the second inner connection is positioned inside of the second outer connection and positioned inside of the protruding structure.

In yet another aspect, an exemplary embodiment of the present disclosure may provide a method for measuring an S-parameter measurement of a mixed signal die. The method may comprise steps of connecting a first end of a coaxial cable with an analyzing device; providing a probe with a second end of the coaxial cable to construct a coaxial pad probe; contacting a first bond pad provided on the mixed signal die with the probe; contacting a second bond pad provided on the mixed signal die with the probe; and measuring the S-parameter measurement of the mixed signal die.

This exemplary embodiment or another exemplary embodiment may further include that the step of measuring the S-parameter measurement of the mixed signal die is accomplished by measuring an electrical signal at a coaxial input/output (IO) connection provided on the mixed signal die or a coplanar IO connection provided on the mixed signal die. This exemplary embodiment or another exemplary embodiment may further include that the step of providing the probe with the first end of the coaxial cable further comprises: providing a first outer connection of a support structure of the probe with an outer conductor of the coaxial cable; providing a first inner connection of the support structure of the probe with an inner conductor of the coaxial cable; providing a second outer connection of a probe tip of the probe with the first outer connection of the support structure; and providing a second inner connection of the probe tip of the probe with the first inner connection of the support structure. This exemplary embodiment or another exemplary embodiment may further include that the step of contacting the first bond pad provided on the mixed signal die further comprises: contacting the second outer connection with the first bond pad provided on the mixed signal die; and wherein the step of contacting the second bond pad provided on the mixed signal die further comprises: contacting the second inner connection with the second bond pad provided on the mixed signal die; wherein the mixed signal die is a coaxial IO connection. This exemplary embodiment or another exemplary embodiment may further include that the step of providing the probe with the first end of the coaxial cable further comprises: providing a first outer connection of a support structure of the probe with an outer conductor of the coaxial cable; providing a first inner connection of the support structure of the probe with an inner conductor of the coaxial cable; providing a second outer connection of a probe tip of the probe with the first outer connection of the support structure; providing a second inner connection of the probe tip of the probe with the first inner connection of the support structure; providing a protruding structure with the first outer connection and the second outer connection; wherein the second inner connection is provided inside of the protruding structure. This exemplary embodiment or another exemplary embodiment may further include that the step of contacting the first bond pad provided on the mixed signal die further comprises: contacting the second outer connection and the protruding structure with the first bond pad provided on the mixed signal die; and wherein the step of contacting the second bond pad provided on the mixed signal die further comprises: contacting the second inner connection with the second bond pad provided on the mixed signal die; wherein the mixed signal die is a coplanar IO connection.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

DETAILED DESCRIPTION

Figure 1:
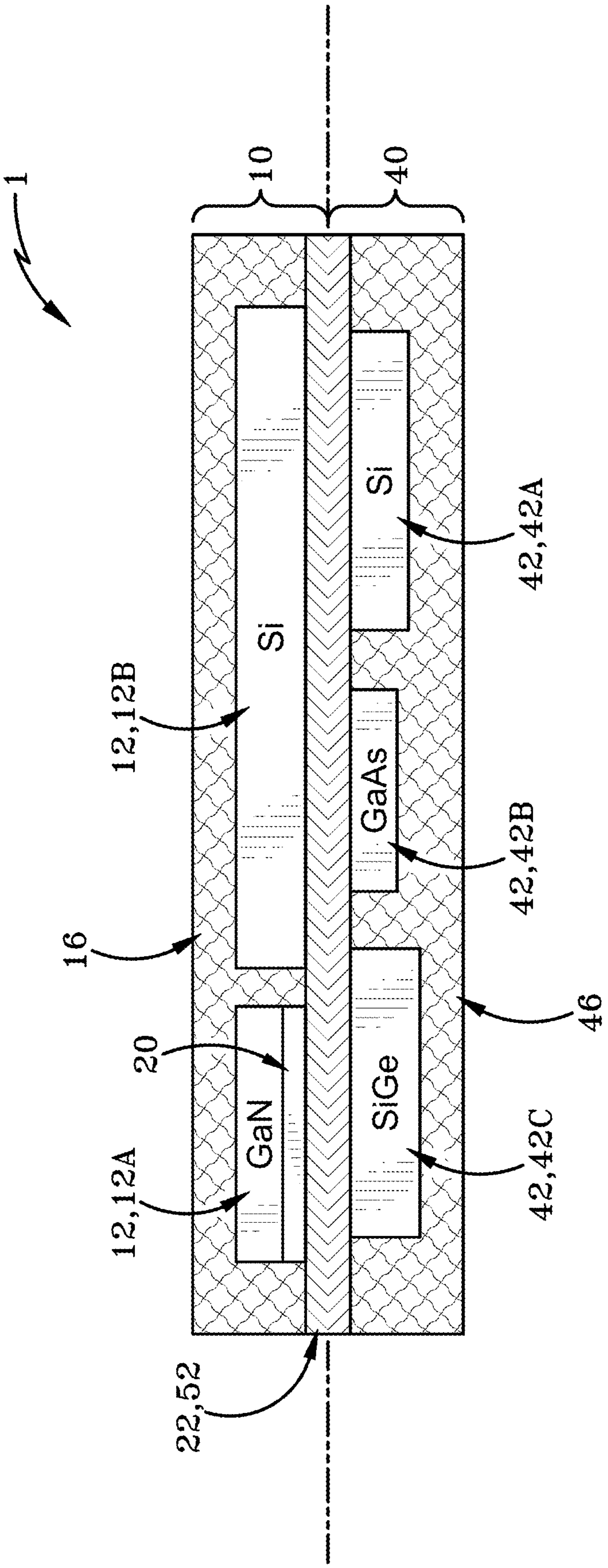
FIG. 1 is a section view of a semiconductor package according to one aspect of the present disclosure.

FIGS. 1-7 illustrate a semiconductor package 1 that adaptively interconnects at least one mixed signal die or semiconductor die with an additive wafer level packaging technology for incorporating radio frequency (RF) devices, passive electrical devices, and optical couplings provided in a compliant interconnect. With respect to compliant interconnects, the semiconductor package 1 described and illustrated may incorporate at least one interconnect that has coefficient of thermal expansion (or CTE) compliant geometries and thermal management solutions and/or structures free from using solder alloys or epoxy mold compounds between the at least one mixed signal die and the compliant interconnect. Such components and elements of the semiconductor package 1 are described in more detail below.

It should be appreciated that the term "compliant" or other derivatives similar to "compliant" describing complaint interconnects simply means that the each interconnect may meet a desired coefficient of thermal expansion for desired structural geometries of each interconnect and/or desired thermal management solutions or gradient heat dissipation geometries of each interconnect. Stated differently, the term "compliant" or other derivatives similar to "compliant" describing complaint interconnects simply means that any usable or suitable material may be used for package thermal management that will not compromise or hinder the performance of the interconnect during operation.

Referring to FIGS. 1-3E, the semiconductor package 1 includes at least one portion or first section 10 that includes at least one mixed signal die or semiconductor die (hereinafter "die") generally referred to as numeral 12. The at least one die 12 may include any suitable elements and/or components for generating various mixed signals dictated by the implementation of the semiconductor package 1. In at least one instance, semiconductor package 1 includes a first die 12A and a second die 12B in this specific implementation of semiconductor package 1 where the first die 12A and the second die 12B may be configured to generate mixed signals. In other exemplary instances, semiconductor package 1 may include any suitable number of semiconductor dies configured to generate mixed signals dictated by the implementation of the semiconductor package 1.

As illustrated in FIGS. 1-3E, the first die 12A includes a first surface or inactive surface 12A1 that is free from input and output locations. First die 12A also includes a second surface or active surface 12A2 that is opposite to the inactive surface 12A1 and includes the input and output locations of the first die 12A. First die 12A may also include a first side 12A3 defined between the inactive surface 12A1 and the active surface 12A2 and is free from input and output locations. First die 12A may also include a second side 12A4 defined between the inactive surface 12A1 and the active surface 12A2 that is opposite to the first side 12A3 and is free from input and output locations.

Similarly, as illustrated in FIGS. 1-3E, the second die 12B includes a first surface or inactive surface 12B1 that is free from input and output locations. Second die 12B also includes a second surface or active surface 12B2 that is opposite to the inactive surface 12B1 and includes the input and output locations of the second die 12B. Second die 12B may also include a first side 12133 defined between the inactive surface 12B1 and the active surface 12132 and is free from input and output locations. Second die 12B may also include a second side 12B4 defined between the inactive surface 12B1 and the active surface 12132 that is opposite to the first side 12133 and is free from input and output locations.

The first die 12A and the second die 12B may be formed of any suitable semiconductor materials conventionally and commercially available in the field of semiconductor packages. In one aspect, first die 12A may be formed of a first material (e.g., gallium nitride), and the second die 12B may be formed of a second material (e.g., silicon) that is different than the first material of the first die 12A. In another aspect, first die 12A may be formed of a first material, and the second die 12B may be formed of a second material that is the same as the first material of the first die 12A. It should be appreciated that a first die and a second die of a semiconductor package may be formed of any suitable semiconductor materials discussed herein and conventionally and commercially available in the field of semiconductor packages.

Referring to FIGS. 2A-3E, the first section 10 also includes at least one temporary carrier or temporary workpiece holder, generally referred to as numeral 14, that operably engages with that least one die 12. The at least one temporary carrier 14 may include any suitable elements and/or components or structural configuration for operably engaging with at least one die 12 as dictated by the implementation of the semiconductor package 1. In at least one instance, semiconductor package 1 includes a first temporary carrier 14A that operably engages with the first die 12A and the second die 12B and a second temporary carrier 14B that operably engages with a compliant support structure of the first section 10, which is described in more detail below. In other exemplary instances, semiconductor package 1 may include any suitable number of temporary carriers configured operably engage with at least one die described and illustrated herein.

Figure 2A:
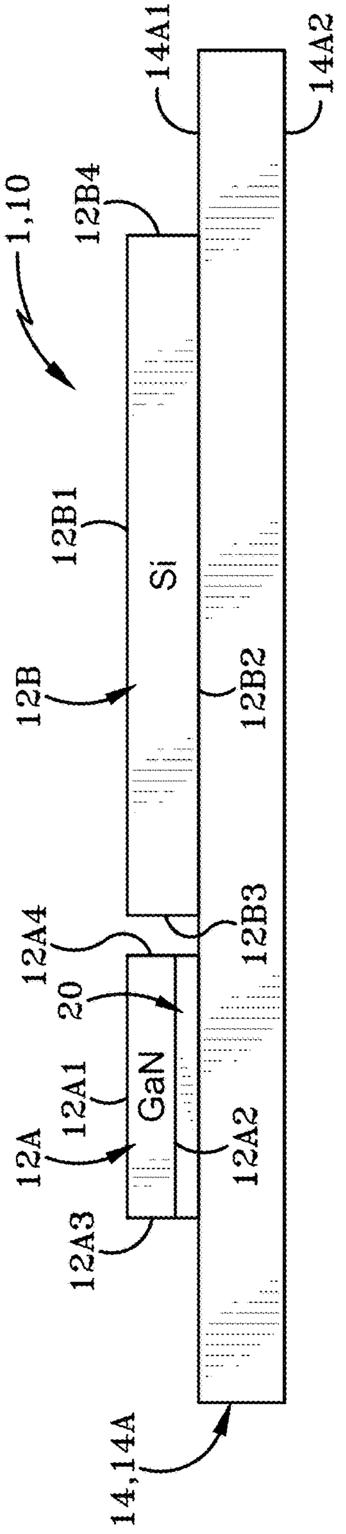
FIG. 2A is a side elevation view of a first section of the semiconductor package, wherein one or more dies are operably engaged with a first temporary carrier of the first section.

Referring to FIG. 2A, the first temporary carrier 14A includes a first surface or engaging surface 14A1 that is configured to operably engage with the at least one die 12. In the illustrated embodiment, the engaging surface 14A1 of the first temporary carrier 14A is configured to operably engage with the first die 12A and the second die 12B. In other exemplary embodiments, the engaging surface 14A1 of the first temporary carrier 14A is configured to operably engage with any suitable number of dies as dictated by the implementation of the semiconductor package 1. As described in more detail below, the first temporary carrier 14A is configured to be removed and/or separated from the first die 12A and the second die 12B upon manufacturing the semiconductor package 1; as such, the first temporary carrier 14A is a removable and/or separable component from the first die 12A and the second die 12B. First temporary carrier 14A also includes a second surface or non-engaging surface 14A2 that is opposite to the engaging surface 14A1 and remote from the first die 12A and the second die 12B. During manufacturing processes, the second surface 14A2 may rest on a work surface or support surface as the first section 10 is being manufactured.

It should be appreciated that the first die 12A and the second die 12B may be operably engaged at any suitable location on the engaging surface 14A1 of first temporary carrier 14A as dictated by the shape, size, and configuration of the first temporary carrier 14A.

Figure 2B:
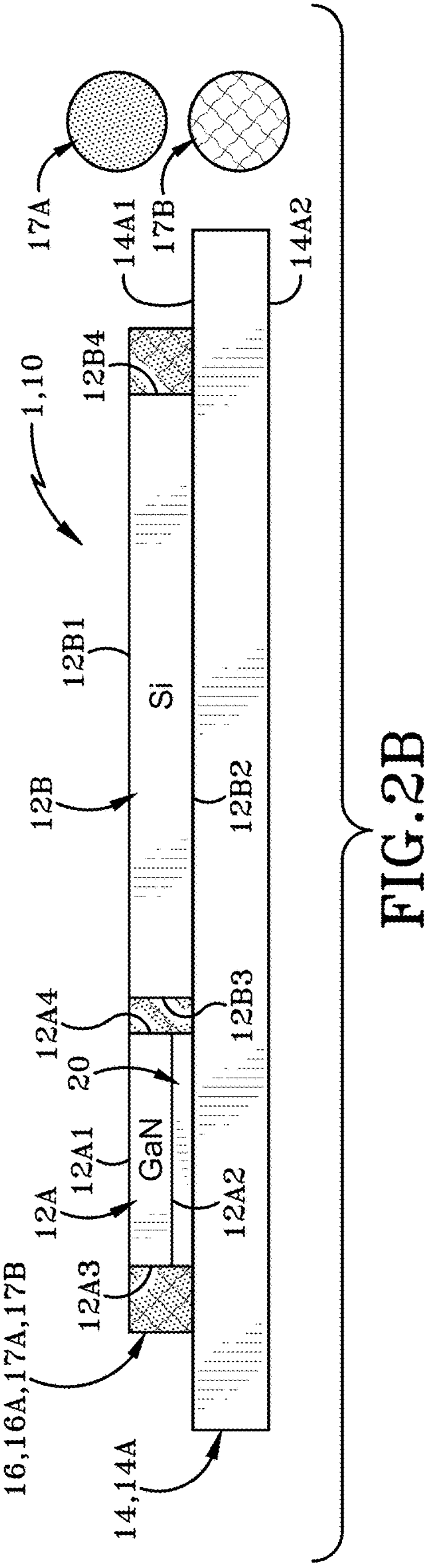
FIG. 2B is a side elevation view similar to FIG. 2A, but a compliant support structure operably engages with the one or more dies and the first temporary carrier.
Figure 2C:
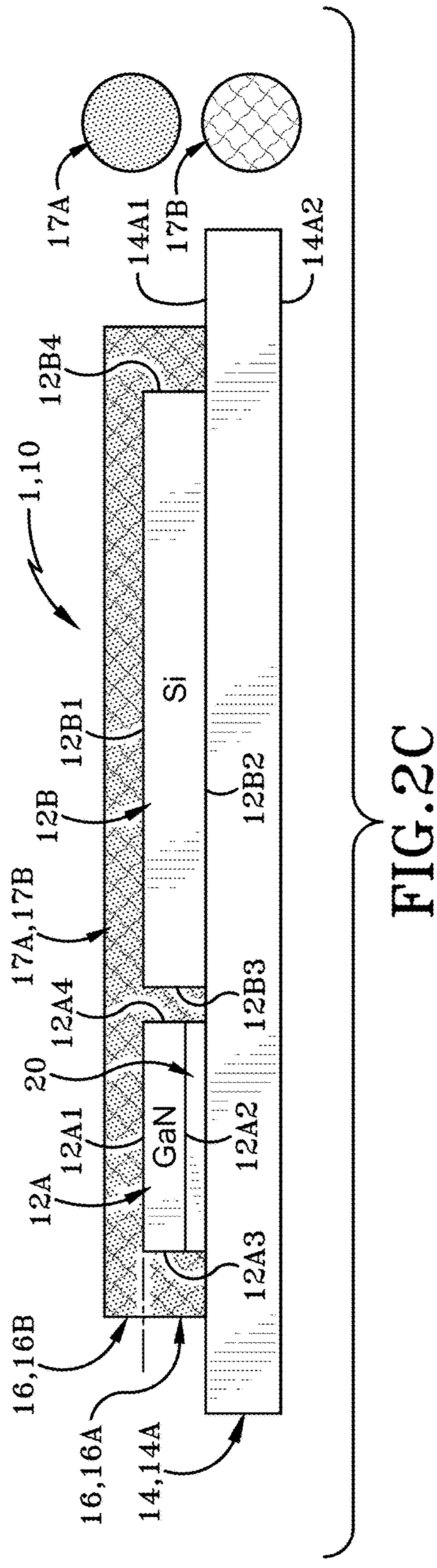
FIG. 2C is a side elevation view similar to FIG. 2B, but a thermal conductive structure operably engages with the compliant support structure.
Figure 2D:
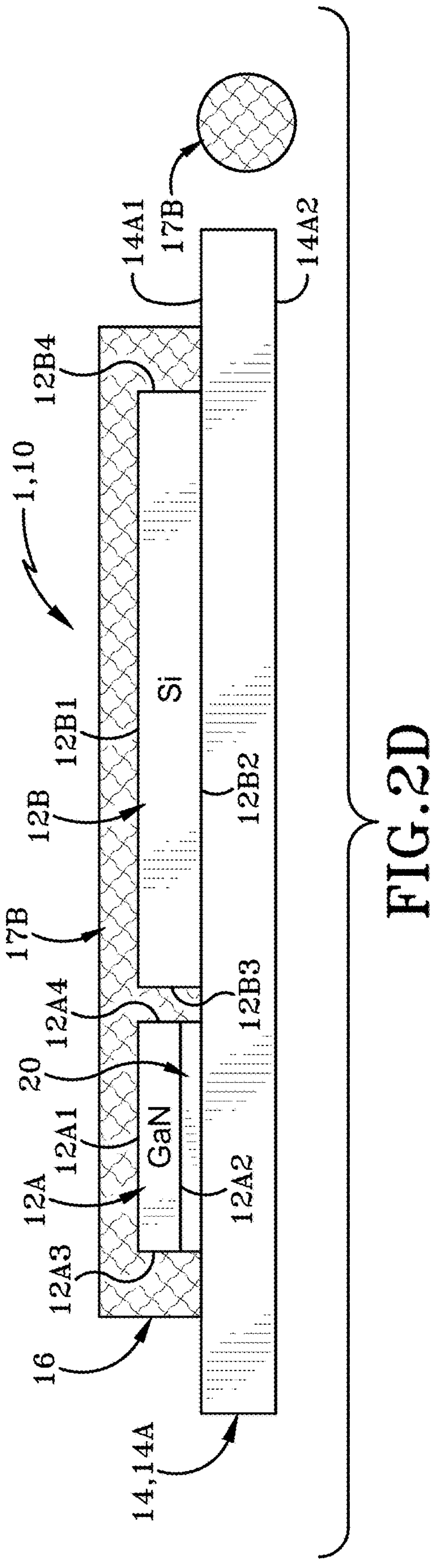
FIG. 2D is a side elevation view similar to FIG. 2C, but a temporary support of compliant support structure is removed.
Figures 2E, 2F:
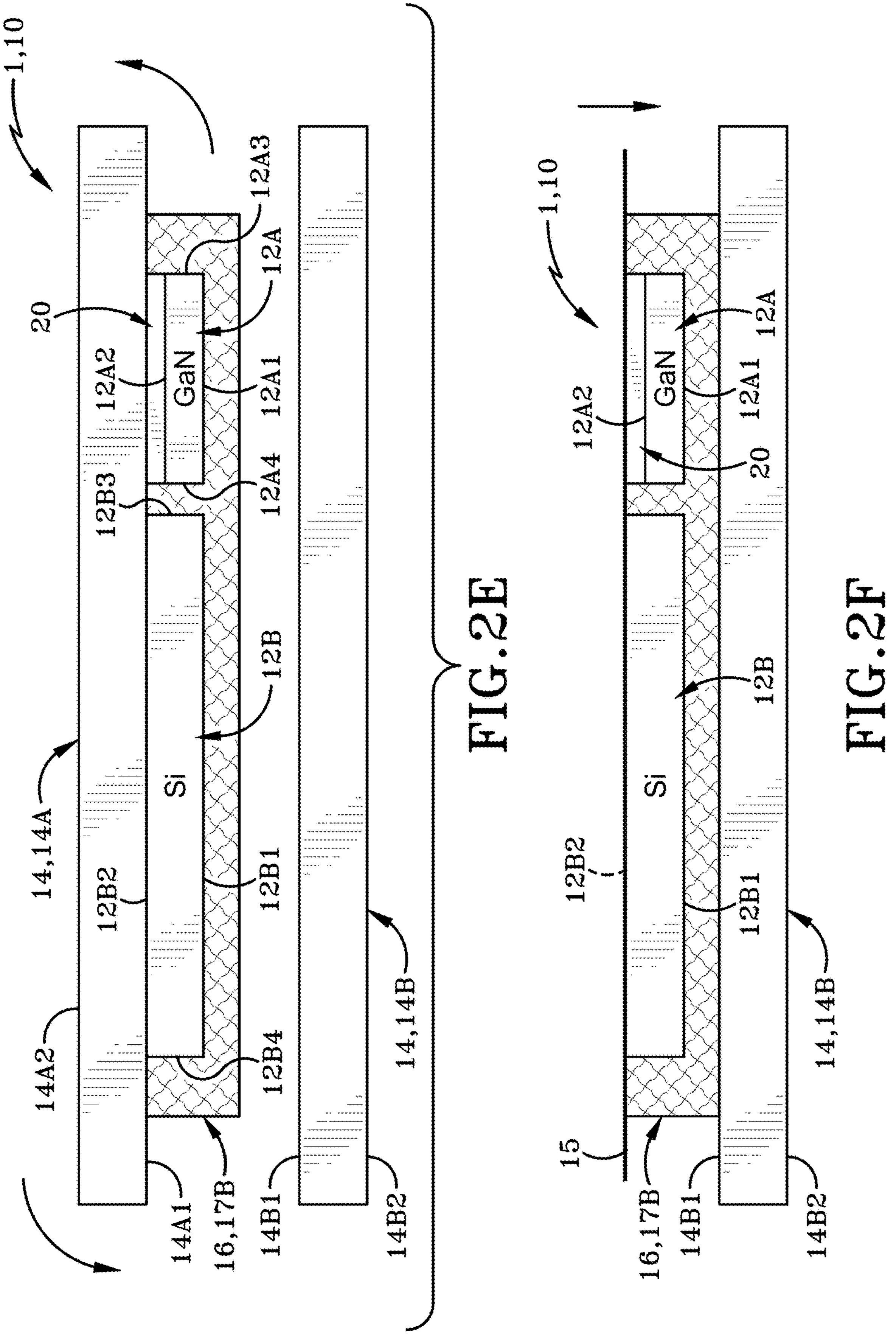
FIG. 2E is a side elevation view similar to FIG. 2D, but the first section is inverted and a second temporary carrier is introduced to the first section.
FIG. 2F is a side elevation view similar to FIG. 2E, but the first temporary support is removed from the first section and second temporary carrier operably engages with the compliant support structure.

Referring to FIG. 2E, the second temporary carrier 14B also includes a first surface or engaging surface 14B1 that is configured to operably engage with at least one compliant support structure of first section 10 of semiconductor package 1, which is described in more detail below. In other exemplary embodiments, the engaging surface 14B1 of the second temporary carrier 14B is configured to operably engage with any suitable number of compliant support structures as dictated by the implementation of the semiconductor package 1. As described in more detail below, the second temporary carrier 14B is configured to be removed and/or separated from a compliant support structure upon manufacturing the semiconductor package 1; as such, the second temporary carrier 14B is a removable and/or separable component from the compliant support structure at the engaging surface 1461. Second temporary carrier 14B also includes a second surface or non-engaging surface 14132 that is opposite to the engaging surface 14B1 and remote from a compliant support structure of first section 10 of semiconductor package 1. During manufacturing processes, the second surface 14132 may rest on a work surface or support surface as the first section 10 is being manufactured.

Referring to FIG. 2F, an interconnect dielectric 15 may be provided between the first die 12A and the second die 12B and the first temporary carrier 14A. Such use of the interconnect dielectric 15 may protect the active surfaces 12A2, 12132 of the first die 12A and the second die 12B until the semiconductor package 1 is constructed. As such, interconnect dielectric 15 may be temporary and removable from the first die 12A and the second die 12B once the semiconductor package 1 is constructed.

As best seen in FIGS. 2B-2D, at least one compliant support structure 16A may be provided in the first section 10 of semiconductor package 1. In the illustrated embodiment, first section 10 includes a single compliant support structure 16A formed about the perimeter of the first section 10 while encapsulating and/or encasing the first die 12A and the second die 12B inside of the compliant support structure 16A. Compliant support structure 16A is also operably engaged with the first temporary carrier 14A, specifically with the engaging surface 14A1 of first temporary carrier 14A. The compliant support structure 16A is configured to provide translational support to the first die 12A and the second die 12B in the horizontal or lateral directions to prevent the first die 12A and the second die 12B from shifting or rotating along the engaging surface 14A1 of the first temporary carrier 14A.

It should be understood that compliant support structure 16A and/or thermally conductive structure 16B may include a temporary or removable support 17A and a permanent support 17B. As best seen in FIG. 2B, the temporary support 17A is initially applied to the first die 12A, second die 12B, and the first temporary carrier 14A via suitable fabrication methods such as adaptive direct write lithography and other fabrication methods of the like. In this embodiment, temporary support 17A may be a cured polymer network that is formed on and about the first die 12A, second die 12B, and the first temporary carrier 14A. Additionally, the temporary support 17A may also include a preferably thin-metal coating. Once the temporary support 17A is cured, the temporary support may be removed to leave the permanent support 17B engaged with the engaging surface 14A1 of the first temporary carrier 14A along with the first die 12A and the second die 12B. The permanent support 17B may also be a desired CTE-compliant structure as dictated by the implementation of semiconductor package 1.

The compliant support structure 16A may also define any suitable structural configuration in order to provide translational support to the first die 12A and the second die 12B in the horizontal or lateral directions so that the first die 12A and the second die 12B are restricted from shifting or rotating along the engaging surface 14A1 of the first temporary carrier 14A. Such structural configuration of the compliant support structure 16A may be based on various considerations, including the size, shape, and materials of the first die 12A and the second die 12B. In one instance, a compliant support structure described and illustrated herein may be an open-cell foam stochastic three-dimensional structure that forms about at least one die of a semiconductor package and that engages with at least one temporary carrier of the semiconductor package. In another instance, a compliant support structure described and illustrated herein may be a non-stochastic lattice structure that forms about at least one die of a semiconductor package and that engages with at least one temporary carrier of the semiconductor package.

While the compliant support structure 16A and the thermally conductive structure 16B may include the temporary support 17A and the permanent support 17B, the compliant support structure 16A and the thermally conductive structure 16B may include any suitable number of supports. In one example, a compliant support structure 16A described and illustrated herein may form a single CTE-compliant structure with the first die 12A, the second die 12B, and the first temporary structure 14 without depositing a temporary support structure, such as temporary support 17A.

Figure 7:
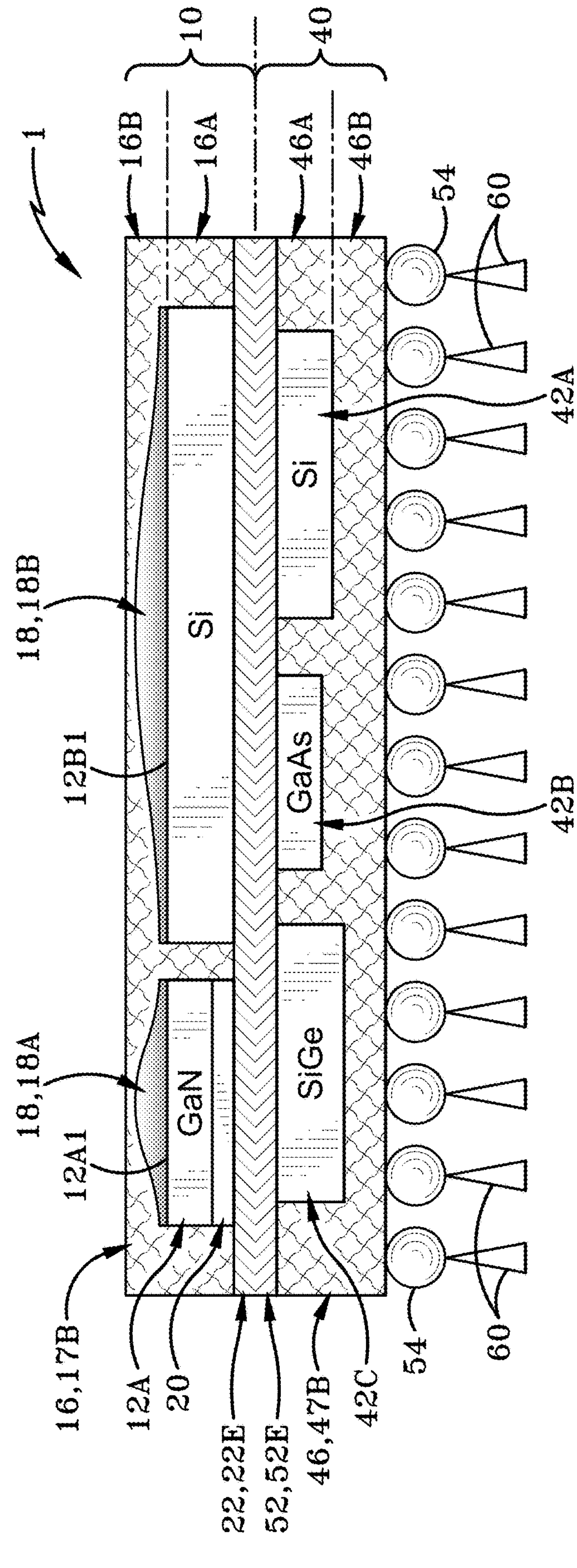
FIG. 7 is a side elevation view of testing the semiconductor package.

As best seen in FIG. 7, first section 10 of semiconductor package 1 may also include at least one thermally conductive structure 16B formed with the compliant support structure 16A and formed about the first die 12A and the second die 12B. In the illustrated embodiment, a first thermally conductive portion of thermally conductive structure 16B may be engaged with the compliant support structure 16A and formed about the first die 12A, and a second thermally conductive portion of thermally conductive structure 16B is engaged with the compliant support structure 16A and formed about the second die 12B. The thermally conductive structure 16B is configured to conduct heat away from the first die 12A and the second die 12B upon operation of the first die 12A and the second die 12B. Stated differently, thermally conductive structure 16B is configured to provide thermal dissipation from the first die 12A and the second die 12B in order to enable for higher-level assemblies, which is described in more detail below.

Each of the first and second thermally conductive portion of the thermally conductive structure 16B may also have any suitable structural configuration for conducting heat away from the first die 12A and the second die 12B as dictated by the implementation of semiconductor package 1. In one instance, first and second thermally conductive portion of the thermally conductive structure 16B may be solid and compact thermally conductive structures for conducting heat away from the first die 12A and the second die 12B. In another instance, first and second thermally conductive portion of the thermally conductive structure 16B may be hollow thermally conductive structures and/or cavities for conducting heat away from the first die 12A and the second die 12B.

Referring to FIG. 2A, first section 10 of semiconductor package 1 may include at least one air cavity structure 20 formed between at least one die 12 and at least one temporary carrier 14. In the illustrated embodiment, a single air cavity structure 20 is formed between the first die 12A and the first temporary carrier 14A. More particularly, air cavity structure 20 operably engages with the active surface 12A2 of first die 12A and the first surface 14A1 of first temporary carrier 14A. The use of the air cavity structure 20 with at least one die 12 and at least one temporary carrier 14 may provide various advantages, including singulation, cleaning, deposit getters to the air cavity, temporary storage, and other various advantages of the like provided by the air cavity structure 20.

The air cavity structure 20 described and illustrated may be formed of any suitable materials that are standard and/or commercially available in the semiconductor package market. In one instance, an air cavity structure described and illustrated may be formed of a glass material. In another instance, an air cavity structure described and illustrated may be formed of a plastic material. In yet another instance, an air cavity structure described and illustrated may be formed of a metal material. In yet another instance, an air cavity structure described and illustrated may be formed of a ceramic material.

While air cavity structure 20 is formed between the first die 12A and the first temporary carrier 14A, the air cavity structure 20 or any number of air cavity structures may be formed between any die and/or temporary carrier provided in a first portion of a semiconductor package. In one example, an air cavity structure may be formed between the second die 12B and the first temporary carrier 14A in which air cavity structure operably engages with the active surface 12132 of second die 12B and the first surface 14A1 of first temporary carrier 14A.

First section 10 of the semiconductor package 1 includes at least one compliant electrical structure or interconnect generally referred to as numeral 22. The at least one electrical structure 22 may include any suitable electrical elements and/or components dictated by the implementation of the semiconductor package 1. In at least one instance, semiconductor package 1 includes a single electrical structure 22 in this specific implementation of semiconductor package 1 where the electrical structure 22 may be configured to electrically connect the first die 12A and the second die 12B with specific electrical elements and/or components provided in the electrical structure 22. Such elements and components of the electrical structure 22 are described in more detail below.

Figure 3A:
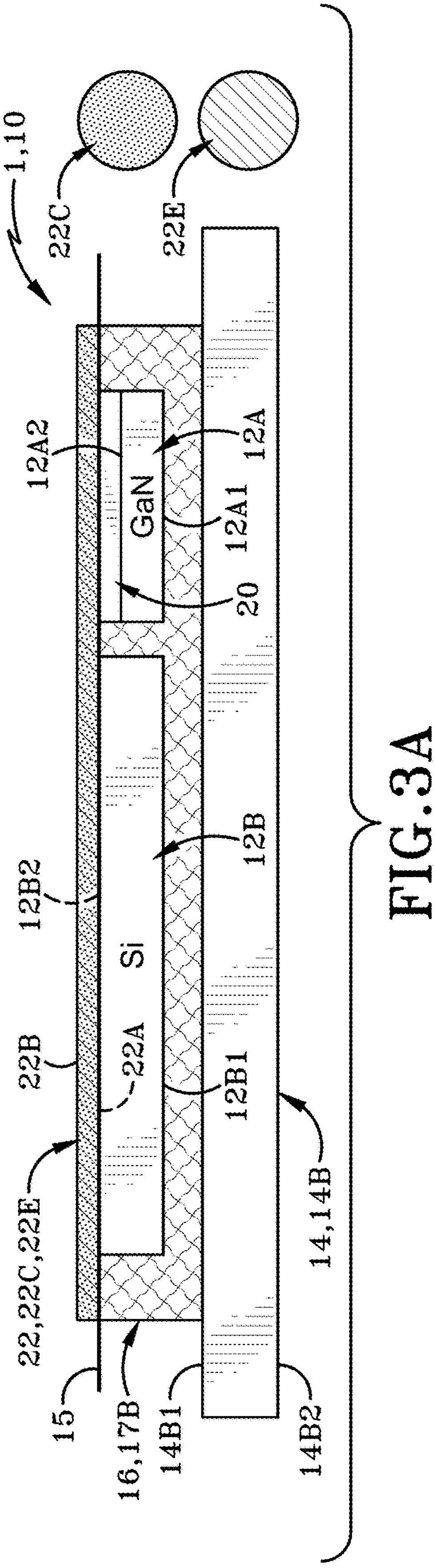
FIG. 3A is a side elevation view of operably engaging an electrical structure with the first section.

As best seen in FIG. 3A, the electrical structure 22 includes a first surface or first electrical engaging surface 22A that electrically connects with the first die 12A and the second die 12B. More particularly, the first surface 22A of electrical structure 22 electrically connects with the inactive surface 12A1 of the first die 12A and the inactive surface 12B1 of the second die 12B. Electrical structure 22 also includes a second surface or second electrical engaging surface 22B that is opposite to the first surface 22A. Second surface 22B of electrical structure 22 may electrically engage with any suitable components or elements provided in semiconductor package 1. In one instance, second surface 22B of electrical structure 22 may electrically connect with a plurality of solder balls 24 for testing purposes of first section 10 or for constructing higher-level assemblies. In another instance, second surface 22B of electrical structure 22 may electrically connect with another electrical structure of a second section of semiconductor package 1, which is described in more detail below.

It should be understood that electrical structure 22 of first section 10 may include various input and output connections and/or contours defined along the first surface 22A and/or the second surface 22B as dictated by the implantation of the semiconductor package 1. As such, desired electrical components (e.g., radio frequency devices, passive electrical devices, digital electrical devices, ground electrical elements, power electrical devices, etc.) may be engaged at specific input and output connections and/or contours defined along the first surface 22A and/or the second surface 22B. While not illustrated herein, additional supports or shielding features may be provided on the first surface 22A and/or the second surface 22B for structural support. Electrical structure 22 may also include a deposited conductive metal (e.g., copper or suitable conductive metals of the like) prior to or subsequent to the inclusion of the desired electrical components.

Such creation of input and output connections and/or contours defined along the first surface 22A and/or the second surface 22B may be performed by any suitable methods and techniques used in the semiconductor package field. In one instance, adaptive direct write lithography may be used to create various input and output connections and/or contours defined along the first surface 22A and/or the second surface 22B as dictated by the implantation of the semiconductor package 1.

Figure 3B:
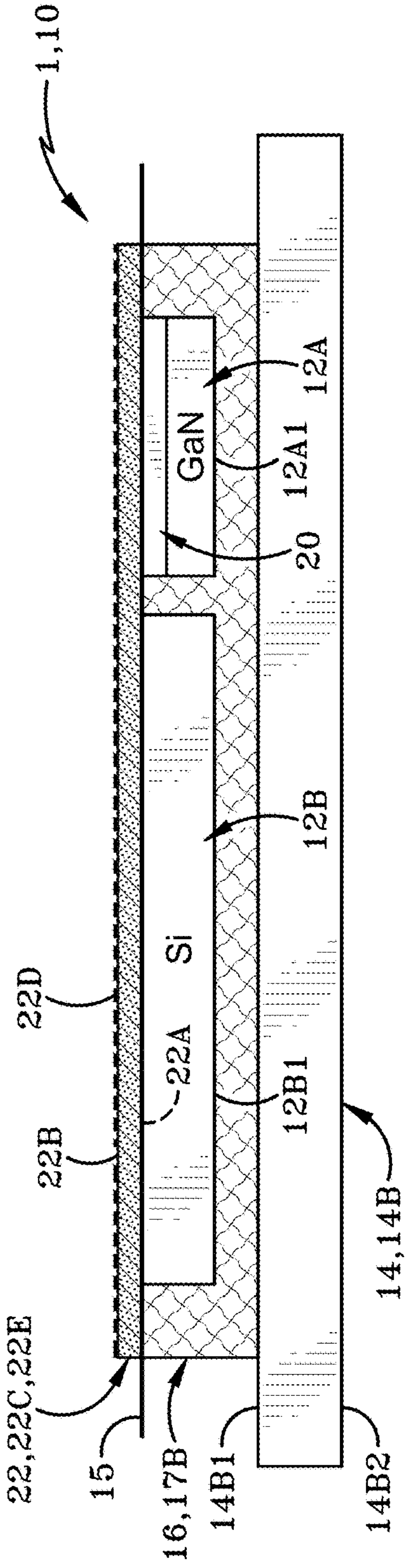
FIG. 3B is a side elevation view similar to FIG. 3A, but an exterior dielectric is operably engaged with the electrical structure.
Figure 3C:
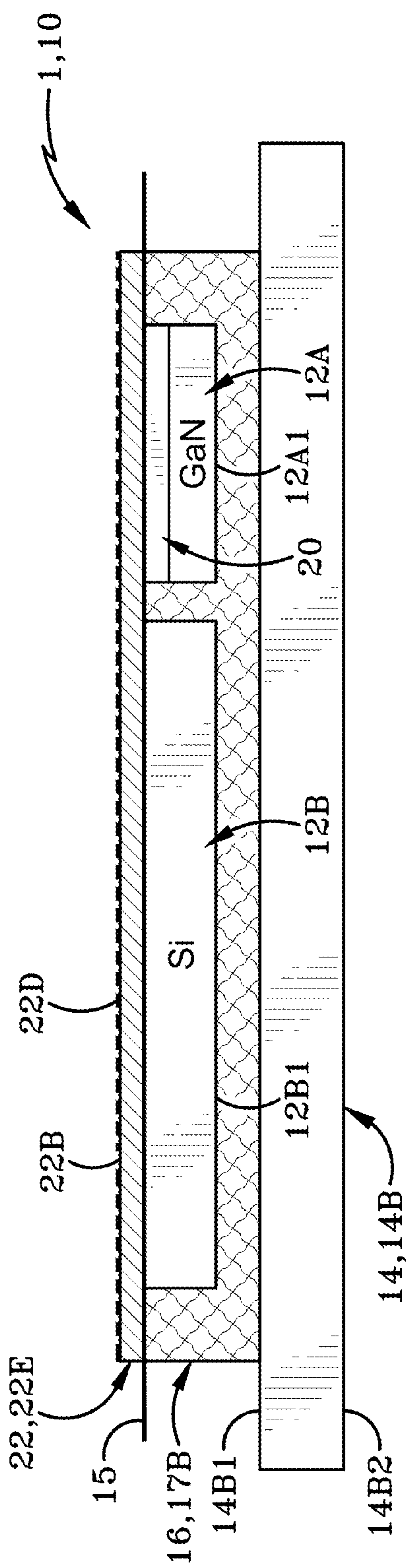
FIG. 3C is a side elevation view similar to FIG. 3B, but a first temporary dielectric is removed from the electrical structure.
Figure 3D:
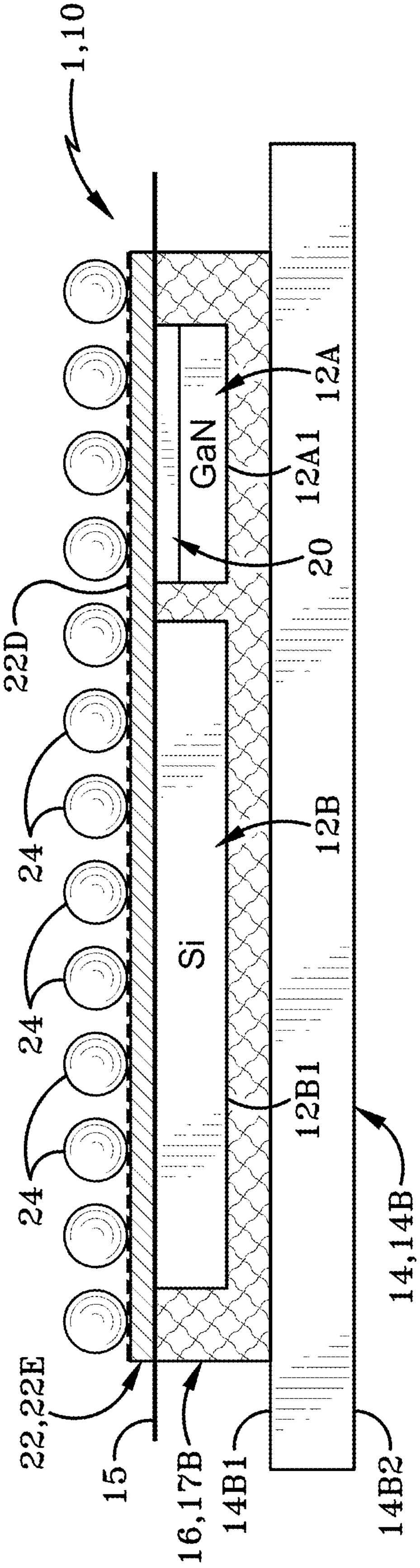
FIG. 3D is a side elevation view similar to FIG. 3C, but a plurality of solder balls operably engages with the electrical structure of the first section.
Figure 3E:
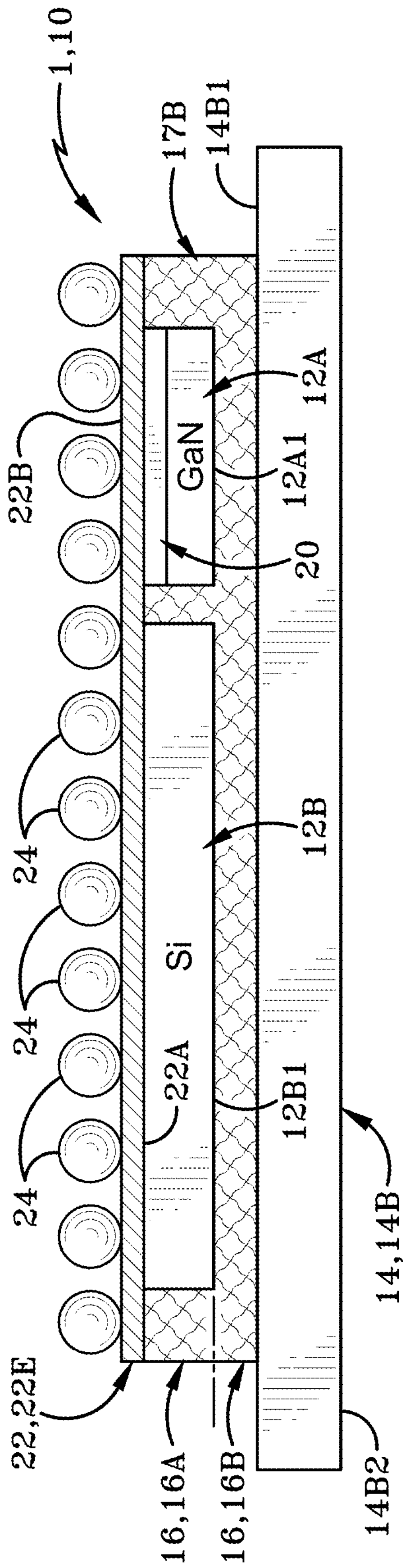
FIG. 3E is a side elevation view similar to FIG. 3D, but a second temporary dielectric is removed from the electrical structure.

Electrical structure 22 of first section 10 may also include at least one temporary dielectric applied to one or both of the first surface 22A and the second surface 22B. As best seen in FIGS. 3A and 3B, a first temporary dielectric or interior temporary dielectric 22C is applied between the first surface 22A and second surface 22B of the electrical structure 22, and a second temporary dielectric or exterior temporary dielectric 22D is applied to the second surface 22B of the electrical structure 22. Such inclusion of first temporary dielectric 22C and second temporary dielectric 22D may be performed by any suitable methods and techniques used in the semiconductor package field. In one instance, adaptive direct write lithography may be used to include first temporary dielectric 22C and second temporary dielectric 22D to first surface 22A and second surface 22B of electrical structure 22.

Still referring to FIGS. 3A and 3B, electrical structure 22 of first section 10 may also include and/or incorporate at least one permanent dielectric to add electromechanical support to signal transmission lines, ground transmission lines, power transmission lines, shielding structures, or other electrical devices. In this illustrated embodiment, a permanent dielectric 22E is incorporated into the electrical structure 22 to add electromechanical support to signal transmission lines, ground transmission lines, power transmission lines, shielding structures, or other electrical devices. Such inclusion of permanent dielectric 22E may be performed by any suitable methods and techniques used in the semiconductor package field. In one instance, adaptive direct write lithography may be used to include permanent dielectric 22E to the electrical structure 22 at appropriate and/or desired locations based on mechanical simulations performed on the electrical structure 22. In one instance, the supports provided in the permanent dielectric 22E may be cantilevered from surrounding metal features. In another instance, the supports provided in the permanent dielectric 22E may be positioned on the center from metal below or directly attached to at least one die 12 surface.

While the permanent dielectric 22E is separate from the first temporary dielectric 22C and the second temporary dielectric 22D, a permanent dielectric may be incorporated with one or both of a first temporary dielectric or second temporary dielectric for assembly purposes. In one instance, a pre-fabricated dielectric component may be installed into a cavity of a second temporary dielectric where the pre-fabricated dielectric component is encapsulated and remains as a permanent support.

As stated previously, electrical components may be introduced into the electrical structure 22 by any suitable methods and techniques. In one instance, electrical components may be permanently added into the electrical structure 22 upon manufacturing and/or building of the electrical structure 22. In this same instance, an electrical component may be incorporated as a layered or interdigital structure using a deposition process (as described above) or an additive manufacturing process (e.g., plasma spray methods). In another instance, prefabricated and/or existing electrical components may be added to the electrical structure 22 once the electrical structure 22 is built.

Referring to FIGS. 4A-5A, the semiconductor package 1 includes at least another portion or second section 40 that includes at least another mixed signal die or semiconductor die (hereinafter "die") generally referred to as numeral 42. The at least another die 42 may include any suitable elements and/or components for generating various mixed signals dictated by the implementation of the semiconductor package 1. In at least one instance, semiconductor package 1 includes a first die 42A, a second die 42B, and a third die 42C in this specific implementation of semiconductor package 1 where the first die 42A, the second die 42B, and the third die 42C may be configured to generate mixed signals. In other exemplary instances, semiconductor package 1 may include any suitable number of semiconductor dies configured to generate mixed signals dictated by the implementation of the semiconductor package 1.

As illustrated in FIGS. 4A-5A, the first die 42A includes a first surface or inactive surface 42A1 that is free from input and output locations. First die 42A also includes a second surface or active surface 42A2 that is opposite to the inactive surface 42A1 and includes the input and output locations of the first die 42A. First die 42A may also include a first side 42A3 defined between the inactive surface 42A1 and the active surface 42A2 and is free from input and output locations. First die 42A may also include a second side 42A4 defined between the inactive surface 42A1 and the active surface 42A2 that is opposite to the first side 42A3 and is free from input and output locations.

Similarly, as illustrated in FIGS. 4A-5A, the second die 42B includes a first surface or inactive surface 42B1 that is free from input and output locations. Second die 42B also includes a second surface or active surface 42B2 that is opposite to the inactive surface 42B1 and includes the input and output locations of the second die 42B. Second die 42B may also include a first side 42B3 defined between the inactive surface 42B1 and the active surface 42B2 and is free from input and output locations. Second die 42B may also include a second side 42B4 defined between the inactive surface 42B1 and the active surface 42B2 that is opposite to the first side 42B3 and is free from input and output locations.

Similarly, as illustrated in FIGS. 4A-5A, the third die 42C includes a first surface or inactive surface 42C1 that is free from input and output locations. Third die 42C also includes a second surface or active surface 42C2 that is opposite to the inactive surface 42C1 and includes the input and output locations of the third die 42C. Third die 42C may also include a first side 42C3 defined between the inactive surface 42C1 and the active surface 42C2 and is free from input and output locations. Third die 42C may also include a second side 42C4 defined between the inactive surface 42C1 and the active surface 42C2 that is opposite to the first side 42C3 and is free from input and output locations.

The first die 42A, the second die 42B, and the third die 42C may be formed of any suitable semiconductor materials conventionally and commercially available in the field of semiconductor packages. In one aspect, first die 42A may be formed of a first material (e.g., silicon), the second die 42B may be formed of a second material (e.g., gallium arsenide), and the third die 42C may be formed of a third material (e.g., silicon-germanium) where each of the first material, the second material, and the third material are different from one another. In another aspect, first die 42A may be formed of a first material, the second die 42B may be formed of a second material, and the third die 42C may be formed of a third material where the first material, the second material, and the third material are the same materials. It should be appreciated that a first die, a second die, and a third die of a semiconductor package may be formed of any suitable semiconductor materials discussed herein and conventionally and commercially available in the field of semiconductor packages.

Referring to FIGS. 4A-4F, the second section 40 also includes at least one temporary carrier or temporary workpiece holder, generally referred to as numeral 44, that operably engages with that least one die 42. The at least one temporary carrier 44 may include any suitable elements and/or components for operably engaging with at least one die 42 as dictated by the implementation of the semiconductor package 1. In at least one instance, semiconductor package 1 includes a first temporary carrier 44A that operably engages with the first die 42A, the second die 42B, and a third die 42C. In the same instance, semiconductor package 1 also includes a second temporary carrier 44B that operably engages with a compliant support structure of the second section 40, which is described in more detail below. In other exemplary instances, semiconductor package 1 may include any suitable number of temporary carriers configured operably engage with at least one die described and illustrated herein.

Figure 4A:
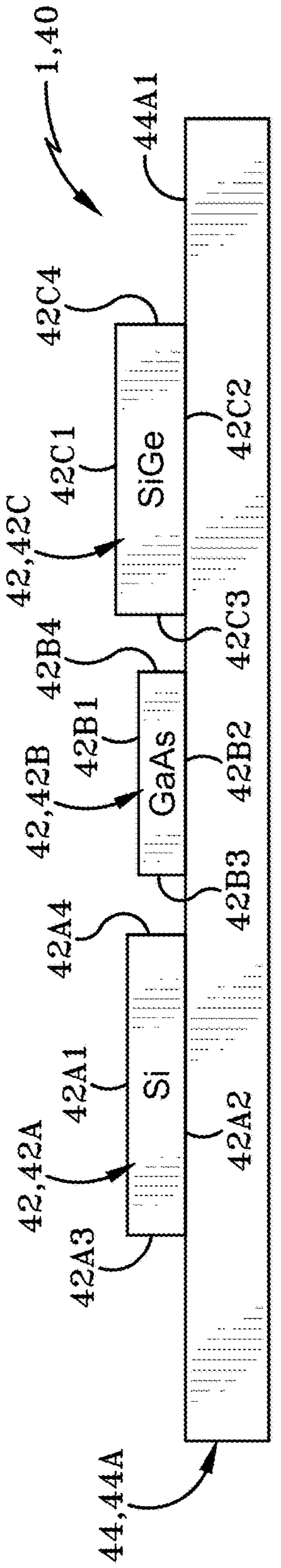
FIG. 4A is a side elevation view of manufacturing a second section of the semiconductor package, wherein one or more dies are operably engaged with a first temporary carrier of the second section.

Referring to FIG. 4A, the first temporary carrier 44A includes a first surface or engaging surface 44A1 that is configured to operably engage with the at least one die 42. In the illustrated embodiment, the engaging surface 44A1 of the first temporary carrier 44A is configured to operably engage with the first die 42A, the second die 42B, and the third die 42C. In other exemplary embodiments, the engaging surface 44A1 of the first temporary carrier 44A is configured to operably engage with any suitable number of dies as dictated by the implementation of the semiconductor package 1. As described in more detail below, the first temporary carrier 44A is configured to be removed and/or separated from the first die 42A, the second die 42B, and the third die 42C upon manufacturing the semiconductor package 1; as such, the first temporary carrier 44A is a removable and/or separable component from the first die 42A, the second die 42B, and the third die 42C. First temporary carrier 44A also includes a second surface or non-engaging surface 44A2 that is opposite to the engaging surface 44A1 and remote from the first die 42A, the second die 42B, and the third die 42C.

It should be understood that the first die 42A, the second die 42B, and the third die 42C may be operably engaged at any suitable location on the engaging surface 44A1 of first temporary carrier 44A.

Figure 4B:
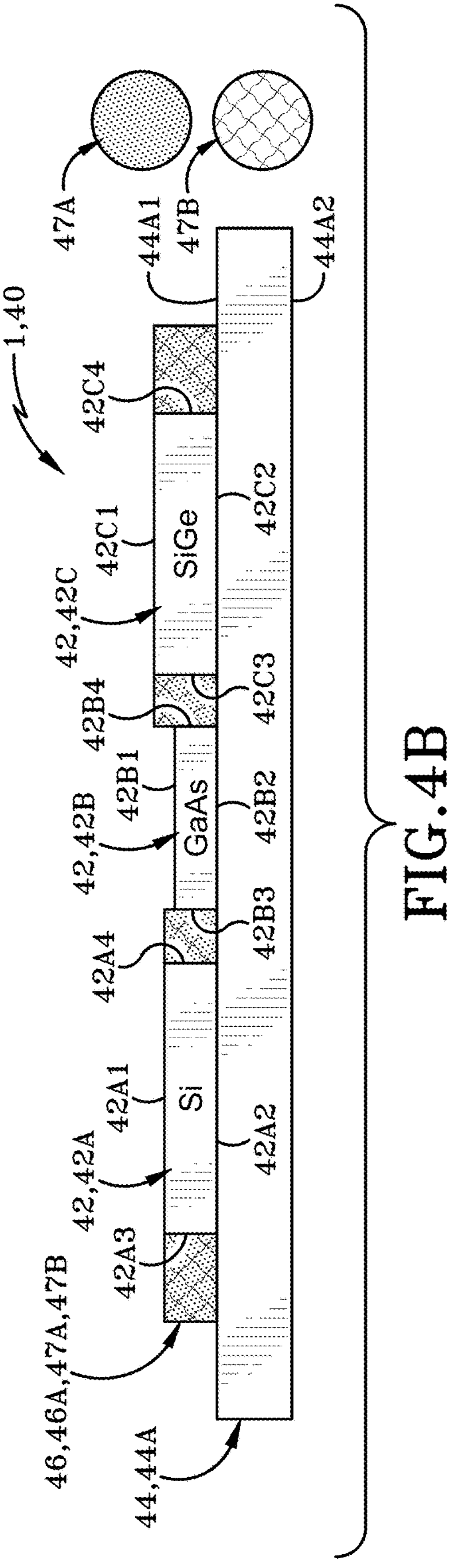
FIG. 4B is a side elevation view similar to FIG. 4A, but a compliant support structure operably engages with the one or more dies and the first temporary carrier.
Figure 4C:
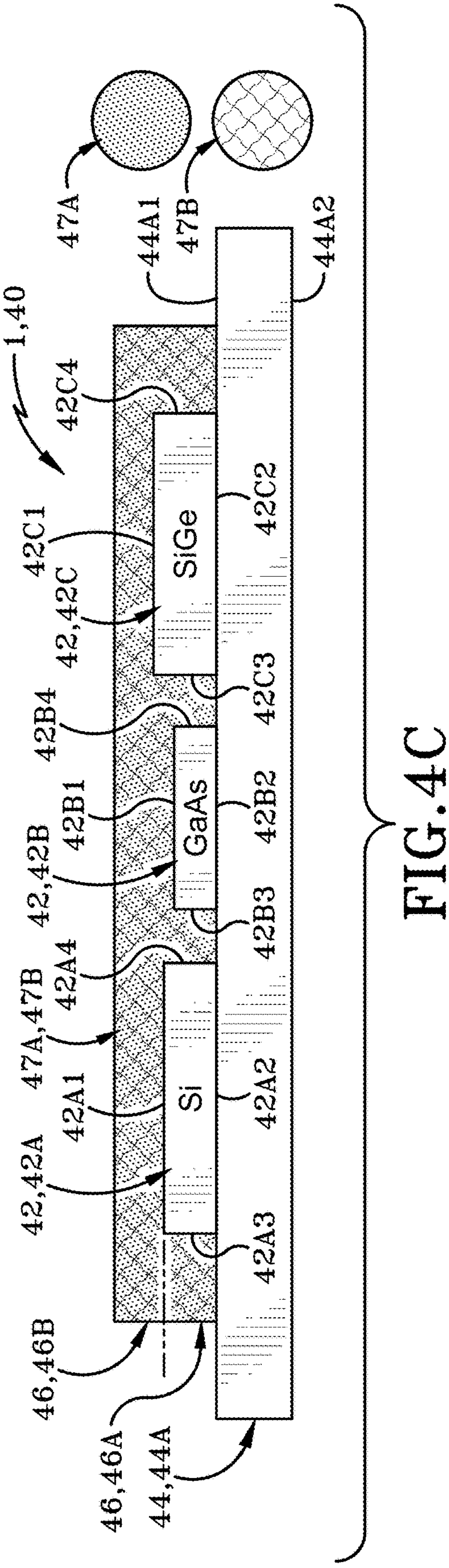
FIG. 4C is a side elevation view similar to FIG. 4B, but a thermal conductive structure operably engages with the compliant support structure.
Figure 4D:
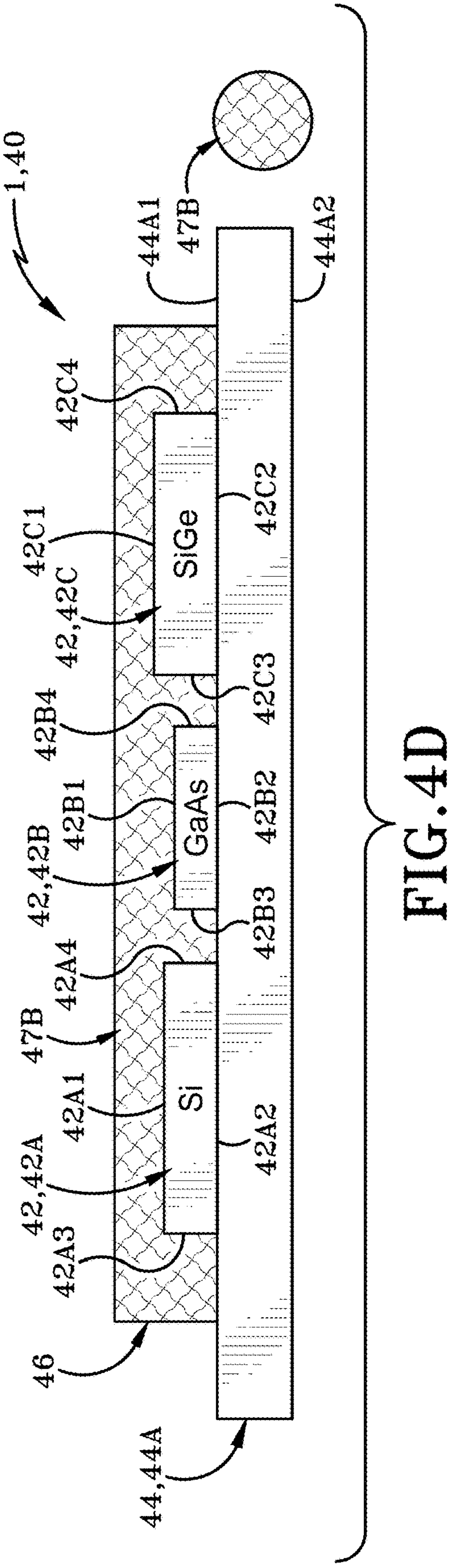
FIG. 4D is a side elevation view similar to FIG. 4C, but a temporary support of compliant support structure is removed.
Figure 4E:
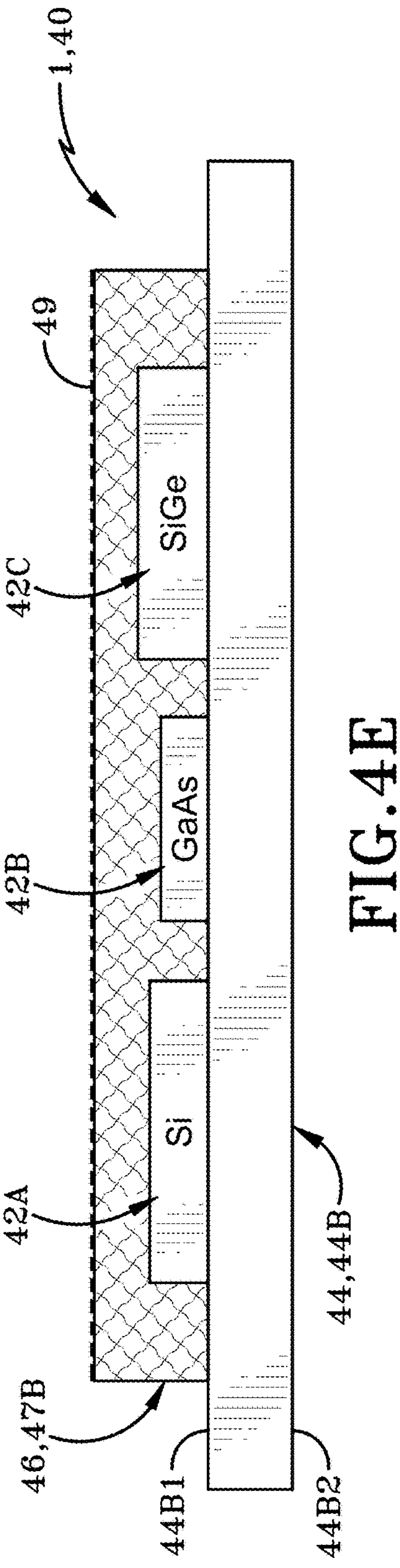
FIG. 4E is a side elevation view similar to FIG. 4D, but irises are added to the compliant support structure.
Figure 4F:
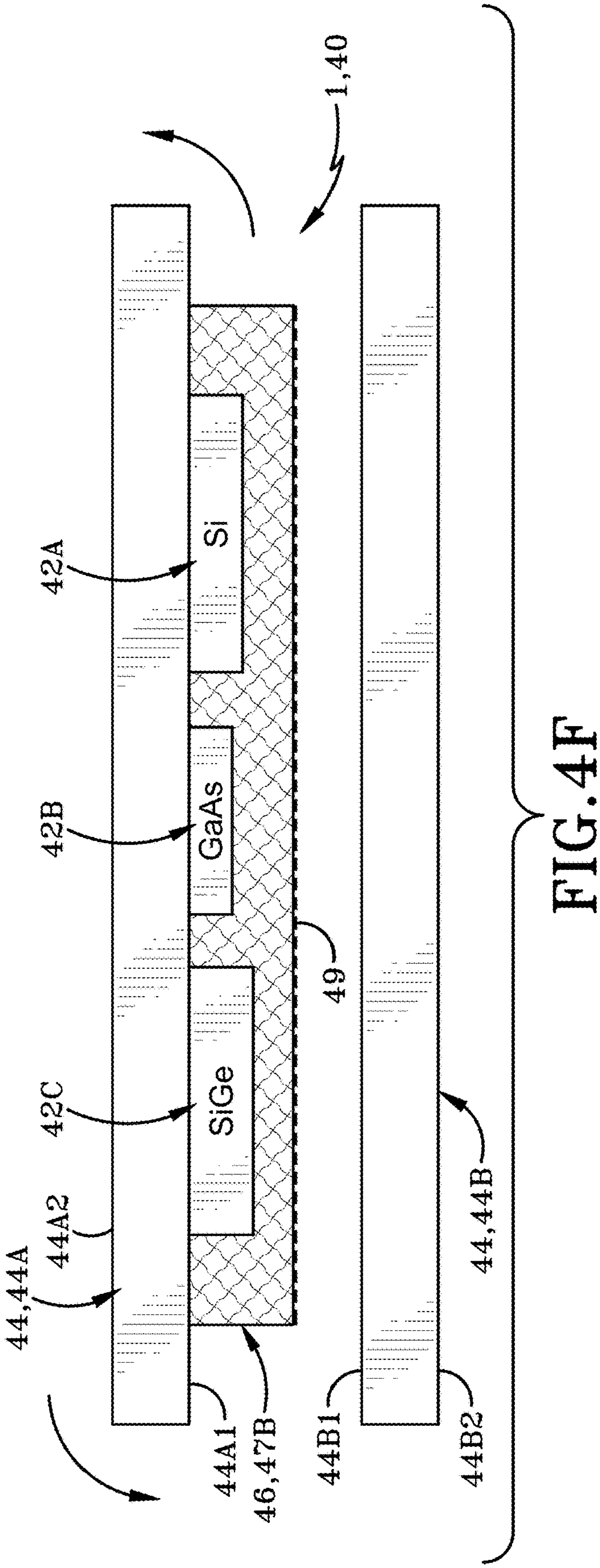
FIG. 4F is a side elevation view similar to FIG. 4E, but the second section is inverted and a second temporary carrier is introduced to the first section.

Referring to FIG. 4F, the second temporary carrier 44B also includes a first surface or engaging surface 4461 that is configured to operably engage with at least one compliant support structure of second section 40 of semiconductor package 1, which is described in more detail below. In other exemplary embodiments, the engaging surface 4461 of the second temporary carrier 44B is configured to operably engage with any suitable number of compliant support structures as dictated by the implementation of the semiconductor package 1. As described in more detail below, the second temporary carrier 44B is configured to be removed and/or separated from a compliant support structure upon manufacturing the semiconductor package 1; as such, the second temporary carrier 44B is a removable and/or separable component from the compliant support structure at the first engaging surface 44131. Second temporary carrier 44B also includes a second surface or non-engaging surface 44132 that is opposite to the engaging surface 4461 and remote from a compliant support structure of second section 40 of semiconductor package 1.

Figure 4G:
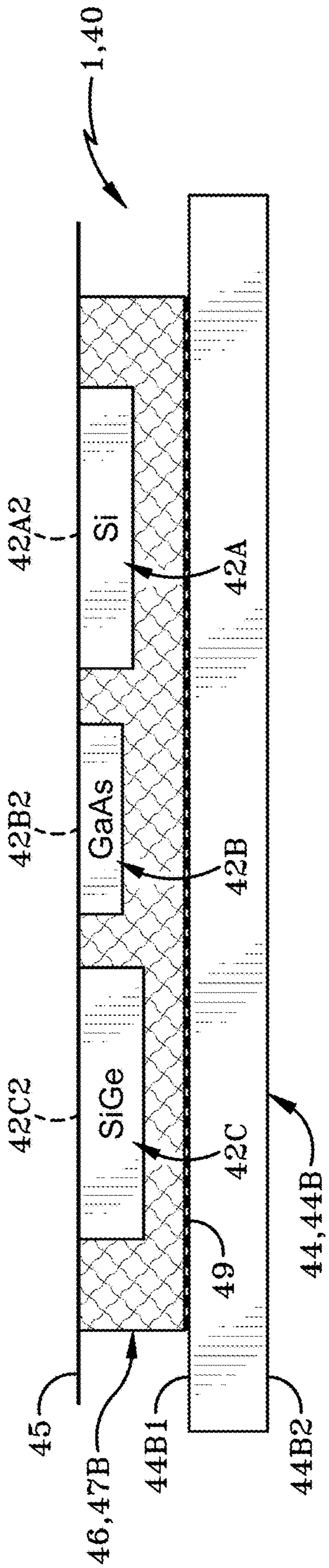
FIG. 4G is a side elevation view similar to FIG. 4F, but the first temporary support is removed from the second section and second temporary carrier operably engages with the complaint support structure.

Referring to FIG. 4G, an interconnect dielectric 45 may be provided between the first die 42A, the second die 42B, the third die 42C, and the first temporary carrier 44A. Such use of the interconnect dielectric 45 may protect the active surfaces 42A2, 4262, 42C2 of the first die 42A, the second die 42B, and the third die 42C until the semiconductor package 1 is constructed. As such, interconnect dielectric 45 may be temporary and removable from the first die 42A, the second die 42B, and the third die 42C once the semiconductor package 1 is constructed.

As best seen in FIGS. 46-4E, at least one compliant support structure 46A may be provided in the second section 40 of semiconductor package 1. In the illustrated embodiment, second section 40 includes a single compliant support structure 46A formed about the perimeter of the second section 40 while encapsulating and/or encasing the first die 42A, the second die 42B, and the third die 42C inside of the compliant support structure 46A. Compliant support structure 46A is also operably engaged with the first temporary carrier 44A, specifically with the engaging surface 44A1 of first temporary carrier 44A. The compliant support structure 46A is configured to provide translational support to the first die 42A, the second die 42B, and the third die 42C in the horizontal or lateral directions to prevent the first die 42A, the second die 42B, and the third die 42C from shifting or rotating along the engaging surface 44A1 of the first temporary carrier 44A.

As best seen in FIG. 4C, second section 40 of semiconductor package 1 may also include a thru-interconnect structure 46B formed with the compliant support structure 46A and formed about the first die 42A, the second die 42B, and the third die 42C. In the illustrated embodiment, thru-interconnect structure 46B may be engaged with the compliant support structure 46A and formed about the first die 42A, the second die 42B, and the third die 42C. In one instance, the thru-interconnect structure 46B is configured to enable electrical connection between solder balls (described in more detail below) and the first die 42A, the second die 42B, and the third die 42C. In another instance, the thru-interconnect structure 46B is configured to enable electrical connection between solder balls and the first die 42A, the second die 42B, and the third die 42C in order to enable for higher-level assemblies, which is described in more detail below.

It should be understood that compliant support structure 46A and thru-interconnect structure 46B may include a temporary or removable support 47A and a permanent support 47B. As best seen in FIG. 4B, the temporary support 47A is initially applied to the first die 42A, second die 42B, third die 42C, and the first temporary carrier 44A via suitable fabrication methods such as adaptive direct write lithography and other fabrication methods of the like. In this embodiment, temporary support 47A may be a cured polymer network that is formed on and about the first die 42A, second die 42B, third die 42C, and the first temporary carrier 44A. Additionally, the temporary support 47A may also include a preferably thin-metal coating. Once the temporary support 47A is cured, the temporary support may be removed to leave the permanent support 47B engaged with the engaging surface 44A1 of the first temporary carrier 44A along with the first die 42A, the second die 42B, and the third die 42C. The permanent support 47B may also be a CTE-compliant structure that is dictated by the implementation of semiconductor package 1.

The compliant support structure 46A may also define any suitable structural configuration in order to provide translational support to the first die 42A, the second die 42B, and the third die 42C in the horizontal or lateral directions so that the first die 42A, the second die 42B, and the third die 42C are prevented from shifting or rotating along the engaging surface 44A1 of the first temporary carrier 44A. Such structural configuration of the compliant support structure 46A may be based on various considerations, including the size, shape, and materials of the first die 42A, the second die 42B, and the third die 42C. In one instance, a compliant support structure described and illustrated herein may be an open-cell foam stochastic three-dimensional structure that forms about at least one die of a semiconductor package and that engages with at least one temporary carrier of the semiconductor package. In another instance, a compliant support structure described and illustrated herein may be a non-stochastic lattice structure that forms about at least one die of a semiconductor package and that engages with at least one temporary carrier of the semiconductor package.

While the compliant support structure 46A and thru-interconnect structure 46B may include the temporary support 47A and the permanent support 47B, the compliant support structure 46A and thru-interconnect structure 46B may include any suitable number of supports. In one example, a compliant support structure 46A and thru-interconnect structure 46B described and illustrated herein may form a single CTE-compliant structure with the first die 42A, the second die 42B, the third die 42C and the first temporary carrier 44A without depositing a temporary support structure, such as temporary support 47A.

Second section 40 may also include irises 49 applied to the compliant support structure 46A and/or thru-interconnect structure 46B. More particularly, irises 49 may be applied to the permanent support structure 46AB of compliant structure 46A. In one example, the second section 40 may define any suitable number of irises 49 with any structural configuration dictated by the implementation of the irises 49. In another example, irises 49 may be provided on the second section 40 in any suitable and known manner for maintaining the irises 49 with the permanent support structure 46AB While not illustrated in this embodiment, second section 40 of semiconductor package 1 may include at least one air cavity structure (not illustrated) formed between at least one die 42 and at least one temporary carrier 44. In one instance, a single air cavity structure (such as air cavity structure 20) may be formed between any of the first die 42A, the second die 42B, and the third die 42C and the first temporary carrier 44A. In this instance, an air cavity structure may operably engage with the active surface 42A2, 4262, 42C2 of any one of the first die 42A, the second die 42B, or the third die 42C and the first surface 44A1 of first temporary carrier 44A. The use of the air cavity structure with at least one die 42 and at least one temporary carrier 44 may provide various advantages, including singulation, cleaning, deposit getters to the air cavity, temporary storage, and other various advantages of the like provided by the air cavity structure.

Second section 40 of the semiconductor package 1 includes at least another electrical structure or interconnect generally referred to as numeral 52. The at least another electrical structure 52 may include any suitable electrical elements and/or components dictated by the implementation of the semiconductor package 1. In at least one instance, semiconductor package 1 includes a single electrical structure 52 in this specific implementation of semiconductor package 1 where the electrical structure 52 may be configured to electrically connect the first die 42A, the second die 42B, and the third die 42C with specific electrical elements and/or components provided in the electrical structure 52. Such elements and components of the electrical structure 52 are described in more detail below.

Figure 5A:
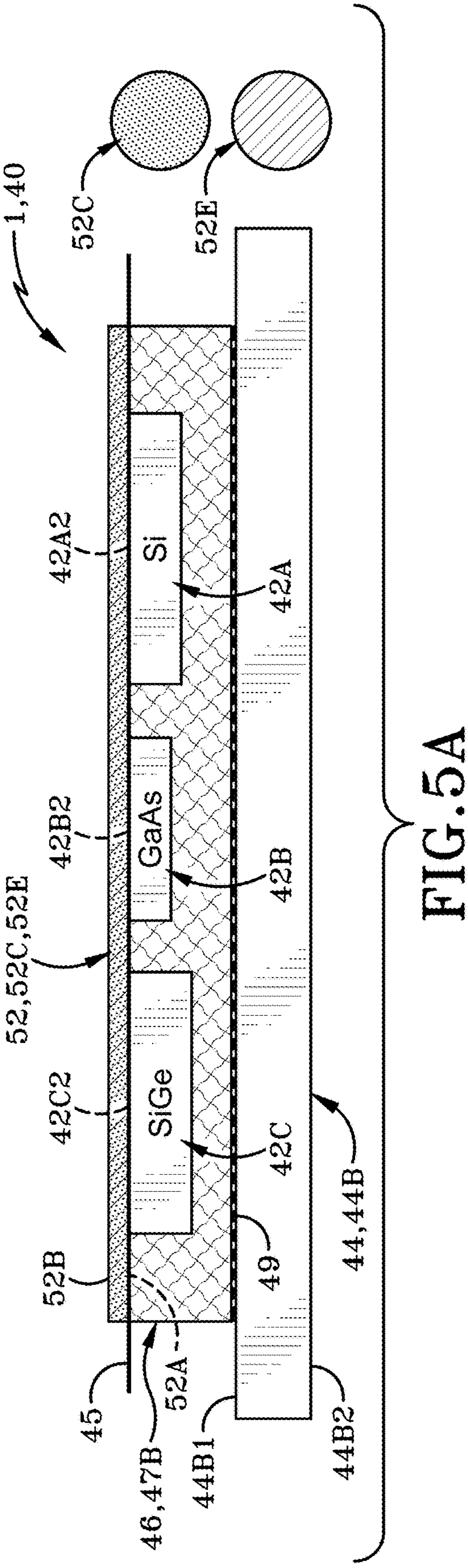
FIG. 5A is a side elevation view of operably engaging an electrical structure with the second section.

As best seen in FIG. 5A, the electrical structure 52 includes a first surface or first electrical engaging surface 52A that electrically connects with the first die 42A, the second die 42B, and the third die 42C. More particularly, the first surface 52A of electrical structure 52 electrically connects with the inactive surface 42A1 of the first die 42A, the inactive surface 42B1 of the second die 42B, and the inactive surface 42C1 of the third die 42C. Electrical structure 52 also includes a second surface or second electrical engaging surface 52B that is opposite to the first surface 52A. Second surface 52B of electrical structure 52 may electrically engage any suitable components or elements provided in semiconductor package 1. In one instance, second surface 52B of electrical structure 52 may electrically connect with a plurality of solder balls 54 for testing purposes of second section 40 or for constructing higher-level assemblies. In another instance, second surface 52B of electrical structure 52 may electrically connect with another electrical structure of a second section of semiconductor package 1, which is described in more detail below.

It should be understood that electrical structure 52 of second section 40 may include various input and output connections and/or contours defined along the first surface 52A and/or the second surface 52B as dictated by the implantation of the semiconductor package 1. As such, desired electrical components (e.g., radio frequency devices, passive electrical devices, digital electrical devices, ground electrical elements, power electrical devices, etc.) may be engaged at specific input and output connections and/or contours defined along the first surface 52A and/or the second surface 52B. While not illustrated herein, additional supports or shielding features may be provided on the first surface 52A and/or the second surface 52B for structural support. Electrical structure 52 may also include a deposited conductive metal (e.g., copper or suitable conductive metals of the like) prior to or subsequent to the inclusion of the desired electrical components.

Such creation of input and output connections and/or contours defined along the first surface 52A and/or the second surface 52B may be performed by any suitable methods and techniques used in the semiconductor package field. In one instance, adaptive direct write lithography may be used to create various input and output connections and/or contours defined along the first surface 52A and/or the second surface 52B as dictated by the implantation of the semiconductor package 1.

Figure 5B:
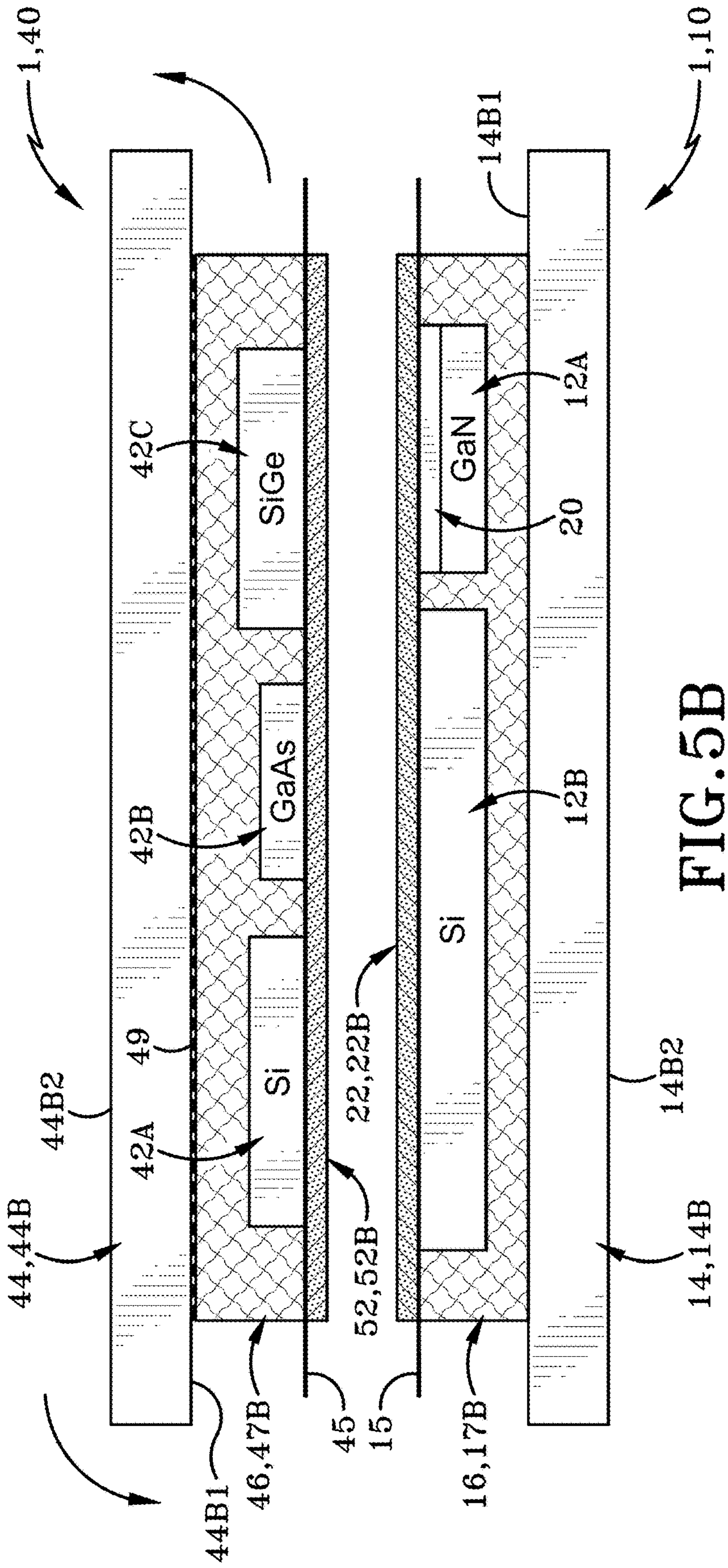
FIG. 5B is a side elevation view similar to FIG. 5A, but the second section is inverted and aligned with the first section.

Electrical structure 52 of second section 50 may also include at least one temporary dielectric applied to one or both of the first surface 52A and the second surface 52B. As best seen in FIGS. 5A and 5B, a first temporary dielectric or interior temporary dielectric 52C is applied between the first surface 52A and the second surface 52B of the electrical structure 52. Such inclusion of first temporary dielectric 52C may be performed by any suitable methods and techniques used in the semiconductor package field. In one instance, adaptive direct write lithography may be used to include first temporary dielectric 52C to first surface 52A and second surface 52B of electrical structure 52.

Still referring to FIGS. 5A and 5B, electrical structure 52 of second section 40 may also include and/or incorporate at least one permanent dielectric to add electromechanical support to signal transmission lines, ground transmission lines, or power transmission lines, shielding structures, or other electrical devices. In this illustrated embodiment, a permanent dielectric 52E is incorporated into the electrical structure 52 to add electromechanical support to signal transmission lines, ground transmission lines, or power transmission lines, shielding structures, or other electrical devices. Such inclusion of permanent dielectric 52E may be performed by any suitable methods and techniques used in the semiconductor package field. In one instance, adaptive direct write lithography may be used to include permanent dielectric 52E to the electrical structure 52 at appropriate and/or desired locations based on mechanical simulations performed on the electrical structure 52. In one instance, the supports provided in the permanent dielectric 52E may be cantilevered from surrounding metal features. In another instance, the supports provided in the permanent dielectric 52E may be positioned on the center from metal below or directly attached to at least one die 42 surface.

While the permanent dielectric 52E is separate from the first temporary dielectric 52C, a permanent dielectric 52E may be incorporated with one or both of a first temporary dielectric or second temporary dielectric for assembly purposes. In one instance, a pre-fabricated dielectric component may be installed into a cavity of a second temporary dielectric where the pre-fabricated dielectric component is encapsulated and remains as a permanent support.

As stated previously, electrical components may be introduced into the electrical structure 52 by any suitable methods and techniques. In one instance, electrical components may be permanently added into the electrical structure 52 upon manufacturing and/or building of the electrical structure 52. In this same instance, an electrical component may be incorporated as a layered or interdigital structure using a deposition process (as described above) or an additive manufacturing process (e.g., plasma spray methods). In another instance, prefabricated and/or existing electrical components may be added to the electrical structure 52 once the electrical structure 52 is built.

Figure 5C:
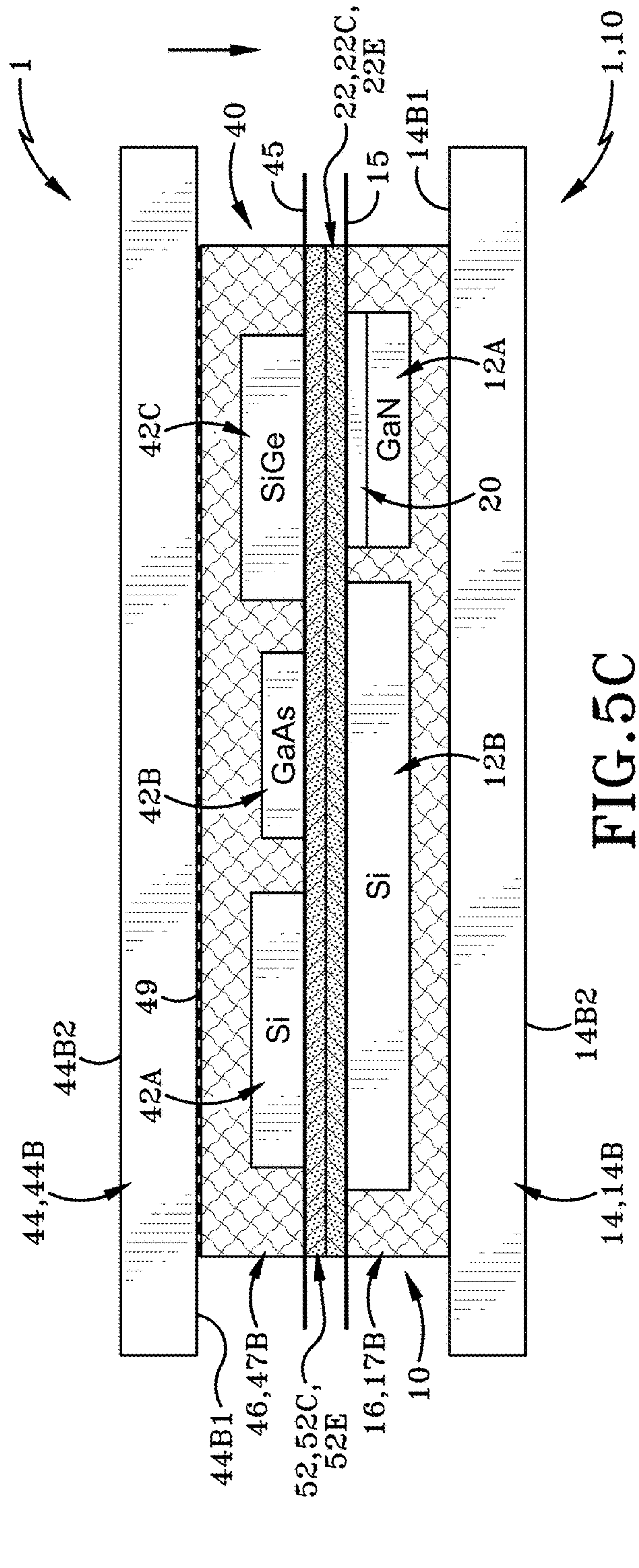
FIG. 5C is a side elevation view similar to FIG. SB, but the electrical structure of the second section operably engages with the electrical structure of the first section.

As illustrated in FIG. 5C, first section 10 and second section 40 are operably engaged with one another to collectively form the semiconductor package 1. More particularly, the electrical structure 22 of first section 10 operably engages with the electrical structure 52 of second section 40. Specifically, the second surface 22B of the electrical structure 22 of first section 10 operably engages with the second surface 52B of the electrical structure 52 of second section 40. Upon such engagement, the first section 10 and the second section 40 are electrically connected with one another via the connection between the electrical structure 22 of first section 10 and the electrical structure 52 of second section 40. Stated differently, the first section 10 and the second section 40 are in electrical communication with one another via the connection between the electrical structure 22 of first section 10 and the electrical structure 52 of second section 40.

While the first section 10 and the second section 40 are electrically connected with one another via the connection between the electrical structures 22, 52 of first and second sections 10, 40, any suitable methods or techniques may be used to engage the first section 10 and the second section 40 with one another. In one instance, wafer bonding methods and techniques may be used to engage the first section 10 and the second section 40 with one another.

Having now described the components and elements of the semiconductor package 1, methods of manufacturing the semiconductor package 1 is described in more detail below.

Prior to building the first section 10, a designer of the semiconductor package 1 may choose one or more dies 12 dictated by the implementation of the semiconductor package 1. In this instance, first die 12A and second die 12B are selected by the designer to include in the first section 10. Once selected, first die 12A and second die 12B are then operably engaged with the first temporary carrier 14A of the first section 10. More particularly, the active surfaces 12A2, 12B2 of first and second dies 12A, 12B may operably engaged with the first surface 14A1 of the first temporary carrier 14A. While not illustrated herein, the second surface 14A2 of the first temporary carrier 14A may be resting on a support surface or structure as the first section 10 is constructed.

Still referring to FIG. 2A, a designer of the semiconductor package 1 may also choose one or more air cavity structures 20 as described above. In this instance, the designer may choose the air cavity structure 20 that operably engages with the first die 12A and the first temporary carrier 14A in which the air cavity structure 20 is positioned between the first die 12A and the first temporary carrier 14A. More particularly, the air cavity structure 20 operably engages with the active surface 12A2 of the first die 12A and the first surface 14A1 of the first temporary carrier 14A in which the air cavity structure 20 is positioned between the first die 12A and the first temporary carrier 14A.

Once the first die 12A and the second die 12B operably engage with the first temporary carrier 14A, the compliant support structure 16A may be formed to the first die 12A, the second die 12B, and the first temporary carrier 14A. As best seen in FIG. 2B, the compliant support structure 16A operably engages with and about the first die 12A and the second die 12B and operably engages with the first temporary carrier 14A. With respect to the first die 12A, the complaint support structure 16A is formed about the first die 12A in which the complaint support structure 16A bonds with first side 12A3 and the second side 12A4 of first die 12A. Similarly, with respect to the second die 12B, the complaint support structure 16A is also formed about the second die 12B in which the complaint support structure 16A bonds with first side 12B3 and the second side 12B4 of second die 12B. With respect to the first temporary carrier 14A, the compliant support structure 16A is formed on the temporary carrier 14A and bonds with the first surface 14A1 of the temporary carrier 14A. In this instance, the compliant support structure 16A is non-stochastic and/or uniform across the first section 10. In other exemplary embodiments, a compliant support structure may be stochastic and/or varying across the first section 10 based on various considerations, including the number of die provided on a first section.

Once the compliant support structure 16A is bonded, at least one thermally conductive structure 16B may be formed to the first die 12A, the second die 12B, and the first temporary carrier 14A. As best seen in FIG. 2C, the first and second thermally conductive portion of the thermally conductive structure 16B operably engage with the first die 12A and the second die 12B and may operably engage with the first temporary carrier 14A. With respect to the first die 12A, the thermally conductive structure 16B is formed about the first die 12A in which the thermally conductive structure 16B bonds with at least the inactive surface 12A1 and may bonds with first side 12A3 and the second side 12A4 of first die 12A. Similarly, with respect to the second die 12B, the thermally conductive structure 16B is also formed about the second die 12B in which the thermally conductive structure 16B bonds with at least the inactive surface 12B1 and may bond with first side 12133 and the second side 12134 of second die 12B.

Once thermally conductive structure 16B is bonded, the temporary support 17A may be removed from the first die 12A, the second die 12B, and the first temporary carrier 14A. As best seen in FIG. 2D, the temporary support 17A is removed during the manufacturing process while the permanent support 17B remains with the first die 12A, the second die 12B, and the first temporary carrier 14A. In this instance, the permanent support 17B is non-stochastic and/or uniform across the first section 10.

Once the permanent support 17B is removed, the first section 10 constructed in FIG. 2D may be rotated and/or flipped about a longitudinal axis of the first section 10 during manufacturing process for installing the second temporary carrier 14B (see FIG. 2E). Once flipped, the second temporary carrier 14B may be installed and bonded with the permanent support 17B of compliant support structure 16A. More particularly, the first surface 14B1 of second temporary carrier 14B is bonded with the permanent support 17B of compliant support structure 16A and thermally conductive structure 16B. The second surface 14B2 of second temporary carrier 14B may be resting on a support surface or structure as the second temporary carrier 14B is installed.

Once second temporary carrier 14B installed, first temporary carrier 14A may be removed from the first die 12A, particularly the air cavity structure 20, and the second die 12B and while leaving interconnect dielectric. The inclusion of the first temporary carrier 14A is used to protect the active surfaces 12A2, 12132 of the first and second dies 12A, 12B during the manufacturing process of semiconductor package 1. In other exemplary embodiments not illustrated herein, first temporary carrier 14A may be omitted from the process if desired by a designer of semiconductor package 1. Once active surfaces 12A2, 12132 of the first and second dies 12A, 12B are exposed, the electrical structure 22 is operably engaged with the first and second dies 12A, 12B. As best seen in FIG. 3A, the first surface 22A of the electrical structure 22 is bonded with the active surfaces 12A2, 12B2 of the first and second dies 12A, 12B such that the first and second dies 12A, 12B are electrically connected with the electrical structure 22. The second surface 22B of the electrical structure 22 is free from engaging any component or element at this stage of the manufacturing process. Moreover, first temporary dielectric 22C, second temporary dialectic 22D, and permanent dielectric 22E are provided with the electrical structure 22 at this stage of the manufacturing process (best seen in FIG. 3B).

Once the electrical structure 22 is installed, one or more configurations of semiconductor package 1 may be constructed as dictated by the implementation of semiconductor package 1. In one instance, plurality of solder balls 24 may be operably engaged with the second surface 22B of electrical structure 22 once the first temporary dielectric 22C is removed (see FIGS. 3C-3D). In this same instance, the second temporary dielectric 22D is also removed from the semiconductor package 1 in order to engage another semiconductor package to the first section 10 or for testing and/or probing the first section 10 (see FIG. 3E). In another instance, the second section 40 may be engaged with the first section 10 via bonding of the electrical structure 22 of the first section 10 and the electrical structure 52 of the second section 40, which is described in more detail below (see FIGS. 5C-FIG. 7).

The construction of the second section 40 of the semiconductor package 1 is substantially similar to the construction of the first section 10 described above. As such, the manufacturing process of second section 40 illustrated in FIGS. 4A-5A is substantially similar to the manufacturing process of first section 10 illustrated in FIGS. 2A-3C.

Once the first section 10 and the second section 40 are constructed, the first section 10 and the second section 40 may be operably engaged with one another in a desired structural configuration. As best seen in FIGS. 5B-5C, the first section 10 and the second section 40 are operably engaged with one another via the electrical structures 22, 52 such that the first section 10 and the second section 40 are in electrical communication with one another. More particularly, the second surface 22B of the electrical structure 22 of first section 10 and the second surface 52B of the electrical structure 52 of second section 40 operably engage with one another and are in electrical communication with one another (see FIG. 5C). Once engaged, any suitable techniques or methods may be used to operably engage the first section 10 and the second section 40 are operably engaged with one another via the electrical structures 22, 52. In the illustrated embodiment, wafer bonding is used to operably engage the first section 10 and the second section 40 are operably engaged with one another via the electrical structures 22, 52.

Once the first section 10 and the second section 40 are operably engaged with one another, one or more configurations of semiconductor package 1 may be constructed as dictated by the implementation of semiconductor package 1.

Figure 6A:
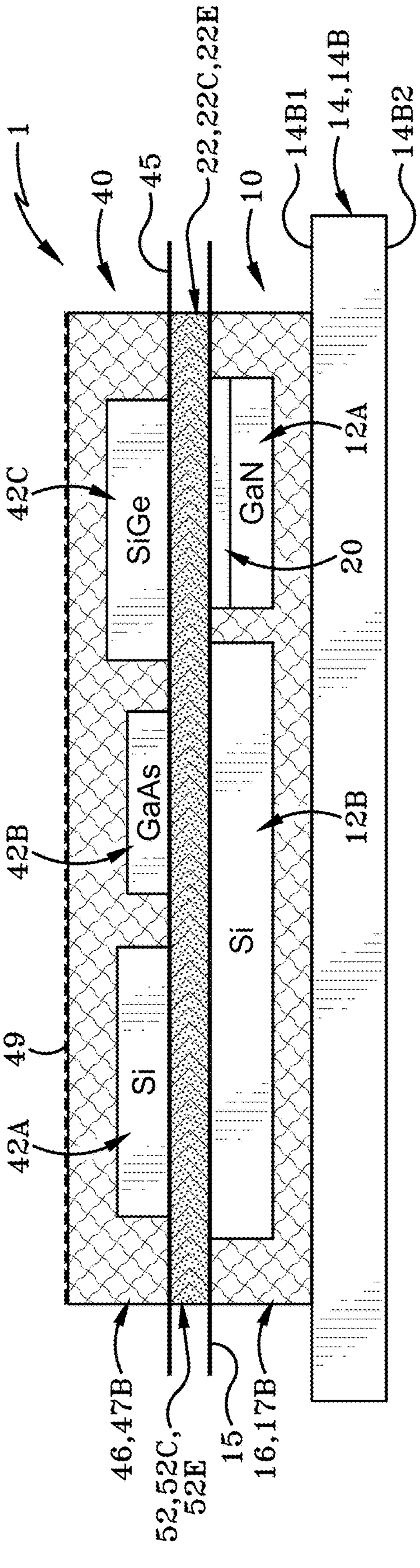
FIG. 6A is a side elevation view of the second temporary carrier of the second section being removed from the compliant support structure along with plating exterior dielectric to the second section.
Figure 6B:
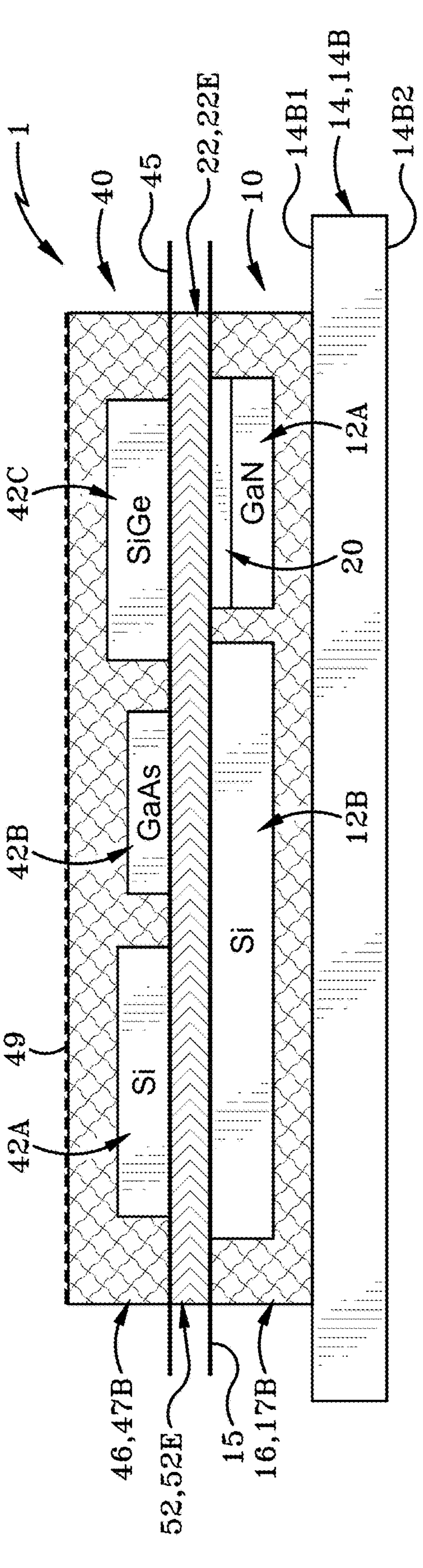
FIG. 6B is a side elevation view similar to FIG. 6A, but a first temporary dielectric is removed from the second section.
Figure 6C:
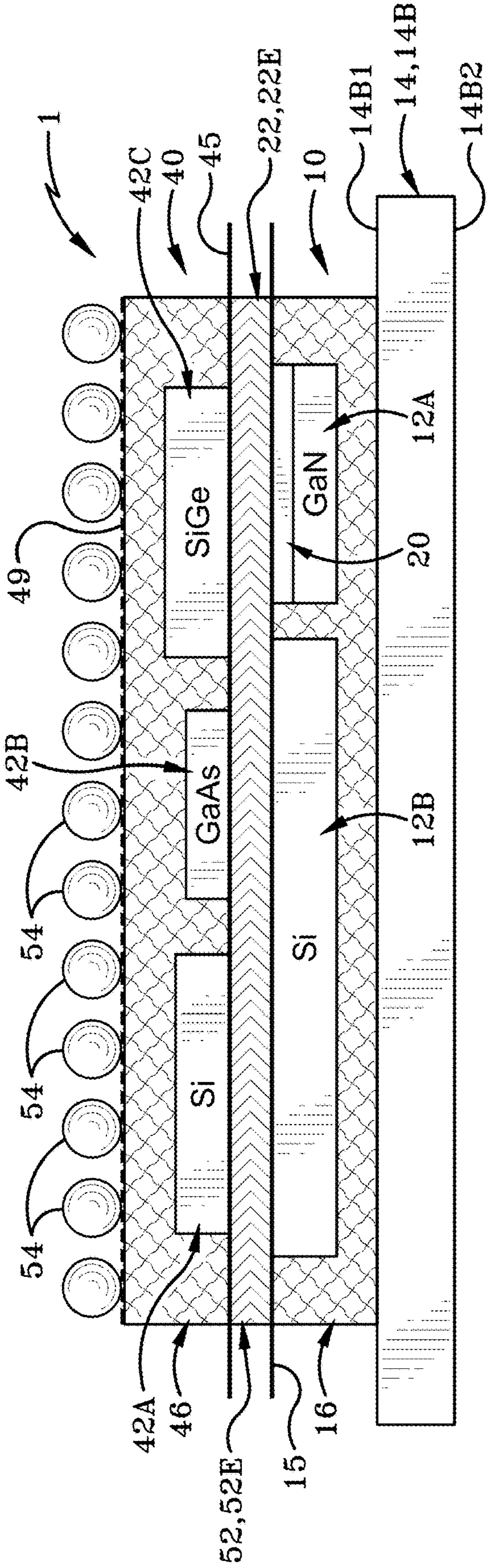
FIG. 6C is a side elevation view similar to FIG. 6B, but a plurality of solder balls operably engages with the electrical structure of second section.
Figure 6D:
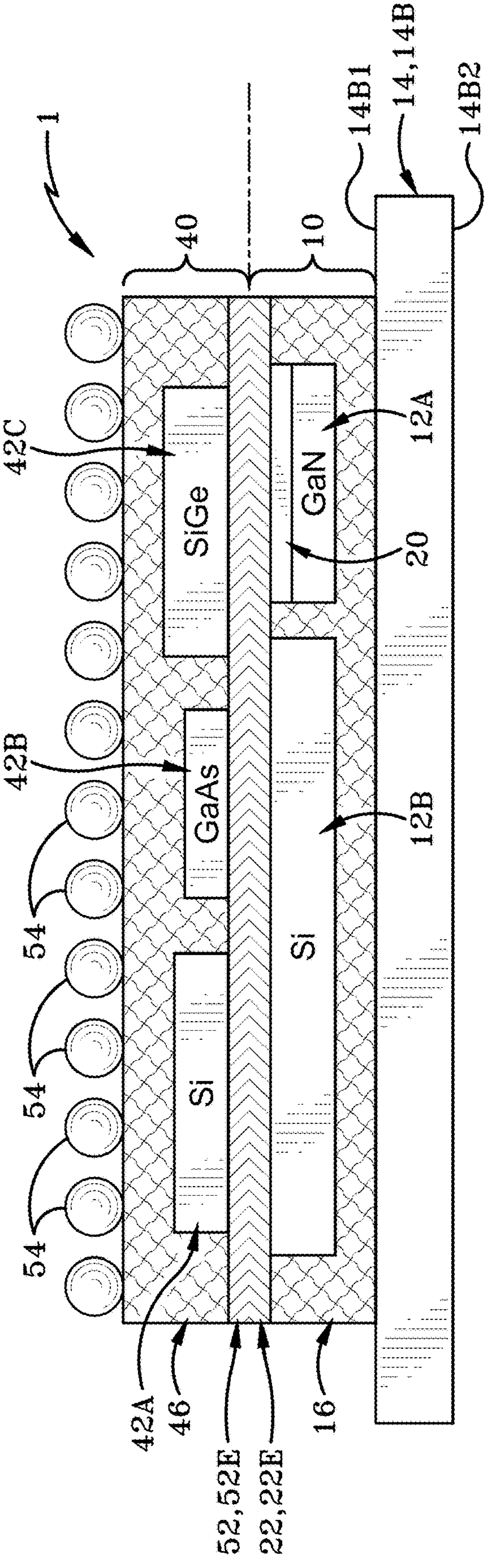
FIG. 6D is a side elevation view similar to FIG. 6C, but a second temporary dielectric is removed from the second section.
Figure 6E:
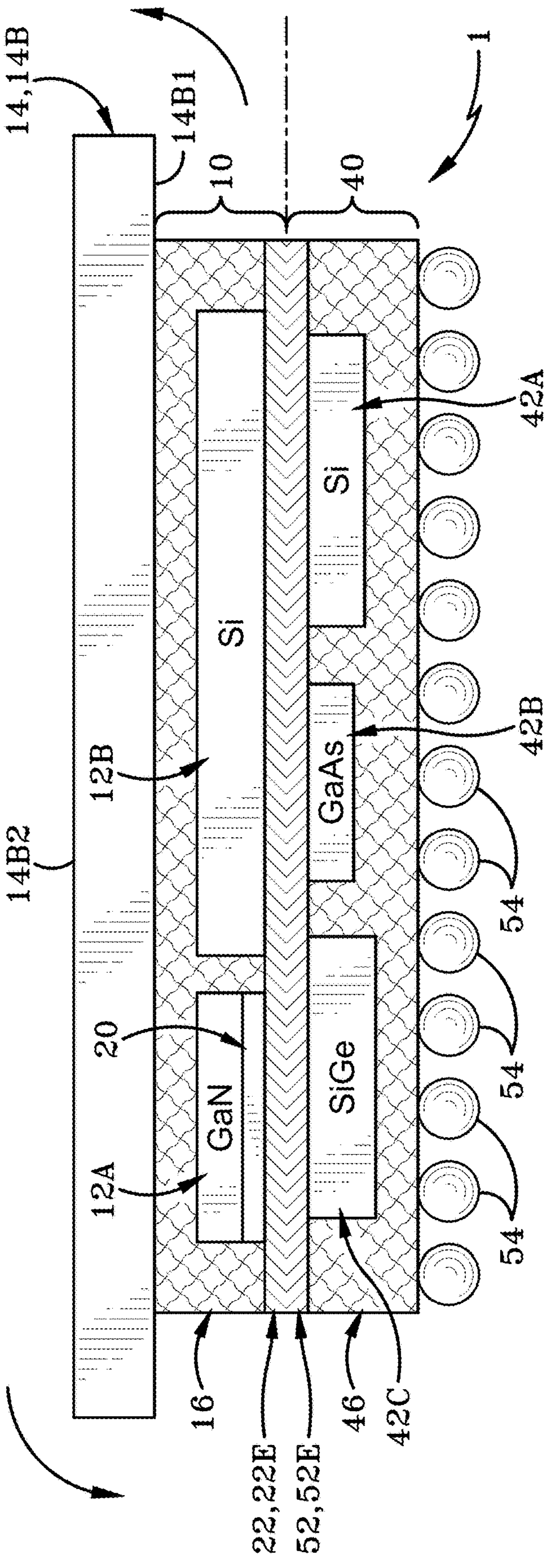
FIG. 6E is a side elevation view similar to FIG. 6D, but the combination of the first section and second section is inverted.
Figure 6F:
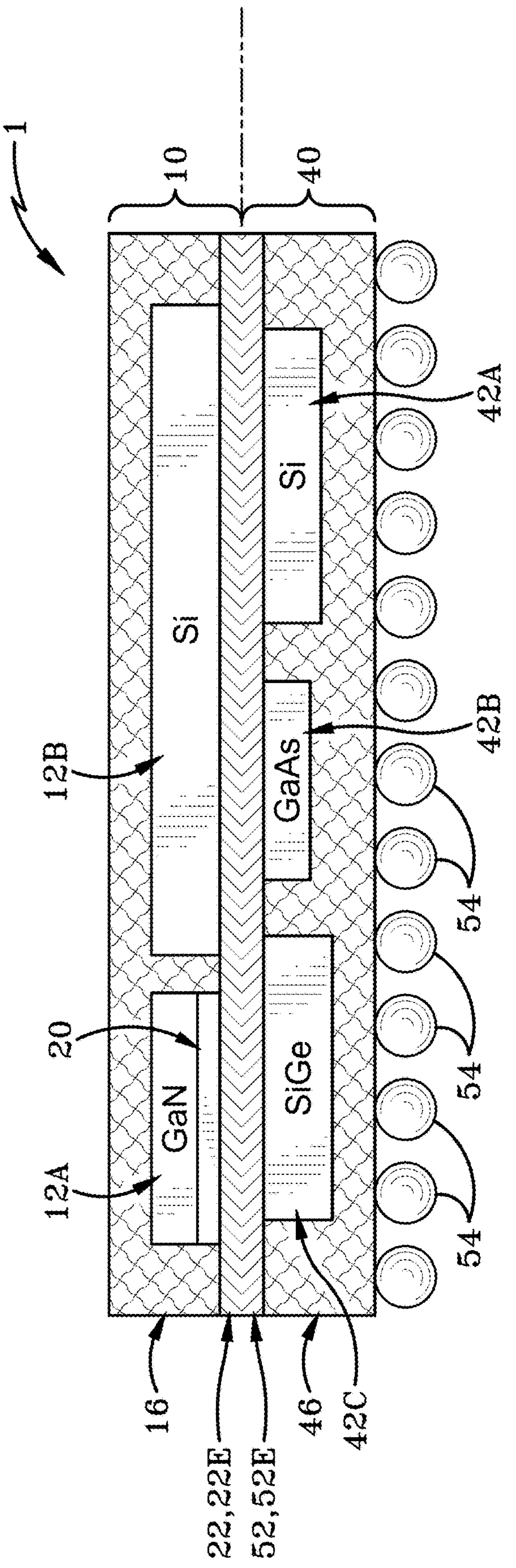
FIG. 6F is a side elevation view similar to FIG. 6E, but the second temporary carrier is removed from the first section.

In one instance, plurality of solder balls 54 may be operably engaged with the second surface 52B of electrical structure 22 once the first temporary dielectric 52C and the second temporary carrier 44B are removed (see FIGS. 6B-6C). In this same instance, the irises 49 may also be removed from the semiconductor package 1 in order to engage another semiconductor package to the first section 10 or for testing and/or probing the first section 10 with a probing tool 60 at the solder balls 54 (see FIGS. 6D and 7). As best seen in FIG. 7, heat 18A, 18B may be dissipated from the first die 12A and the second die 12B upon testing and/probing of the first section 10 via the thermally conductive structure 16B.

In another instance, the second section 40 may be engaged with the first section 10 via bonding of the electrical structure 22 of the first section 10 and the electrical structure 52 of the second section 40 (see FIGS. 5C-FIG. 7). In this instance, the second temporary carriers 14B, 44B are also removed from first and second sections 10, 40 in order to further engage the plurality of solder balls 54 or to engage semiconductor package 1 with another semiconductor package discussed herein (e.g., another semiconductor package 1) or commercially available (see FIGS. 6E and 7). When the plurality of solder balls 54 are engaged, probing and/or testing of the semiconductor package 1 may be induced (see FIG. 7).

While the compliant support structures 16, 46 described and illustrated herein have been illustrated with lattice configurations, compliant support structures described and illustrated herein may define any suitable structural configuration created through additive manufacturing techniques and processes. In one instance, compliant support structures of a semiconductor package may define organic and/or branch-like shapes that sporadically operably engage with electrical connections and dies provided in the semiconductor package. In this instance, these compliant support structures may be made of a foam material formed sporadically about the electrical connections and dies to maintain and support said electrical connections and dies. In this same instance, these compliant support structures may also be strategically formed supports that sporadically operably engaged with the electrical connections and dies to maintain and support said electrical connections and dies.

It should also be understood that complaint support structures 16, 46 and/or dielectric supports or material described and illustrated herein may be made from any suitable materials. In one instance, complaint support structures and/or dielectric supports or material described and illustrated herein may be rigid materials such as glass materials and other rigid materials of the like. In another instance, complaint support structures and/or dielectric supports or material described and illustrated herein may be flexible materials such as hexagonal boron nitride (h-BN) material, polymer based materials, and other flexible materials of the like.

It should also be appreciated that other suitable compliant electrical structuring may be considered in the embodiments discussed above. In one instance, an individual, singular die with interconnects may interface and/or engage with disparate PCB materials to form next level of semiconductor package. In this instance, wafer bonding and/or stacking of multiple dies packaged with one another may be omitted if desired for an intended semiconductor package when resolving issues of CTE material mismatching within heterogeneously integrated packages.

It should also be appreciated that dies described and illustrated herein may be any commercially-available dies necessary for a proposed semiconductor package. Examples of dies suitable for a proposed semiconductor package described herein include monolithic microwave integrated circuit or MMIC-based die, mixed-signal integrated circuits, digital die (e.g., processors, memory, etc.), photonic integrated circuits, and other dies necessary for a proposed semiconductor package described herein.

Figure 8:
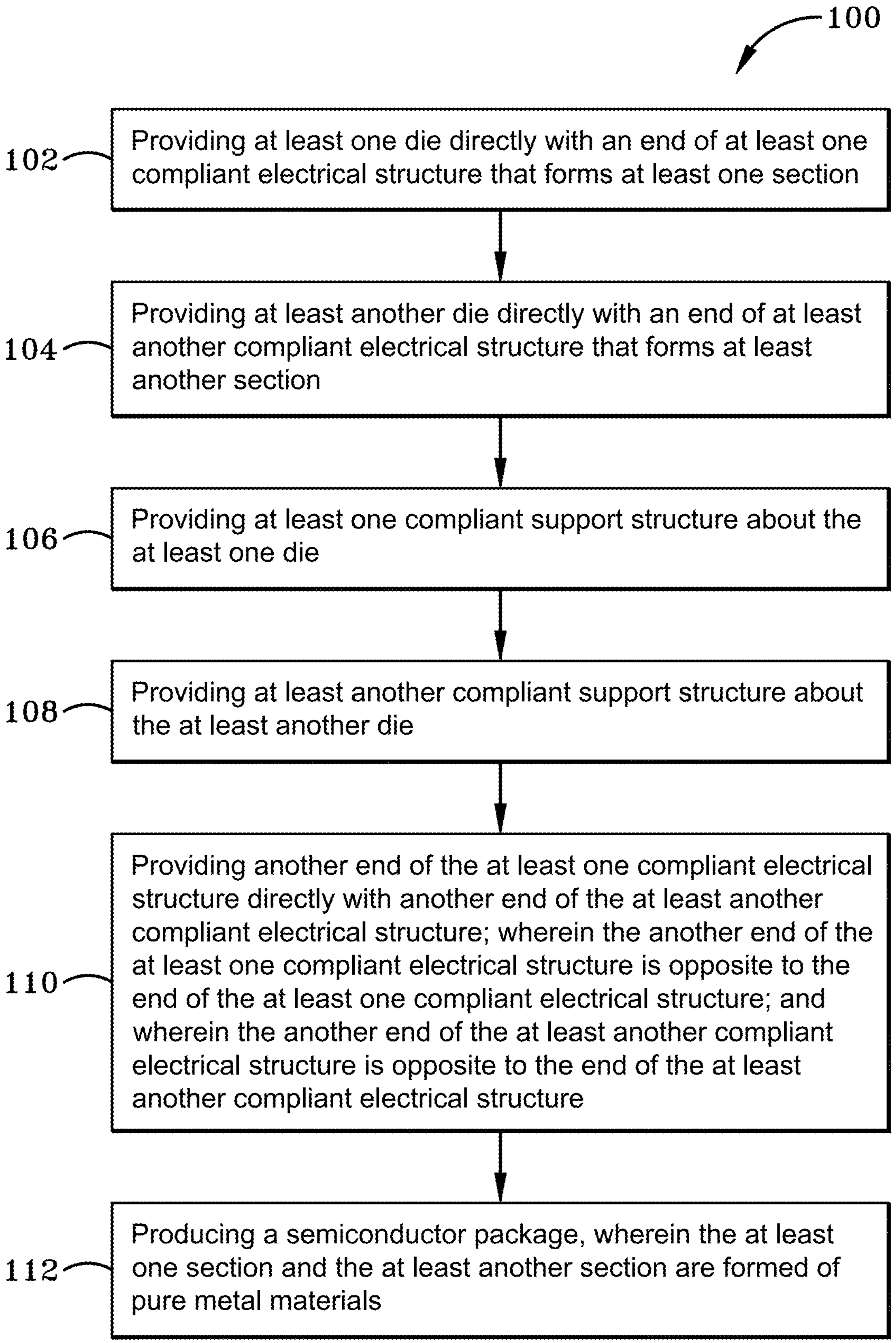
FIG. 8 is an exemplary method flowchart.

FIG. 8 illustrates a method 100. An initial step 102 of method 100 may include providing at least one die engaged directly with an end of at least one electrical structure that forms at least one section. Another step 104 of method 100 may include providing at least another die engaged directly with an end of at least another electrical structure that forms at least another section. Another step 106 of method 100 may include providing at least one compliant support structure positioned about the at least one die. Another step 108 of method 100 may include providing at least another compliant support structure positioned about the at least another die. Another step 110 of method 100 may include providing another end of the at least one electrical structure engaged directly with another end of the at least another electrical structure; wherein the another end of the at least one electrical structure is opposite to the end of the at least one electrical structure; and wherein the another end of the at least another electrical structure is opposite to the end of the at least another electrical structure. Another step 112 of method 100 may include producing a semiconductor package, wherein the at least one section and the at least another section are formed entirely of metal materials.

In other exemplary embodiments, method 100 may include optional and/or additional steps. Optional steps may further include providing at least one temporary carrier directly engaged with an end of the at least one die; and providing at least another temporary carrier directly engaged with the at least one compliant support structure and towards an opposite end of the at least one die; wherein the steps of providing the at least one temporary carrier directly engaged with the end of the at least one die and providing at least another temporary carrier directly engaged with the at least one compliant support structure and towards the opposite end of the at least one die are completed prior to the step of providing the at least one die directly with the end of the at least one electrical structure that forms the at least one section. An optional step may further include providing an air cavity structure between the at least one die one of the at least one temporary carrier. Another optional step may further include removing the at least one temporary carrier from the at least one die and the at least one compliant support structure prior to the step of providing the at least one die directly engaged directly with the end of the at least one electrical structure that forms the at least one section. Optional steps may further include providing at least one temporary carrier directly engaged with an end of the at least another die; and providing at least another temporary carrier directly engaged with the at least another compliant support structure and towards an opposite end of the at least another die; wherein the steps of providing at least one temporary carrier directly engaged with the end of the at least another die and providing at least another temporary carrier directly engaged with the at least another compliant support structure and towards the opposite end of the at least another die are completed prior to the step of providing the at least another die directly with the end of at least another electrical structure that forms the at least another section. Another optional step may further include providing an air cavity between the at least another die and the at least one temporary carrier. Another optional step may further include removing the at least one temporary carrier from the at least another die and the at least one compliant support structure prior to the step of providing at least another die directly with the end of the at least another electrical structure that forms the at least another section. Optional steps may further include providing a plurality of solder balls with one of the at least one section and the at least another section; and testing the semiconductor package via the plurality of solder balls. Optional steps may further include providing a plurality of solder balls with one of the at least one section and the at least another section; and providing a second semiconductor package with the semiconductor package.

Figure 9:
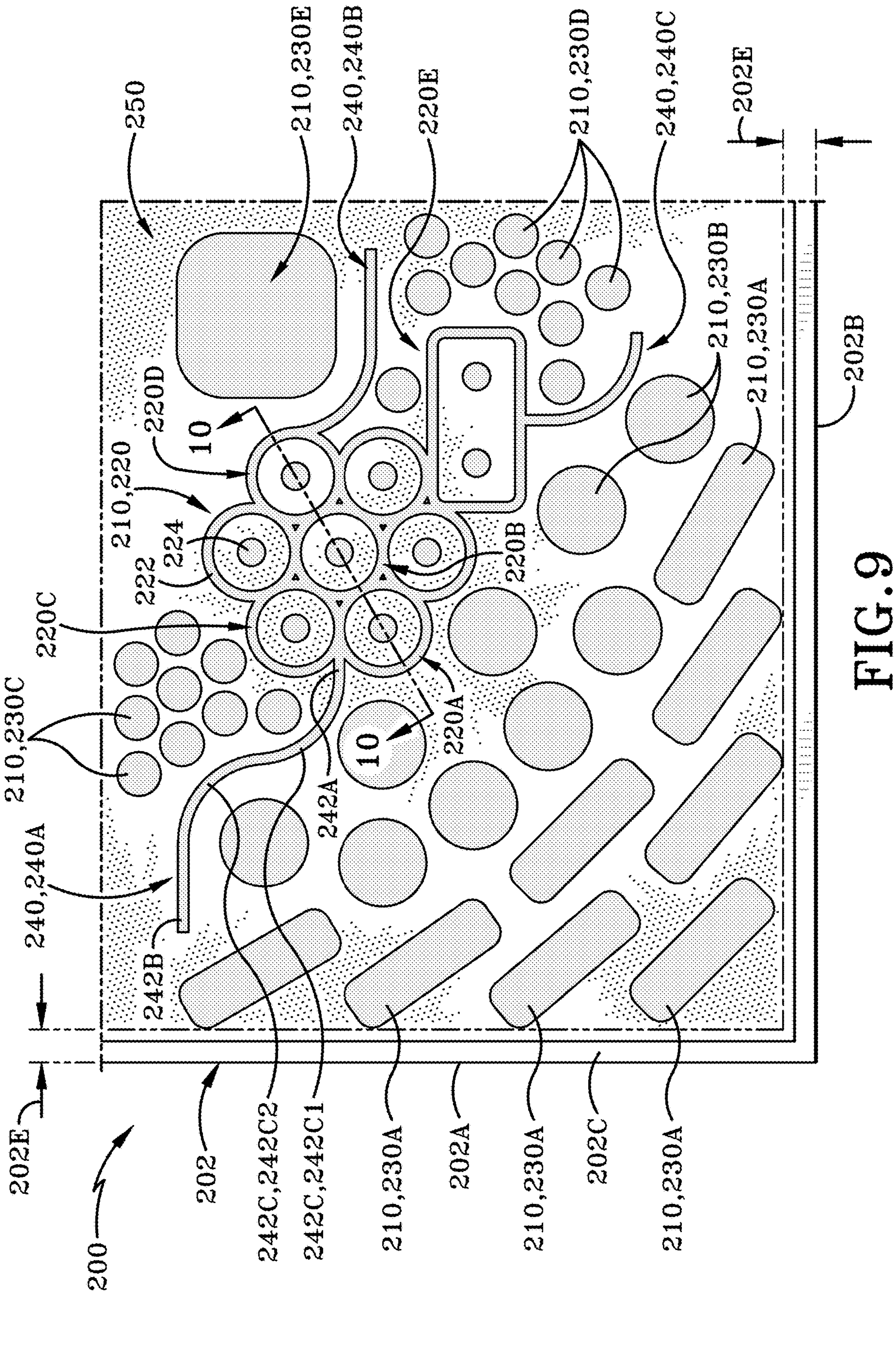
FIG. 9 is a top plan view of a semiconductor die having sets of input/output (IO) connections in accordance with one aspect of the present disclosure.
Figure 10:
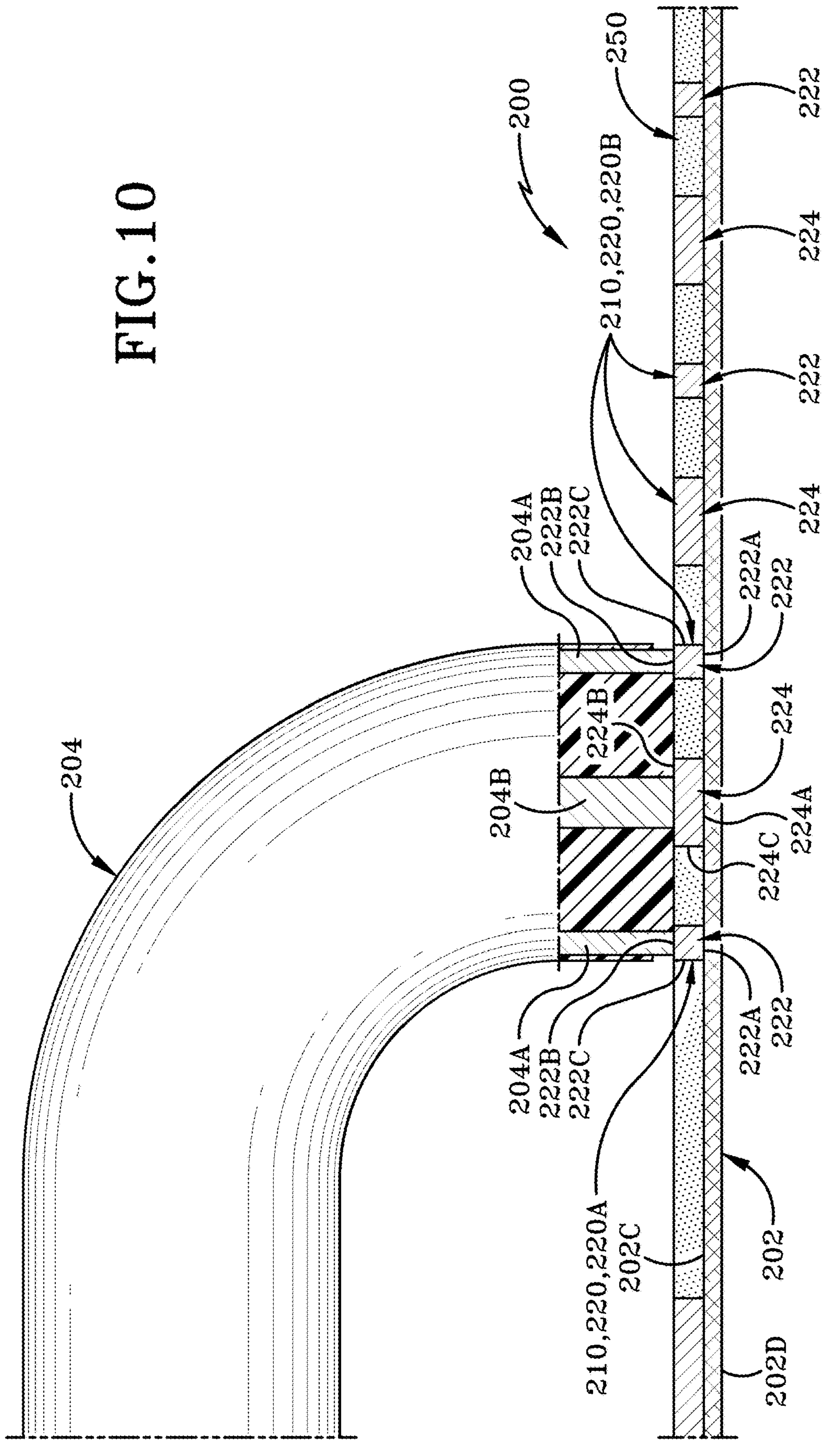
FIG. 10 is a cross-sectional view of the semiconductor die taken in the direction of line 10-10 shown in FIG. 9.

FIGS. 9 and 10 illustrate a semiconductor package 200 with at least one semiconductor die 202 (hereinafter "die") that may be similar to semiconductor dies 12, 42 described above, except as detail below.

In this embodiment, a single die 202 is shown herein. As best seen in FIG. 9, die 202 includes at least one peripheral wall 202A and at least another peripheral wall 202B adjacent to the at least one peripheral wall 202A but oriented orthogonal to the at least one peripheral wall 202A defined therebetween. It should be appreciated that die 202 may include any suitable number of peripheral walls and/or structural configuration that enables electrical connection and/or I/O connections to be provided on said die 202; such electrical connection and/or I/O connections are described in more detail below. It should also be appreciated that the at least one peripheral wall 202A, the at least another peripheral wall 202B, and any other peripheral walls of die 202 may be oriented and/or configured with any suitable structural configuration. In one instance, at least one peripheral wall 202A, the at least another peripheral wall 202B, and any other peripheral walls of die 202 may be oriented at an acute angle relative to a top or bottom surface of die 202. In another instance, at least one peripheral wall 202A, the at least another peripheral wall 202B, and any other peripheral walls of die 202 may be oriented at an obtuse angle relative to a top or bottom surface of die 202.

Die 202 also includes a top or first surface 202C that is positioned vertically above the at least one peripheral wall 202A and the at least another peripheral wall 202B, a bottom or second surface 202D that is positioned vertically below the at least one peripheral wall 202A and the at least another peripheral wall 202B surface 202C, and a vertical axis defined therebetween. In the illustrated embodiment, the top surface 202C is configured to receive a set of input/output connections, which is described in more detail below, and the bottom surface 202D is configured to operably engaged with an interconnect or electrical structure (such as electrical structures 22, 52).

Die 202 also includes a restricted region 202E. As best seen in FIG. 9, the restricted region 202E extends along the perimeter of the die 202 adjacent to the at least one peripheral wall 202A, the at least another peripheral wall 202B, and other peripheral walls of die 202. In the illustrated embodiment, the restricted region 202E extends continuously along perimeter of die 202 and is uninterrupted along the top surface 202C of die 202. The restricted region 202E prevents electrical connections and/or I/O connections from being placed or provided in this area.

It should be appreciated that die 202 may be any suitable semiconductor die described and illustrated herein and other readily available. In one instance, die 202 may be a commercially available die made of commercially available material that is considered suitable for use in a semiconductor package. Moreover, it should be understood that die 202 described and illustrated herein may include any suitable characteristics considered suitable for use in a semiconductor package. In one instance, die 202 may be configured with mixed signals to be used with analog circuits, digital circuits, intrinsic mixed-signal circuits, and other various circuits currently used in the art.

Still referring to FIG. 9, a sets of input/output (IO) connections 210 are provided on the top surface 202C of die 202 via any suitable additive manufacturing methods and/or techniques. The sets of IO connections 210 may be used for various and/or mixed signals that may be generated by the semiconductor die 202. Such IO connections that make up the sets of IO connections 210 are described in more detail below.

The sets of IO connections 210 may include a first set of IO connections 220 provided on the top surface 202C of the die 202. In the illustrated embodiment, the first set of IO connections 220 are radio frequency (RF) connections provided on the top surface 202C of die 202 to directly connect coaxial connections 204 with the die 202; such connection between coaxial connections 204 and die 202 is described in more detail below. As best seen in FIGS. 9 and 10, each IO connection of the first set of IO connections 220 includes a first bond pad 222 and a second bond pad 224 being encapsulated by the first bond pad 222. In this illustrated embodiment, first bond pad 222 of each IO connection of the first set of IO connections 220 is continuous and uninterrupted to completely encapsulate the second bond pad 224 from other surrounding IO connection in the first set of IO connection 220 and other sets of IO connections provided on die 202. Such features and characteristics of the first bond pad 222 and the second bond pad 224 of each IO connection of the first set of IO connections 220 are described in greater detail below.

Referring to FIGS. 9 and 10, first bond pad 222 of each IO connection of the first set of IO connections 220 includes a first surface 222A that is provided on the top surface 202C of die 202, a second surface 222B opposite to the first surface 222A and positioned remote from the top surface 202C of die 202, and a circumferential wall 222C extending between the first surface 222A and the second surface 222B. In this illustrated embodiment, each of the first surface 222A, the second surface 222B, and the circumferential wall 222C may be substantially continuous and uninterrupted along the entire length of first bond pad 222. Stated differently, each of the first surface 222A, the second surface 222B, and the circumferential wall 222C may be solid and substantially free from non-continuous and/or interrupted features and characteristics along the entire length of first bond pad 222. With each of the first surface 222A, the second surface 222B, and the circumferential wall 222C being substantially continuous and uninterrupted along the entire length of first bond pad 222, the first bond pad 222 may enable electrical signals to be transmitted between an electrical connection (e.g., coaxial connection 204) and the die 202 without such electrical signals being transmitted away from the electrical connection and/or the die 202.

Referring to FIGS. 9 and 10, second bond pad 224 of each IO connection of the first set of IO connections 220 includes a first surface 224A that is provided on the top surface 202C of die 202, a second surface 224B opposite to the first surface 224A and positioned remote from the top surface 202C of die 202, and a circumferential wall 224C extending between the first surface 224A and the second surface 224B. In this illustrated embodiment, each of the first surface 224A, the second surface 224B, and the circumferential wall 224C may also be substantially continuous and uninterrupted along the entire length of second bond pad 224. Stated differently, each of the first surface 224A, the second surface 224B, and the circumferential wall 224C may be solid and substantially free from non-continuous and/or interrupted features and characteristics along the entire length of second bond pad 224. With each of the first surface 224A, the second surface 224B, and the circumferential wall 224C being substantially continuous and uninterrupted along the entire length of second bond pad 224, the second bond pad 224 may enable electrical signals to be transmitted between an electrical connection (e.g., coaxial connection 204) and the die 202 without such electrical signals being transmitted away from the electrical connection and/or the die 202.

As stated before, first bond pad 222 continuously surrounds and/or encapsulates the second bond pad 224 of each IO connection of the first set of IO connections 220 from adjacent IO connections of the first set of IO connections 220 and from adjacent IO connections of other sets of IO connections 220 provided on die 202. In one instance, the first bond pad 222 may define a curvilinear shape that surrounds the second bond pad 224 in which the curvilinear shape of the first bond pad 222 continuously surrounds and/or encapsulates the second bond pad 224 in each IO connection of the first set of IO connections 220 from adjacent IO connections of the first set of IO connections 220 and from adjacent IO connections of other sets of IO connections 220 provided on die 202. In another instance, the first bond pad 222 may define a circular cross-sectional shape that surrounds the second bond pad 224 in which the circular cross-sectional shape of the first bond pad 222 is continuously surrounds and/or encapsulates the second bond pad 224 of each IO connection of the first set of IO connections 220 from adjacent IO connections of the first set of IO connections 220 and from adjacent IO connections of other sets of IO connections 220 provided on die 202.

Such encapsulation of the second bond pad 224 by the first bond pad 222 is considered advantageous at least because the first bond pad 222 provides a continuous electromagnetic and/or RF interference barrier about the second bond pad 224 to prevent unwanted electrical signals from interfering with signal transmitted through the second bond pad 224. With such encapsulation, a designer of die 202 may be enabled to provide the first set of IO connections 220 at any suitable location along the top surface 202C of the die 202 without mixed electrical signals interfering with one another. Stated differently, a designer of die 202 may be enabled to provide the first set of IO connections 220 between other IO connections provided on the die 202 and/or away from the at least one peripheral wall 202A, the at least another peripheral wall 202B, and other peripheral walls of die 202 as compared to conventional placement of IO connections like the first set of IO connections 220 (i.e., near or proximate to the at least one peripheral wall 202A, the at least another peripheral wall 202B, and other peripheral walls of die 202).

The first set of IO connections 220 of the sets of IO connections 210 may also be provided on the top surface 202C of the die 202 via additive manufacturing methods and/or techniques currently and commercially available. Such use of additive manufacturing to provide the first set of IO connection 220 of the sets of IO connections 210 on the top surface 202C of the die 202 is considered advantageous at least because a designer of the die 202 may arrange the first set of IO connections 220 at any suitable position on the die 202. Stated differently, use of additive manufacturing provides a designer with the freedom to place and provide the first set of IO connections 220 at any suitable location on the top surface 202C of the die 202. As such, the first set of IO connections 220 may be provided at the peripheral edges of the top surface 202C proximate to the at least one peripheral wall 202A, the at least another peripheral wall 202B, and other peripheral walls of die 202 or positioned remote from the peripheral edges of the top surface 202C away from the at least one peripheral wall 202A, the at least another peripheral wall 202B, and other peripheral walls of die 202 and towards the center of the die 202. Such flexibility of placing IO connections on the die 202, like the first set of IO connection 220, enables designers to provide high, staggered densities of IO connections along the top surface 202C of the die 202 as compared to conventional, uniform placement of IO connections on dies. Such staggered densities of IO connections may also reduce mechanical stress at the peripheral edges of the die 202 causing damage to the die 202.

With use of additive manufacturing discussed above, each IO connection of the first set of IO connections 220 may be arranged in any suitable geometric pattern on the top surface 202C of the die 202. In one instance, first set of IO connections 220 may be arranged in a uniform, concentrated pattern at a particular location on the top surface 202C of die 202. In this same instance, each IO connection of the first set of IO connections 220 contacts at least two IO connections of the first set of IO connections 220 in this uniform, concentrated pattern. In another instance, first set of IO connections 220 may be arranged in a random, staggered pattern at particular locations on the top surface 202C of die 202. In this same instance, each IO connection of the first set of IO connections 220 may be free from contacting another IO connection of the first set of IO connections 220 in this random, staggered pattern.

As described above, each IO connection of the first set of IO connections 220 may enable at least one coaxial connection 204 to directly connect with the die 202. As best seen in FIG. 10, an outer conductor 204A of coaxial connection 204 may be operably engaged with the first bond pad 222 of a first IO connection 220A of the first set of IO connections 220. Similarly, an inner conductor 204B of the coaxial connection 204 surrounded by the outer conductor 204A may be operably engaged with the second bond pad 222 of the first IO connection 220A of the first set of IO connections 220. Upon such engagement, an epoxy or resin material (not illustrated herein) may be introduced and used to permanently engage the coaxial connection 204 with the die 202 at the first IO connection 220A. Once engaged, the coaxial connection may be operably engaged with another die (similar to die 202) or another electrical component provided in semiconductor package 200 for desired connection purposes, including interconnection purposes between dies and/or other electrical components. Coaxial connection 204 also include dielectric material positioned between the outer conductor 204A and the inner conductor 204B for electrical purposes of separating the outer conductor 204A and the inner conductor 204B from one another.

It should be appreciated that second bond pads 224 of adjacent IO connections of the first set of IO connections may be in fluid communication with one another in which the second bond pads 224 of adjacent IO connections form a single second bond pad 224. As best seen in FIG. 10, the second bond pad 224 of the first IO connection 220A may be in fluid communication with an adjacent second bond pad 224 of a second adjacent IO connection 220B in which the second bond pads 224 of adjacent IO connections 220A, 220B form a single second bond pad 224. As such, a portion of the outer conductor 204A of the coaxial connection 204 may directly contact with the second bond pad 224 of the first IO connection 220A while a portion of another outer conductor 204A of a second coaxial connection 204 may directly contact with the second bond pad 224 of the second IO connection 220B. As illustrated herein, the second bond pads 224 of adjacent IO connections 220A, 220B may be continuous with one another to enable engagement of multiple coaxial connections 204 with the die 202 while still providing electromagnetic or RF interference protection to the second bond pads 224 encapsulated inside of the first bond pads 222.

First and second bond pads 222, 244 of IO connections in the first set of IO connections 220 may also have any suitable thickness and/or density based on the use of a specific IO connections of the first set of IO connections 220, including thermal management and higher ampacity. In one instance, first and second pads 222, 224 of a first IO connection of the first set of IO connection may have a first thickness measured from the first surfaces 222A, 224A to the second surfaces 222B, 224B, and first and second pads 222, 224 of a second IO connection of the first set of IO connection may have a second thickness measured from the first surfaces 222A, 224A to the second surfaces 222B, 224B where the first and second thicknesses are different from one another.

It should be understood that any IO connection of the first set of IO connections 220 may define any suitable sizes, shapes, and configurations dictated by the implementation of the first set of IO connections 220. In the illustrated embodiment, each IO connection of the first set of IO connections 220 defines a substantially circular cross-sectional shape (as best seen in FIG. 9) due to each IO connection of the first set of IO connections 220 being configured for transmitting RF signals between the die 202 and the electrical device 204.

Sets of IO connections 210 may include additional sets of IO connections that may be used for mixed signals different than the RF signals configured with the first set of IO connections 220. As best seen in FIG. 9, sets of IO connections 210 may include a second set of IO connections 230A where the second set of IO connections 230A are staggered along the top surface 202C of die 202 and extend between the at least one peripheral wall 202A and the at least another peripheral wall 202B. Sets of IO connections 210 may include a third set of IO connections 230B where the third set of IO connections 230B are also staggered along the top surface 202C of die 202 and extend between the first peripheral wall 202A and second peripheral wall 202B. Sets of IO connections 210 may include a fourth set of IO connections 230C where the fourth set of IO connections 230C are positioned along the top surface 202C of die 202 and proximate to the at least one peripheral wall 202A of the die 202. Sets of IO connections 210 may include a fifth set of IO connections 230D where the fifth set of IO connections 230D are positioned along the top surface 202C of die 202 and proximate to the at least another peripheral wall 202B of the die 202. Sets of IO connections 210 may include a thermal connection 230E where the thermal connection 230E is positioned along the top surface 202C of die 202 and positioned away from the at least one peripheral wall 202A and at least another peripheral wall 202B of the die 202.

It should be understood that the second set of IO connections 230A, third set of IO connections 230B, fourth set of IO connections 230C, fifth set of IO connections 230D, and thermal connection 230E may be used to transmit various mixed signals that are different than the first set of IO connections 220 described above. As previously described, the first bond pad 222 of each IO connection of the first set of IO connections 220 is configured to continuously surround and encapsulate the second bond pad 224 of each IO connection of the first set of IO connections 220 to provide electromagnetic or RF interference protection from mixed electrical signals transmitted through the second set of IO connections 230A, third set of IO connections 230B, fourth set of IO connections 230C, fifth set of IO connections 230D, and thermal connection 230E. With such provide electromagnetic or RF interference protection, the first set of IO connections 220 may be placed in between and/or around the second set of IO connections 230A, third set of IO connections 230B, fourth set of IO connections 230C, fifth set of IO connections 230D, and thermal connection 230E without issues of signal interference. As such, designers of dies 202 may have freedom to provide an IO connection of the first set of IO connections 220 at any suitable positioned dictated by the implementation of the die 202 in a semiconductor package described and illustrated herein.

It should also be understood that the second set of IO connections 230A, third set of IO connections 230B, fourth set of IO connections 230C, fifth set of IO connections 230D, and thermal connection 230E may define any suitable sizes, shapes, and configurations to provide the least amount of mechanical stress while in service either within the interconnect itself or at die 202. It should also be understood that the second set of IO connections 230A, third set of IO connections 230B, fourth set of IO connections 230C, fifth set of IO connections 230D, and thermal connection 230E may be positioned at any suitable location along the die 202 to provide the least amount of mechanical stress while in service either within the interconnect itself or at die 202.

Die 202 may also include at least one electromagnetic interference (EMI) fence 240 for providing electromagnetic or RF interference protection to various sets of IO connections provided in the sets of IO connection 210. As best seen in FIG. 9, the at least one EMI fence 240 may be provided on the top surface 202C of the die 202 where EMI fence 240 is positioned between two adjacent sets of IO connections 210 to provide electromagnetic or RF interference protection between the two adjacent sets of IO connections 210. Still referring to FIG. 9, the at least one EMI fence 240 may also be provided with at least one IO connection of the first set of IO connections 220 where the at least one EMI fence 240 and the at least one IO connection of the first set of IO connections 220 are continuous with one another. Such features and characteristics of the EMI fence 240 are described in more detail below.

The at least one EMI fence 240 may include a first end 242A that operably engages with at least one IO connection of the first set of IO connections 220 and a second end 242B opposite to the first end 242A and remote from the at least one IO connection of the first set of IO connections 220. In one instance, the first end 242A of the at least one EMI fence 240 may be operably engaged with at least one first bond pad 222 of at least one IO connection of the first set of IO connections 330 where the at least one EMI fence 240 and the at least one first bond pad 222 of the at least one IO connection of the first set of IO connections 220 are continuous with one another. In another instance, the first end 242A of the at least one EMI fence 240 may be operably engaged with at least two first bond pads 222 of at least two IO connections of the first set of IO connections 220 where the at least one EMI fence 240 and the at least two first bond pads 222 of the at least two IO connections of the first set of IO connections 220 are continuous with one another.

The at least one EMI fence 240 may also define at least one curve 242C. As best seen in FIG. 9, the at least one EMI fence 240 may define at least one curve 242C that extends between the first end 242A and the second end 242B. In other exemplary embodiments, any suitable numbers of curves 242C may be defined in a single EMI fence 240 dictated by the arrangement of the sets of IO connections 210 provided on die 202. In one instance, at least two curves 242C may be defined in a single EMI fence 240. In this particular instance, a first curve 242C1 extends from the first end 242A towards a medial point of the EMI fence 240, and a second curve 242C1 extends from the second end 242B towards the medial point of the EMI fence 240. In another instance, a single EMI fence 240 may omit and/or fail to define a curve 242C extending between the first end 242A and the second end 242B.

It should be understood that the at least one EMI fence 240 described and illustrated herein is a solid, continuous member provided on the top surface 202C of die 202. With such configuration, the at least one EMI 240 is configured to provide electromagnetic or RF interference protection to various sets of IO connections provided in the sets of IO connection 210. In other exemplary embodiments, it may be possible to make the EMI fence 240 from a plurality of distinct and separate segments that collective define the at least one curve 242C.

It should also be understood that the at least one EMI fence 240 may have any suitable wall thickness that extends between the first end 240A to the second end 240B. In one instance, an EMI fence described and illustrated herein may have a continuous, uniform wall thickness that extends from a first end of the EMI fence to a second end of the EMI fence. In another instance, an EMI fence described and illustrated herein may have varying and/or nonuniform wall thicknesses that extend from a first end of the EMI fence to a second end of the EMI fence where at least one portion of the EMI fence defines at least one wall thickness and at least another portion of the EMI fence defines at least another wall thickness different than the at least one wall thickness. Such use of uniform and/or nonuniform wall thicknesses may be based on various considerations, including bonding strength that may be used to enhance greater surface area contact at the die surface, CTE compliance features (especially at the die perimeter) to improve mechanical integrity, or electrical confinement having gradients within the material of an EMI fence or physical features such as perforations may be a compromise for CTE compliance.

In the illustrated embodiment, three EMI fence 240 are provided on the die 202 to provide electromagnetic interference protection between specific sets of IO connections 210. As best seen in FIG. 9, a first EMI fence 240A is operably engaged with the first IO connection 220A of the first set of IO connections 220 and a third IO connection 220C of the first set of IO connections 220. More particularly, a first end 242A of the first EMI fence 240A is operably engaged with first bond pad 222 of the first IO connection 220A and first bond pad 222 of the third IO connection 220C. First EMI fence 240A may also define two curves 242C1, 242C2 where the first curve 242C1 extends from the first end 242A towards a medial point of the first EMI fence 240A, and the second curve 242C1 extends from the second end 242B towards the medial point of the first EMI fence 240A. Such use of the two curves 242C1, 242C2 is defined by the layout and/or arrangement of the third set of IO connection 230B and the fourth set of IO connections 230C where the first EMI fence 240A electromagnetically separates the third set of IO connection 230B and the fourth set of IO connections 230C from one another.

Similarly, as best seen in FIG. 9, a second EMI fence 240B is operably engaged with a fourth IO connection 220D of the first set of IO connections 220. More particularly, a first end 242A of the second EMI fence 240B is operably engaged with first bond pad 222 of the fourth IO connection 220D. Second EMI fence 240B may also define a single curve 242C where the curve 242C extends from the first end 242A towards a medial point of the second EMI fence 240B. Such use of the curve 242C is defined by the layout and/or arrangement of the fifth set of IO connection 230D and the thermal connection 230E where the second EMI fence 240B electromagnetically separates the fifth set of IO connection 230D and the thermal connection 230E from one another.

Similarly, as best seen in FIG. 9, a third EMI fence 240C is operably engaged with a fifth IO connection 220E of the first set of IO connections 220. More particularly, a first end 242A of the third EMI fence 240C is operably engaged with first bond pad 222 of the fifth IO connection 220E. Third EMI fence 240C may also define a single curve 242C where the curve 242C extends from the first end 242A towards a medial point of the third EMI fence 240C. Such use of the curve 242C is defined by the layout and/or arrangement of the third set of IO connection 230B and the fifth set of IO connection 230D where the third EMI fence 240C electromagnetically separates the third set of IO connection 230B and the fifth set of IO connection 230D from one another.

Die 202 may also include die passivation 250. As best seen in FIG. 10, the die passivation 250 is applied along the top surface 202C of the die 202 in between the sets of IO connections 210. Such use of die passivation 250 prevents corrosion and/or damage to the top surface 202C of the die 202 when the die 202 is provided on a temporary carrier, an electrical structure, and/or interconnect during manufacturing operations.

While not illustrated herein, gradual transitions may be provided at the top surface 202C of die 202 rather than having a step and/or abrupt transition as seen in FIG. 10. Such gradual transition between die 202 and electrical device 204 may prevent unwanted mechanical stress on the die 202 and the electrical device 204 when assembled with one another and used in the field.

It should be appreciated that the curvilinear features described and illustrated herein may be omitted for certain electrical circumstances. In one instance, a purely digital die (e.g., die 202) may not a require a coaxial pattered I/O pad configuration (e.g., first set of I/O connections 220).

It should also be appreciated that the I/O features of semiconductor package 200 may lend to creations of interconnects where topology is optimized for mass reduction, CTE compliance, electrical properties (such as shielding), reducing the effects of electromigration, and other optimization characteristics.

Figure 11:
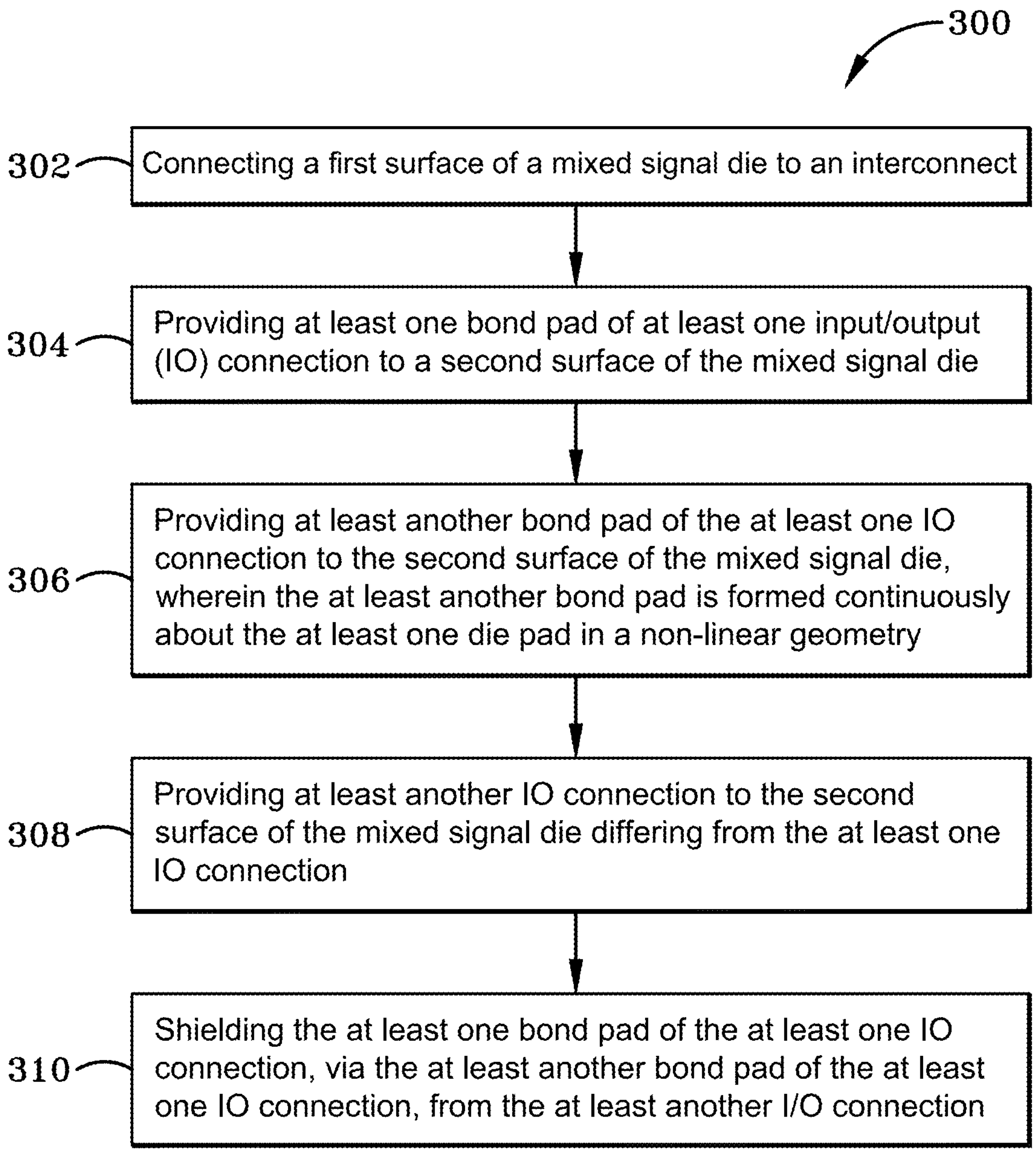
FIG. 11 is another exemplary method flowchart.

FIG. 11 illustrates method 300. An initial step 302 of method 300 may include connecting a first surface of a mixed signal die to an interconnect. Another step 304 of method 300 may include providing at least one bond pad of at least one input/output (IO) connection on the mixed signal die. Another step 306 of method 300 may include providing at least another bond pad of the at least one IO connection on the mixed signal die, wherein the at least another bond pad is formed continuously about the at least one die pad in a non-linear geometry. Another step 308 of method 300 may include providing at least another IO connection on the mixed signal die differing from the at least one IO connection. Another step 310 of method 300 may include shielding the at least one bond pad of the at least one IO connection, via the at least another bond pad of the at least one IO connection, from the at least another I/O connection.

In other exemplary embodiments, method 300 may include additional and/or optional steps. Method 300 may further include that the at least one IO connection is a radio frequency (RF) connection. Optional steps may further include engaging an inner conductor of a coaxial cable with the at least one bond pad of the at least one IO connection; and engaging an outer conductor of the coaxial cable with the at least one another pad of the at least one IO connection; wherein the coaxial cable is directly connected to the mixed signal die. An optional step may further include providing the at least one bond pad of the at least one IO connection and the at least another bond pad of the at least IO connection proximate to at least one of a first peripheral edge of the mixed signal die, a second peripheral edge of the mixed signal die, a third peripheral edge of the mixed signal die, and a fourth peripheral edge of the mixed signal die or remote from the first peripheral edge of the mixed signal die, the second peripheral edge of the mixed signal die, the third peripheral edge of the mixed signal die, and the fourth peripheral edge of the mixed signal die. Another optional step may further include providing at least one electromagnetic interference (EMI) fence formed to a second surface of the mixed signal die and formed with the at least one IO connection; wherein the at least one EMI fence is configured to electromagnetically shield the first bond pad of the at least one IO connection. Optional steps may further include providing at least one bond pad of a third input/output IO connection to the second surface of the mixed signal die; providing at least another bond pad of the third IO connection to the second surface of the mixed signal die, wherein the at least another bond pad of the third IO connection is formed continuously about the at least one die pad in a non-linear geometry; providing a fourth IO connection to the second surface of the mixed signal die differing from the at least one IO connection; and shielding the at least one bond pad of the third IO connection, via the at least another bond pad of the third IO connection, from the fourth I/O connection. Optional steps may further include engaging an inner conductor of a second coaxial cable with the at least one bond pad of the third IO connection; and engaging an outer conductor of the second coaxial cable with the at least one another pad of the third IO connection; wherein the second coaxial cable is directly connected to the mixed signal die. Another optional step may further include providing at least another EMI fence formed to the second surface of the mixed signal die and formed with the third IO connection; wherein the at least another EMI fence is configured to electromagnetically shield the at least one bond pad of the third IO connection. Another optional step may further include interconnecting the mixed signal die with a second mixed signal die via the coaxial cable.

Figure 12:
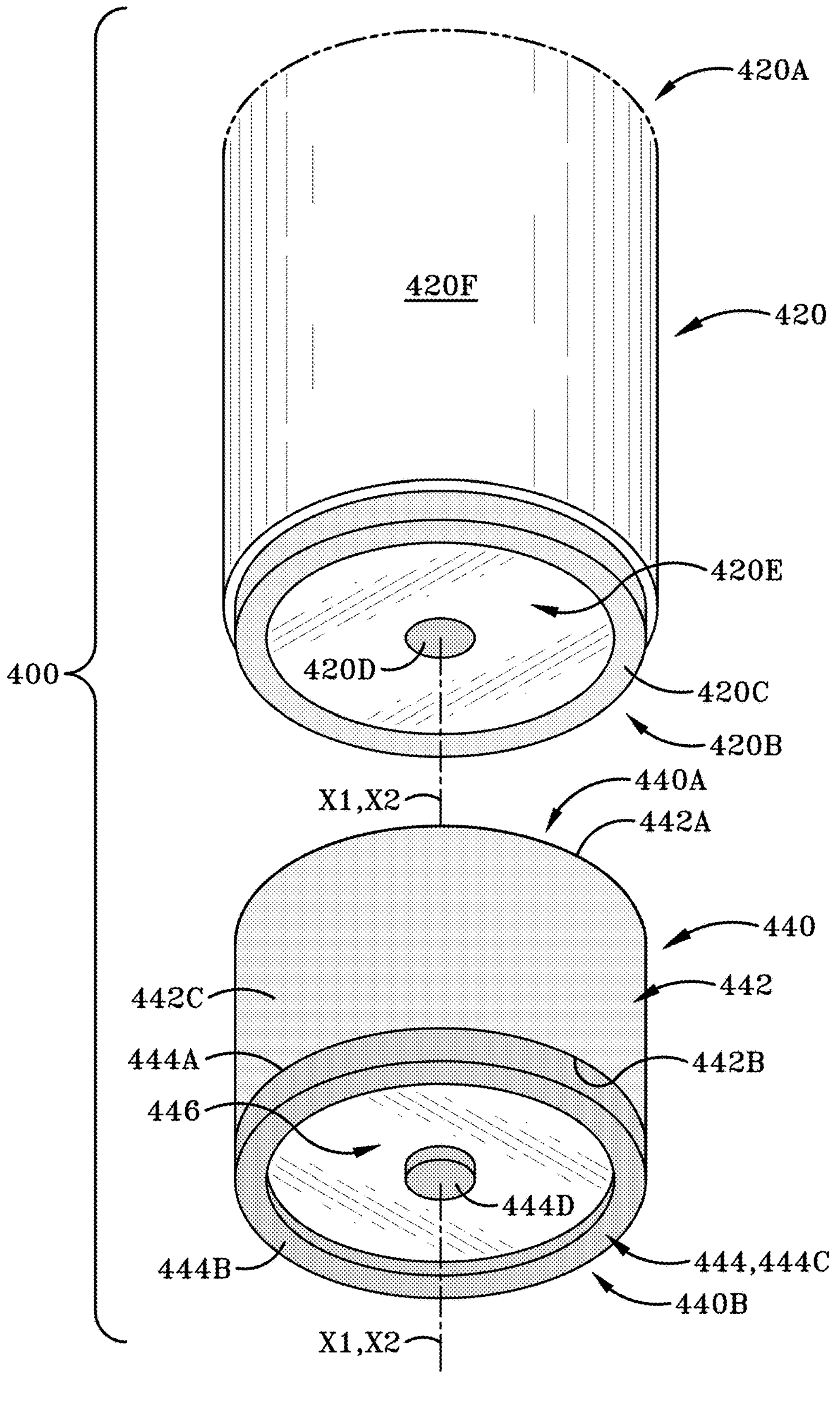
FIG. 12 is a bottom, front, side isometric perspective view of a coaxial pad probe in accordance with one aspect of the present disclosure, wherein a probe and a preexisting coaxial cable of the coaxial pad probe are exploded away from one another.
Figure 13A:
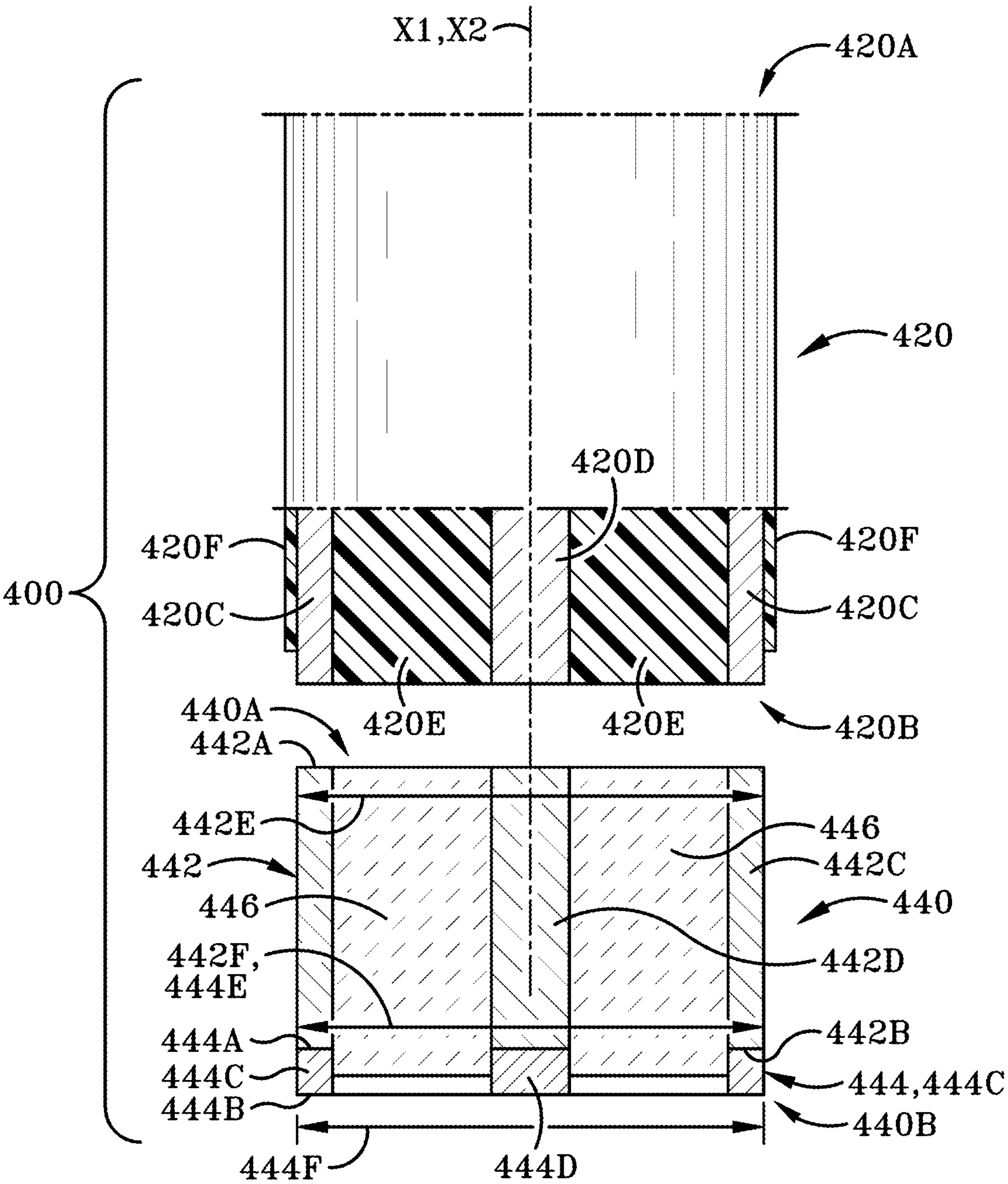
FIG. 13A is a partial sectional view of the coaxial pad probe shown in FIG. 12, wherein the probe and the preexisting coaxial cable are exploded away from one another.
Figure 13B:
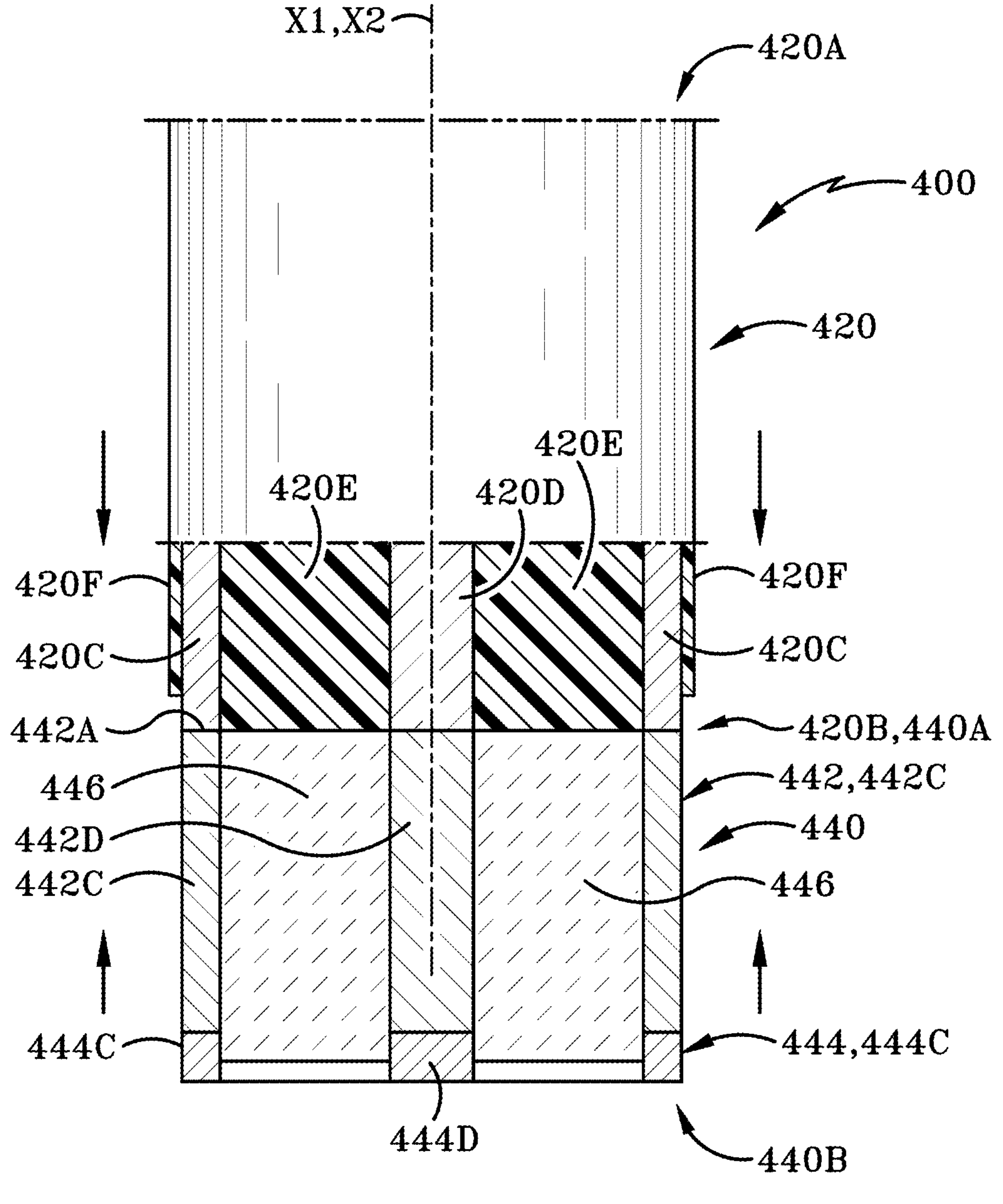
FIG. 13B is another partial sectional view similar to FIG. 13A, but the probe is provided with the preexisting coaxial cable.
Figure 13C:
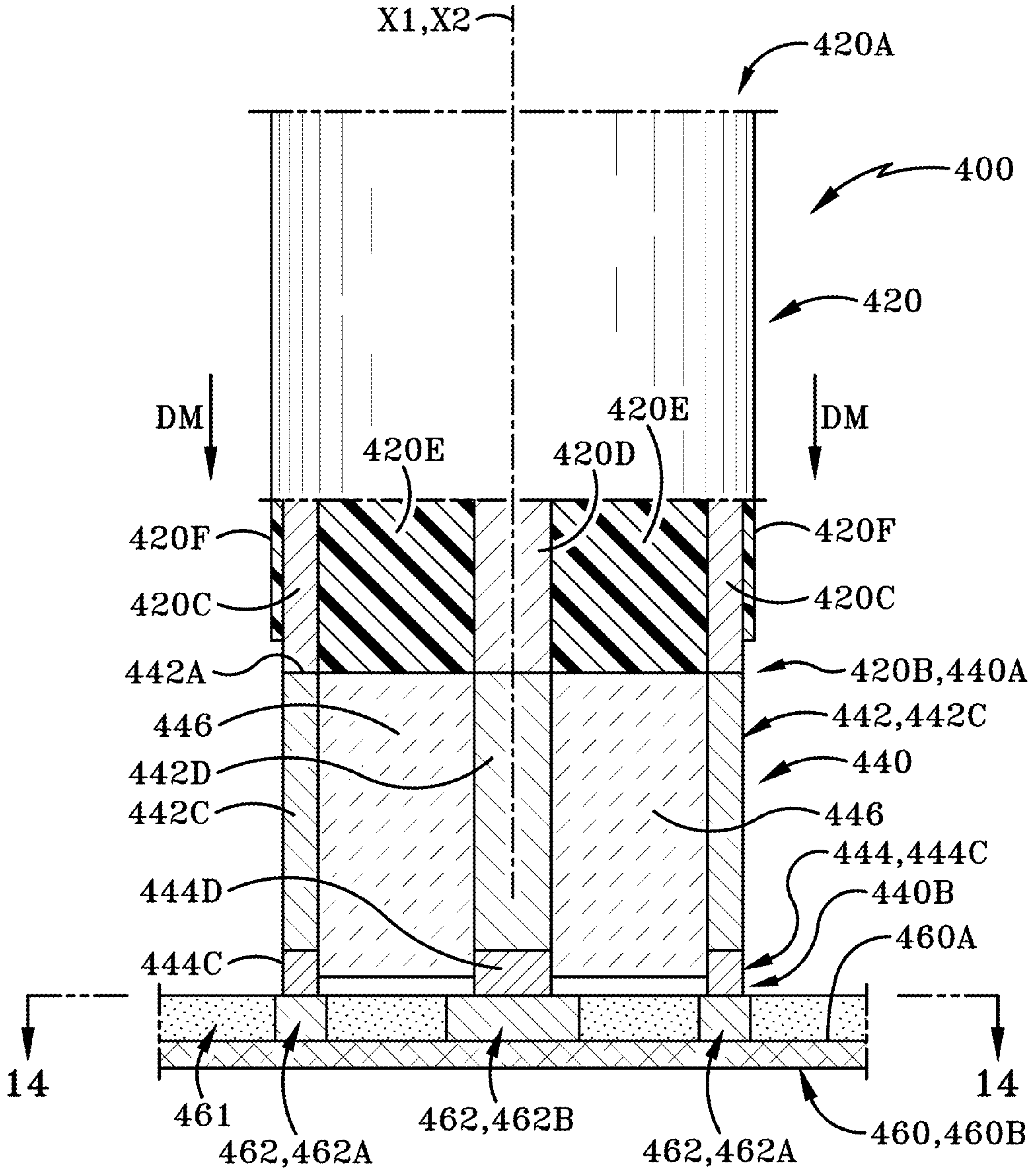
FIG. 13C is another partial sectional view similar to FIG. 13B, but the probe directly contacts a coaxial IO pad of a semiconductor die.
Figure 14:
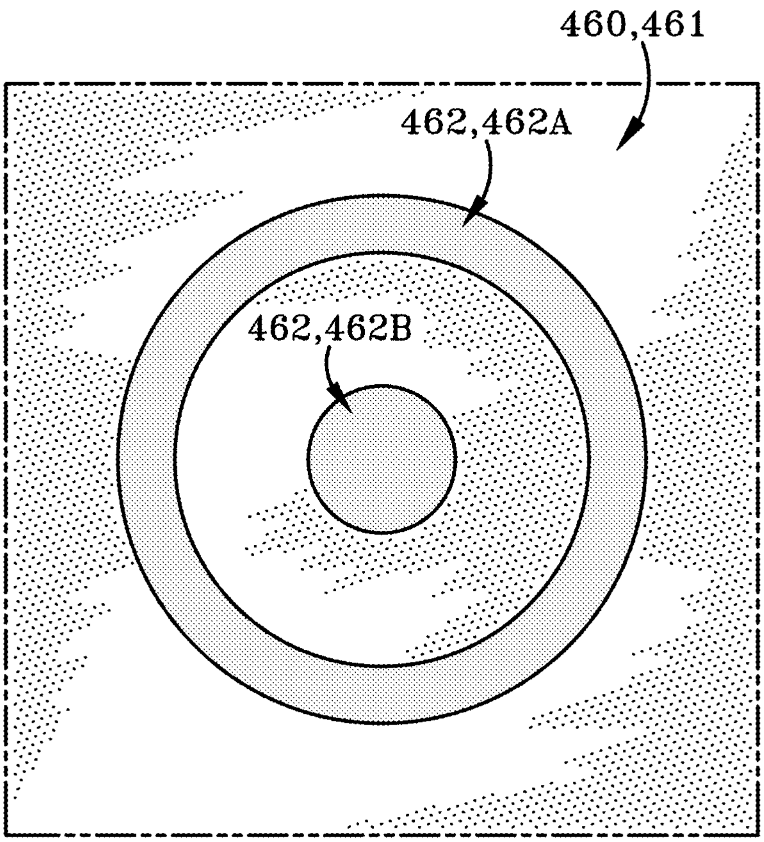
FIG. 14 is a top plan view of the coaxial IO pad of the semiconductor die taken in the direction of line 14-14 shown in FIG. 13C.

FIGS. 12-14 illustrates a coaxial pad probe 400 based on one aspect of the present disclosure. As described in more detail below, coaxial pad probe 400 is configured to measure a scatter parameter (S-parameter) measurement on a die having coaxial IO pads (similar to first set of IO pads 220 described above). Such component and elements that make up of the coaxial pad probe 400 are described in more detail below. For example, the coaxial pad probe 400 may be used to measure an S-parameter measurement on one of the dies 12A, 12B, 42A, 42B, 42C, 202 described herein and/or one of the dies described in more detail below. However, coaxial pad probe 400 can be used in association with other dies as well.

Coaxial pad probe 400 may include a preexisting or commercially available rigid coaxial cable 420. As best seen in FIG. 13A, preexisting coaxial cable 420 may include a first end 420A, a second end 420B opposite to the first end 420A, and a lengthwise axis X1 defined therebetween.

Preexisting coaxial cable 420 may also include an outer conductor 420C that extends longitudinally parallel with the lengthwise axis X1 and between the first end 420A and the second end 420B. Preexisting coaxial cable 420 may also include an inner conductor 420D that extends longitudinally parallel with the lengthwise axis X1 and between the first end 420A and the second end 420B; inner conductor 420D is also positioned interior to the outer conductor 420C (as best seen in FIGS. 13A-13C).

Preexisting coaxial cable 420 may also include a dielectric component 420E that extends longitudinally between the first end 420A and the second end 420B. The dielectric component 420E may operably engage with the outer conductor 420C and the inner conductor 420D to suspend the inner conductor 420D inside of the outer conductor 420C. It should be understood that any commercially available dielectric component 420E may be used to operably engaging with the inner conductor 420D with the outer conductor 420C and to suspend the inner conductor 420D inside of the outer conductor 420C.

Preexisting coaxial cable 420 may also include a circumferential cover 420F that extends longitudinally between the first end 420A and the second end 420B. The circumferential cover 420F is configured to cover the outer conductor 420C, the inner conductor 420D, and the dielectric component 420E from the exterior environment surrounding the preexisting coaxial cable 420.

Coaxial pad probe 400 may also include a probe 440 that operably engages with the preexisting coaxial cable 420. The probe 440 includes a first end 440A that operably engages with the second end 420B of the preexisting coaxial cable 420, a second end 440B opposite to the first end 440A and configured to operably engage with a coaxial IO connection provided on a die, and a lengthwise axis X2 defined therebetween that is coaxial with the lengthwise axis X1 of preexisting coaxial cable 420. Such components and elements that make up the probe 440 are described in greater detail below.

The probe 440 includes a support structure 442 that operably engages with the preexisting coaxial cable 420. More particularly, the support structure 442 operably engages with the second end 420B of the preexisting coaxial cable 420. The support structure 442 includes a first end 442A that operably engages with the second end 420B of the preexisting coaxial cable 420, and a second end 442B that is opposite to the first end 442A and remote from the second end 420B of the preexisting coaxial cable 420.

The support structure 442 also includes a first outer connection 442C that extends between the first end 442A and the second end 442B along an axis parallel with the lengthwise axis X2. As best seen in FIGS. 13A-13B, the first outer connection 442C operably engages with the outer conductor 420C of the preexisting coaxial cable 420 to enable electrical signals (particularly RF signals) to travel between the preexisting coaxial cable 420 and the support structure 442.

The support structure 442 also includes a first inner connection 442D that extends between the first end 442A and the second end 442B along an axis that is parallel with the lengthwise axis X2. As best seen in FIGS. 13A-13B, the first inner connection 442D operably engages with the inner conductor 420D of the preexisting coaxial cable 420 to enable electrical signals (particularly RF signals) to travel between the preexisting coaxial cable 420 and the support structure 442. The first inner connection 442D is also positioned interior to the first outer connection 442C where the first inner connection 442D is suspended inside of the first outer connection 442C and free from engaging with the first outer connection 442C.

The support structure 442 also defines a first diameter 442E at the first end 442A and a second diameter 442F at the second end 442B. In one instance, and as best seen in FIGS. 13A-13C, the first diameter 442E and the second diameter 442F are equal with one another such that the support structure 442 defines a continuous diameter along the entire length of the support structure 442.

The probe 440 includes a probe tip 444 that operably engages with the support structure 442 and configured to operably engage with a coaxial IO connection provided on a die. More particularly, the probe tip 444 operably engages with the second end 442B of the support structure 442 and is positioned remote from the second end 420B of the preexisting coaxial cable 420. The probe tip 444 includes a first end 444A that operably engages with the first end 442A of the support structure 442, and a second end 444B that is opposite to the first end 444A and remote from the first end 420A of the preexisting coaxial cable 420.

The probe tip 444 also includes a second outer connection 444C that extends between the first end 444A and the second end 444B along an axis that is parallel with the lengthwise axis X2. As best seen in FIGS. 13A-13B, the second outer connection 444C operably engages with the first outer connection 442C of the support structure 442 to enable electrical signals (particularly RF signals) to travel between the support structure 442 and the probe tip 444. Additionally, the second outer connection 444C operably engages with the outer conductor 420C, via the first outer connection 442C of the support structure 442, to enable electrical signals (particularly RF signals) to travel between the preexisting coaxial cable 420 and the probe tip 444 via the support structure 442.

The probe tip 444 also includes a second inner connection 444D that extends between the first end 444A and the second end 444B along an axis that is parallel with the lengthwise axis X2. As best seen in FIGS. 13A-13B, the second inner connection 444D operably engages with the first inner connection 442D of the support structure 442 to enable electrical signals (particularly RF signals) to travel between the support structure 442 and the probe tip 444. Additionally, the second inner connection 444D operably engages with the inner conductor 420D, via the first inner connection 442D of the support structure 442, to enable electrical signals (particularly RF signals) to travel between the preexisting coaxial cable 420 and the probe tip 444 via the support structure 442. The second inner connection 444D is also positioned interior to the second outer connection 444C where the second inner connection 444D is suspended inside of the second outer connection 444C and free from engaging with the second outer connection 444C.

The probe tip 444 also defines a first diameter 444E at the first end 444A and a second diameter 444F at the second end 4424B. In one instance, and as best seen in FIGS. 13A-13C, the first diameter 444E and the second diameter 444F are equal with one another such that the probe tip 444 defines a continuous diameter along the entire length of the probe tip. In this instance, the first diameter 444E and the second diameter 444F are equal with first diameter 442E and the second diameter 442F shown in FIGS. 13A-13C. In this same instance, the first diameter 444E and the second diameter 444F are equal with second diameter 442F shown in FIG. 13D.

Probe 440 may also include a dielectric component 446 that operably engages with the support structure 442 and the probe tip 444. As best seen in FIGS. 13A-13C, the dielectric component 446 may operably engage with the first outer connection 442C and the first inner connection 442D to assist in suspending the first inner connection 442D inside of the first outer connection 442C with the first inner connection 442D free from engaging with the first outer connection 442C. Still referring to FIGS. 13A-13C, the dielectric component 446 may also operably engage with the second outer connection 444C and the second inner connection 444D to assist in suspending the second inner connection 444D inside of the second outer connection 444C with the second inner connection 444D free from engaging with the second outer connection 444C.

While the dielectric component 446 is shown as a single member operably engaged with the support structure 442 and the probe tip 444, the dielectric component 446 may be split into at least two portions. In one instance, a first portion of the dielectric component 446 may operably engage with the first outer connection 442C and the first inner connection 442D only to assist in suspending the first inner connection 442D inside of the first outer connection 442C with the first inner connection 442D free from engaging with the first outer connection 442C. In another instance, a second, separate portion of the dielectric component 446 may operably engage with the second outer connection 444C and the second inner connection 444D only to assist in suspending the second inner connection 444D inside of the second outer connection 444C with the second inner connection 444D free from or without engaging with the second outer connection 444C. Furthermore, dielectric component 446 of probe 440 may be different than the dielectric component 420E of coaxial cable 420E depending on various considerations, including the dielectric constant of the material used in dielectric components 420E, 446 and a desired impedance. Additionally, dielectric component 446 may be made from any suitable material commonly used in the art or may simply be air.

It should be understood that the probe 440 may be manufactured and provided with the preexisting coaxial cable 420 in various ways with uses of additive manufacturing techniques and methods commercially available at this time and techniques and methods not commercially available at this time. In one instance, the support structure 442 may be initially manufactured along with the probe tip 444 being manufactured subsequent to the support structure 442 (see FIG. 13A). Continuing with this instance, the combination of the support structure 442 and the probe tip 444 (i.e., probe 440) may then be provided with the preexisting coaxial cable 420 at the second end 420B of the preexisting coaxial cable 420 (see FIG. 13B). In another instance, the support structure 442 may be initially manufactured and provided with the preexisting coaxial cable 420 at the second end 420B of the preexisting coaxial cable 420. Continuing with this instance, the probe tip 444 may then be manufactured and provided on the second end 442B of the support structure 442 with the support structure 442 currently provided on the preexisting coaxial cable 420.

It should be appreciated that a portion of probe tip 444 may be formed of harder material than the support structure 442. In one instance, the second end 444B of probe tip 444 that contacts at least one die pad may be formed of a harder material than the material of the support structure 442. The material at the second end 444B of probe tip 444 is also resilient and includes material of different mechanical and electrical properties than the support structure 442 for contacting at least one die pad and transferring electrical energy from the die pad to an analyzing device (not illustrated) connected with the probe 400.

It should also be understood that any portion of the probe 440 may be removed from coaxial cable 420 if probe tip 444 or the probe 400 is worn and/or deteriorate such that the probe 440 is unable to fully contact a bond pad on a die. In one instance, the probe tip 444 may be cut and severed from the second end 442B of support structure 442 so that a new probe tip 444 may be formed and/or provided on the second end 442B of support structure 442. In another instance, the entire probe 440 may be cut and severed from the second end 420B of the coaxial cable 420 so that a new probe 440 may be formed and/or provided on the second end 420B of the coaxial cable 420.

It should be appreciated that pad probe 400 may be generally used for measuring mixed-signal die (e.g., ADC/DACs) in metal oxide semiconductor forms. It should also be appreciated that pad probe 400 may also be used in other dies, include radiofrequency CMOS die and MMICs die.

Having now described the components and elements of the coaxial pad probe 400, a method of measuring an S-parameter measurement on a die having coaxial io pads via the coaxial pad probe 400 is described in more detail below.

Initially, a user of coaxial pad probe 400 may introduce the coaxial pad probe 400 to a mixed die 460 (or any other types of dies, such as those other dies described herein) having die passivation material 461 and a coaxial IO pad 462. In one instance, the coaxial IO pad 462 may be substantially similar to one of the IO connection of the first set of IO connections 220 discussed above. In this same instance, coaxial IO pad 462 also includes a first or outer bond pad 462A and a second or inner bond pad 462B that are substantially similar to first bond pad 222 and the second bond pad 224 of an IO connection of the first set of IO connections 220.

Once the coaxial pad probe 400 is directly over the coaxial IO pad 462, the user may then move the coaxial pad probe 400 downwardly onto the coaxial IO pad 462 until the probe tip 444 is directly contacting the coaxial IO pad 462. Such downward movement of the coaxial pad probe 400 towards the coaxial IO pad 462 is denoted by arrows labeled "DM" in FIG. 13C. As best seen in FIG. 13C, the second outer connection 444C directly contacts the outer bond pad 462A of the coaxial IO pad 462, and the second inner connection 444D directly contacts the inner bond pad 462B of the coaxial IO pad 462. It should be noted that the material of the probe tip 444 may be constructed to compress when force is applied downwardly on the probe tip 444 and against the coaxial IO pad 462. Once the probe tip 444 is directly contacting the coaxial IO pad 462, the user of the coaxial pad probe 400 may then begin measuring an S-parameter measurement of the die 460 by use of the coaxial IO pad 462 in combination with a commercially available analyzing device (not illustrated herein). It should be understood that the coaxial pad probe 400 electrically connected with a commercially available analyzing device may measure any S-parameter as desired by the user. Once the S-parameter measurement has been measured, the user may then remove the coaxial pad probe 400 from the die 460 until the probe tip 444 is free from or without contacting the coaxial IO pad 462.

The method of measuring an S-parameter measurement may be repeated with the coaxial pad probe 400 for any suitable number of times where the die 460 includes more than one coaxial IO pad 462.

Figure 15:
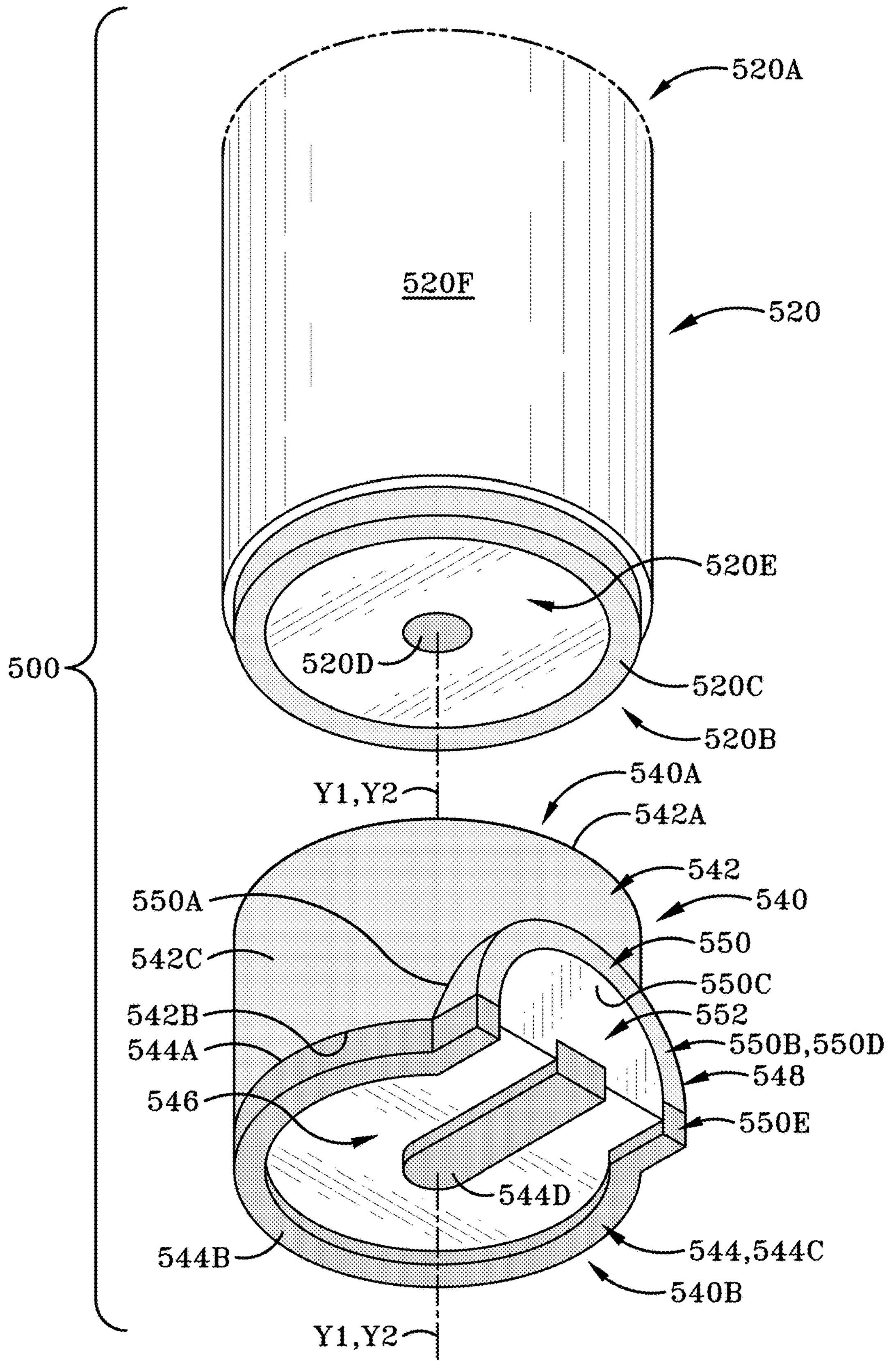
FIG. 15 is a bottom, front, side isometric perspective view of a coaxial pad probe in accordance with another aspect of the present disclosure, wherein a probe and a preexisting coaxial cable of the coaxial pad probe are exploded away from one another.
Figure 16:
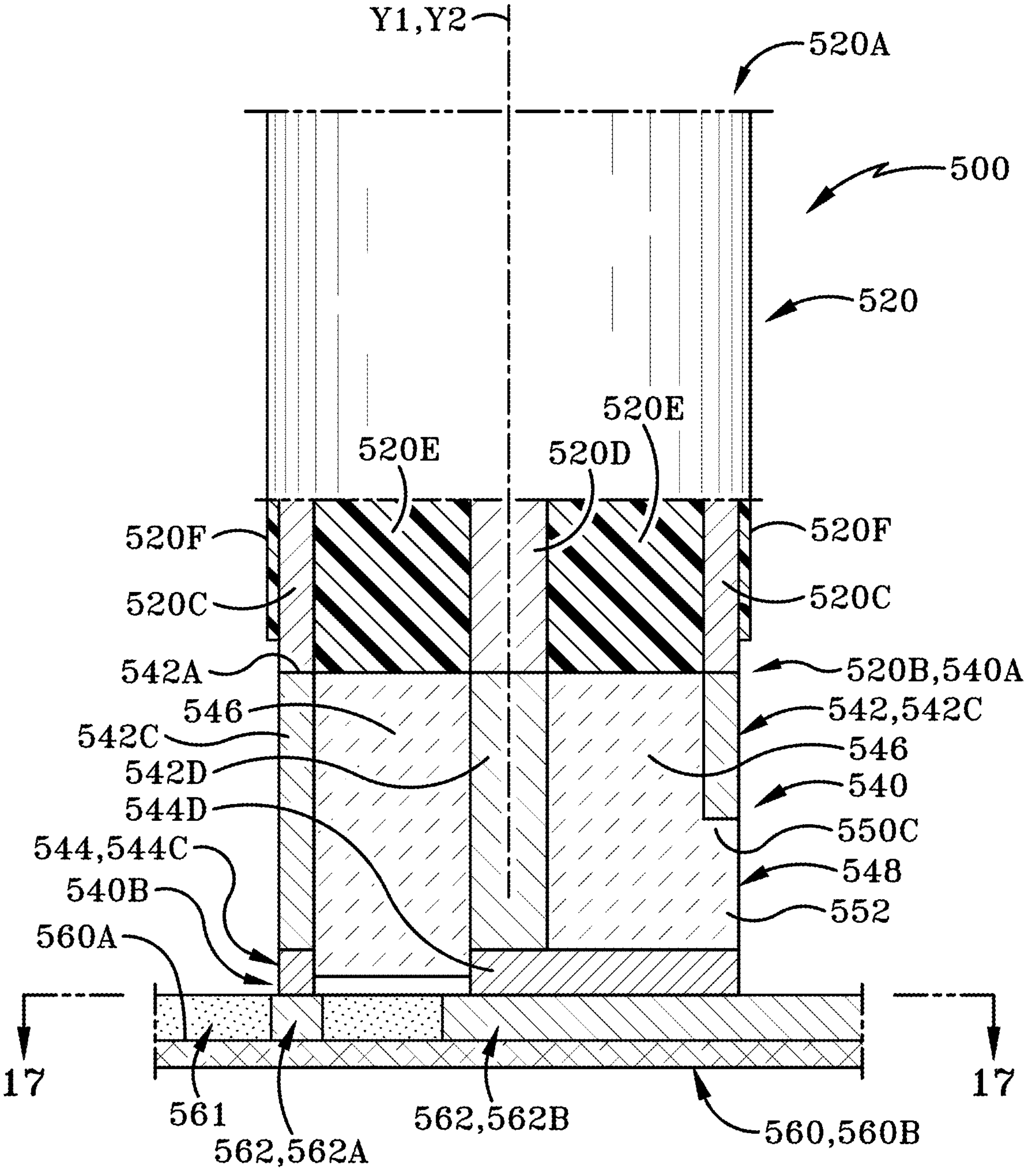
FIG. 16 is a partial sectional view of coaxial pad probe shown in FIG. 15, but the probe directly contacts a coplanar IO pad of a semiconductor die.
Figure 17:
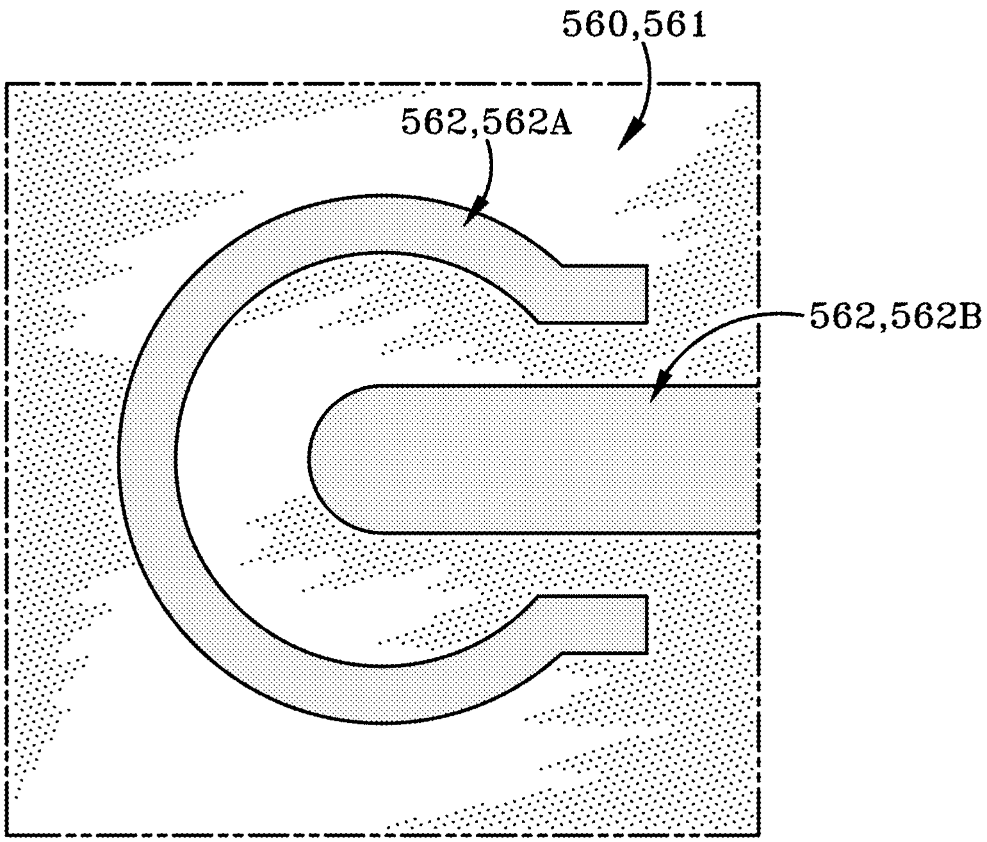
FIG. 17 is a top plan view of the coplanar IO pad of the semiconductor die taken in the direction of line 17-17 shown in FIG. 16.

FIGS. 15-17 illustrates another coaxial pad probe 500 based on another aspect of the present disclosure. Coaxial pad probe 500 is similar to coaxial pad probe 400 as described above and illustrated in FIGS. 12-14, except as detailed below. As described in more detail below, coaxial pad probe 500 is configured to measure an S-parameter measurement on a die having coplanar IO pads. Such component and elements that make up of the coaxial pad probe 500 are described in more detail below.

Coaxial pad probe 500 may include a preexisting coaxial cable 520 that is substantially similar to preexisting coaxial cable 420 of coaxial pad probe discussed above. As such, preexisting coaxial cable 520 includes a first end 520A, a second end 520B, a lengthwise axis Y1, an outer conductor 520C, an inner conductor 520D, a dielectric component 520E, and a circumferential cover 520F that are substantially similar to first end 420A, second end 420B, lengthwise axis X1, outer conductor 420C, inner conductor 420D, dielectric component 420E, and circumferential cover 420F of preexisting coaxial cable 420 of coaxial pad probe 400.

Coaxial pad probe 500 may also include a probe 540 that is substantially similar to probe 440 of coaxial pad probe 400. As such, probe 540 includes a first end 540A, a second end 540B, and a lengthwise axis Y2 that are substantially similar to first end 440A, second end 440B, and lengthwise axis X2 of the probe 440 of the coaxial pad probe 400.

Probe 540 of the coaxial pad probe 500 may also include a support structure 542 that is substantially to support structure 442 of probe 440 of coaxial pad probe 400 previously discussed. As such, support structure 542 includes a first end 542A, a second end 542B, a first outer connection 542C, a first inner connection 542D, a first diameter 542E, and a second diameter 542F that are substantially similar to first end 442A, second end 442B, first outer connection 442C, first inner connection 442D, first diameter 442E, and second diameter 442F of support structure 442. Probe 540 of the coaxial pad probe 500 may also include a probe tip 544 that is substantially to probe tip 444 of probe 440 of coaxial pad probe 400 previously discussed. As such, probe tip 544 includes a first end 544A, a second end 544B, a second outer connection 544C, a second inner connection 544D, a first diameter 544E, and a second diameter 544F that are substantially similar to first end 444A, second end 444B, second outer connection 444C, second inner connection 444D, first diameter 444E, and second diameter 444F of probe tip 444. Probe 540 of the coaxial pad probe 500 may also include a dielectric component 546 that is substantially to dielectric component 446 of probe 440 of coaxial pad probe 400 previously discussed.

In this embodiment, however, probe 540 may include a protruding structure 548 that extends outwardly from the support structure 542 and the probe tip 544. As described in more detail below, the protruding structure 548 is configured to enable the coaxial pad probe 500 to directly contact a coplanar 10 pad provided on a die and to prevent any part of the probe tip 544 from contacting a top or first surface of the die. Such components and elements of the protruding structure 548 are described in more detail below.

Protruding structure 548 includes an arch 550 that extends orthogonally from one or both of the support structure 542 and the probe tip 544. In the illustrated embodiment, the arch 550 extends orthogonally from both of the support structure 542 and the probe tip 544. The arch 550 includes a first side 550A that operably engages with the support structure 542 and the probe tip 544, and a second side 550B opposite to the first end 550A and remote from the support structure 542 and the probe tip 544. Arch 550 also defines passageway 550C that is defined between the first end 550A and the second end 550B where the passageway 550C is arcuate-shaped between the first end 550A and the second end 550B.

Arch 550 may also be split into at least two sections where each section may operably engage with the support structure 542 or the probe tip 544. As best seen in FIG. 15, arch 550 may include a first or upper portion 550D that operably engages with the support structure 542 and extends outwardly from the support structure 542. More particularly, upper portion 550D operably engages with the first outer connection 542C of the support structure 542 and extends outwardly from the first outer connection 542C of the support structure 542. Still referring to FIG. 15, arch 550 may also include a second or lower portion 550E that operably engages with the probe tip 544 and extends outwardly from the probe tip 544. More particularly, lower portion 550E operably engages with the second outer connection 544C of the probe tip 544 and extends outwardly from the second outer connection 544C of the probe tip 544.

Such configuration of the first portion 550D and the second portion 550E enables the arch 550 to be constructed when each of the support structure 542 and the probe tip 544 is being constructed. In one instance, the first portion 550D of the arch 550 may be constructed when the support structure 542 is being constructed. As such, the first portion 550D of the arch 550 and the support structure 542 may form a single, monolithic member when the first portion 550D of the arch 550 and the support structure 542 are constructed together, or the first portion 550D of the arch 550 and the support structure 542 may be formed separately and provided with one another at a later manufacturing stage. In another instance, the second portion 550E of the arch 550 may be constructed when the probe tip 544 is being constructed. As such, the second portion 550E of the arch 550 and the probe tip 544 may form a single, monolithic member when the second portion 550E of the arch 550 and the probe tip 544 are constructed together, or the second portion 550E of the arch 550 and the probe tip 544 may be formed separately and provided with one another at a later construction stage.

While the protruding structure 548 includes an arch 550, the protruding structure 548 may include a structural member with any suitable shape that enables the coaxial pad probe 500 to directly contact a coplanar 10 pad provided on a die and to prevent any part of the probe tip 544 from contacting a top surface of the die.

Protruding structure 548 may include a dielectric component 552 that operably engages with the arch 550 and is disposed inside of the passageway 550C. In the illustrated embodiment, dielectric component 552 is a part of the dielectric component 546 operably engaged with the support structure 542 and the probe tip 544. In one exemplary embodiment, an additively manufactured swept right angle transition may be provided from the first outer connection 542C of support structure 542 and second outer connection 544C of probe tip 544 and from the first inner connection 542D of support structure 542 and second inner connection 544 of probe tip 544D.

With this configuration of arch 550, the second inner connection 544D of probe tip 544 is also disposed inside of the second portion 550E of the arch 550. Such configuration of second inner connection 544D enables the coaxial pad probe 500 to directly contact an inner bond pad of a coplanar IO pad, which is described in more detail below. Additionally, second inner connection 544D is suspended inside of the arch 550 via the dielectric component 546 and/or dielectric component 548 where the second inner connection 544D is free from engaging with the arch 550.

It should be understood that dielectric component 552 of protruding structure 546 and dielectric component 546 of probe 540 may be different than the dielectric component 420E of coaxial cable 420E depending on various considerations, including the dielectric constant of the material used in dielectric components 420E, 446, 452 and a desired impedance. Additionally, dielectric components 546, 552 may be also made from any suitable material commonly used in the art or may simply be air. If dialectic components 546, 552 are simply air, the second inner connection 544D may include a rigid dielectric that is located along any point of second inner connection 544D (e.g, proximate to the second end 550B of arch 550).

It should be understood that the probe 540 may be manufactured and provided with the preexisting coaxial cable 520 in various ways with uses of additive manufacturing techniques and methods commercially available at this time and techniques and methods not commercially available at this time. In one instance, the support structure 542 and first portion 550D of arch 550 may be initially manufactured along with the probe tip 544 and the second portion 550E of arch 550 being manufactured subsequent to the support structure 542. Continuing with this instance, the combination of the support structure 542, the probe tip 544, and the protruding structure 548 (i.e., probe 540) may then be provided with the preexisting coaxial cable 520 at the first end 520A of the preexisting coaxial cable 420 (see FIG. 16). In another instance, the support structure 542 and first portion 550D of arch 550 may be initially manufactured and provided with the preexisting coaxial cable 520 at the first end 520A of the preexisting coaxial cable 520. Continuing with this instance, the probe tip 544 and second portion 550E of arch 550 may then be manufactured and provided on the support structure 542 with the support structure 542 currently provided on the preexisting coaxial cable 520.

It should also be understood that any portion of the probe 540 may be removed from coaxial cable 520 if probe tip 544, the protruding structure 548, or the entire probe 400 is worn and/or deteriorate such that the probe 440 is unable to fully contact a bond pad on a die. In one instance, the probe tip 544 may be cut and severed from the second end 542B of support structure 542 so that a new probe tip 544 may be formed and/or provided on the second end 542B of support structure 542. Continuing with this instance, protruding structure 548 may also be cut and removed with probe tip 544 so that a new protruding structure 548 may be provided with the probe tip 544. In another instance, protruding structure 548 may be cut and severed from support structure 542 and probe top 544 so that a new protruding structure 548 may be formed and/or provided with support structure 542 and probe top 544. In another instance, the entire probe 440 may be cut and severed from the second end 420B of the coaxial cable 420 so that a new probe 440 may be formed and/or provided on the second end 420B of the coaxial cable 420.

It should be appreciated that pad probe 500 may be generally used for measuring mixed-signal die (e.g., ADC/DACs) in metal oxide semiconductor forms. It should also be appreciated that pad probe 500 may also be used in other dies, include radiofrequency CMOS die and MMICs die.

Having now described the components and elements of the coaxial pad probe 500, a method of measuring an S-parameter measurement on a die having coaxial IO pads via the coaxial pad probe 500 is described in more detail below.

Initially, a user of coaxial pad probe 500 may introduce the coaxial pad probe 500 to a mixed die 560 having die passivation material 561 and a coplanar IO pad 562. In this instance, coplanar IO pad 562 also includes a first or outer bond pad 562A and a second or inner bond pad 562B that is different than the outer and inner bond pads 462A, 462B of coaxial IO pad 462.

Once the coaxial pad probe 500 is directly over the coplanar IO pad 562, the user may then move the coaxial pad probe 500 downwardly onto the coplanar IO pad 562 until the probe tip 544 is directly contacting the coplanar IO pad 562. As best seen in FIG. 16, the second outer connection 544C and the arch 550, particularly the second portion 550D, directly contacts the outer bond pad 562A of the coplanar IO pad 562, and the second inner connection 544D directly contacts the inner bond pad 562B of the coplanar IO pad 562. It should be noted that the material of the probe tip 544 may be constructed to compress when force is applied downwardly on the probe tip 544 and against the coplanar IO pad 562. Once the probe tip 544 is directly contacting the coplanar IO pad 562, the user of the coaxial pad probe 500 may then begin measuring an S-parameter measurement of the die 560 by use of the coplanar IO pad 562 in combination with a commercially available analyzing device (not illustrated herein). It should be understood that the coaxial pad probe 500 electrically connected with a commercially available analyzing device may measure any S-parameter as desired by the user. Once the S-parameter measurement has been measured, the user may then remove the coaxial pad probe 500 from the die 560 until the probe tip 544 is free from or without contacting the coplanar IO pad 562.

The method of measuring an S-parameter measurement may be repeated with the coaxial pad probe 500 for any suitable number of times where the die 560 includes more than one coplanar IO pad 562.

Figure 18:
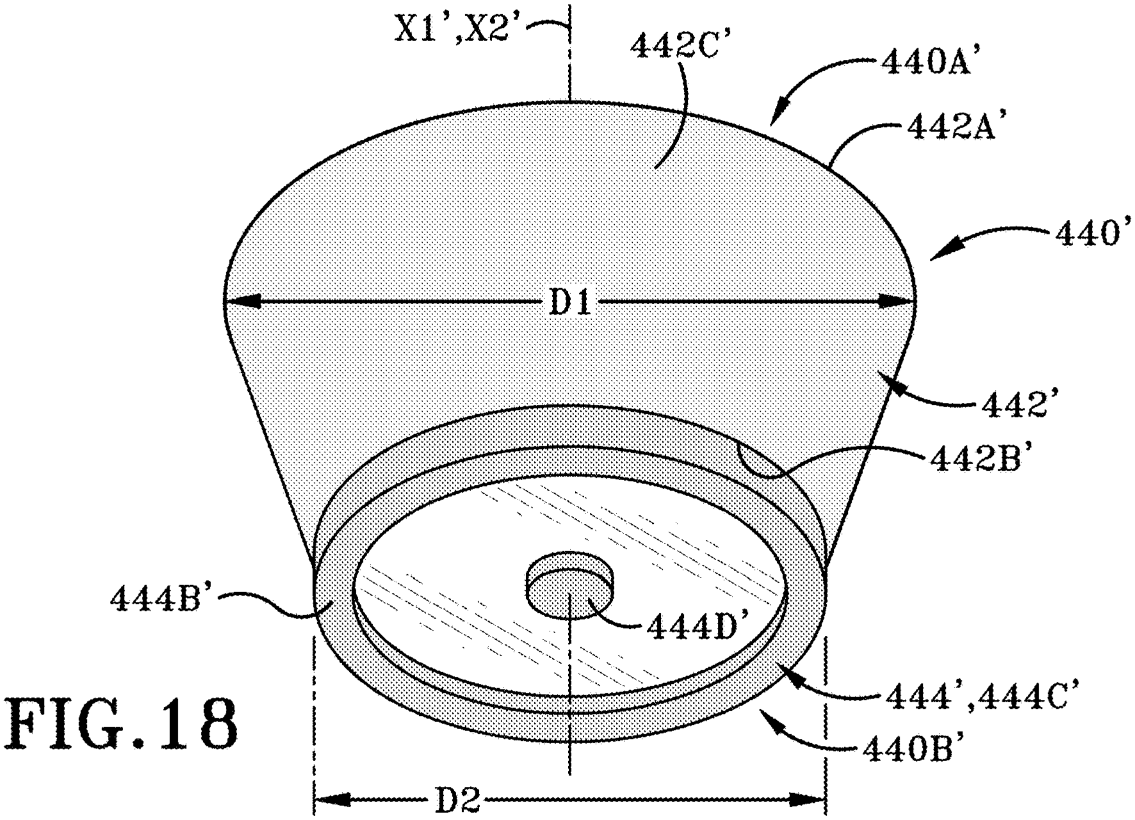
FIG. 18 is a bottom, front, side isometric perspective view of an alternative probe of the probe shown in FIG. 12.

FIG. 18 is an alternative probe 440' that may be used with a preexisting coaxial cable described and illustrated herein (e.g., preexisting coaxial cable 420, 520). Probe 440' is also similar to probe 440 as described above and illustrated in FIGS. 12-13C, except as detailed below.

As seen in FIG. 18, probe 440' includes a support structure 442'. Here, support structure 442' include a first end 442A', a second end 4426', a first outer connection 442C', and a first inner connection 442D' similar to first end 442A, second end 4426, first outer connection 442C, and first inner connection 442D of support structure 442. However, support structure 442' defines a first diameter D1 at the first end 442A' and a second diameter D2 at the second end 4426' in which the first diameter D1 is greater than the second diameter D2. As such, the diameter of the support structure 442' tapers inward from the first diameter D1 to the second diameter D2. It should be understood that the tapered configuration is used to taper an outer conductor of a preexisting coaxial cable (e.g., the outer conductor 420C of preexisting coaxial cable 420) and an inner conductor of a preexisting coaxial cable (e.g., the inner conductor 420D of the preexisting coaxial cable 420) down to a size that is compatible with coaxial IO pads provided on a die.

Still referring to FIG. 18, probe 440' also includes a probe tip 444' that operably engages with the support structure 442'. Here, probe tip 444' include a first end 444A', a second end 4446', a first outer connection 444C', and a first inner connection 444D' similar to first end 444A, second end 4446, first outer connection 444C, and first inner connection 444D of probe tip 444. However, probe tip 444' defines the second diameter D2 along the entire length of the probe tip 444' from the first end 444A' to the second end 4446'.

Figure 19:
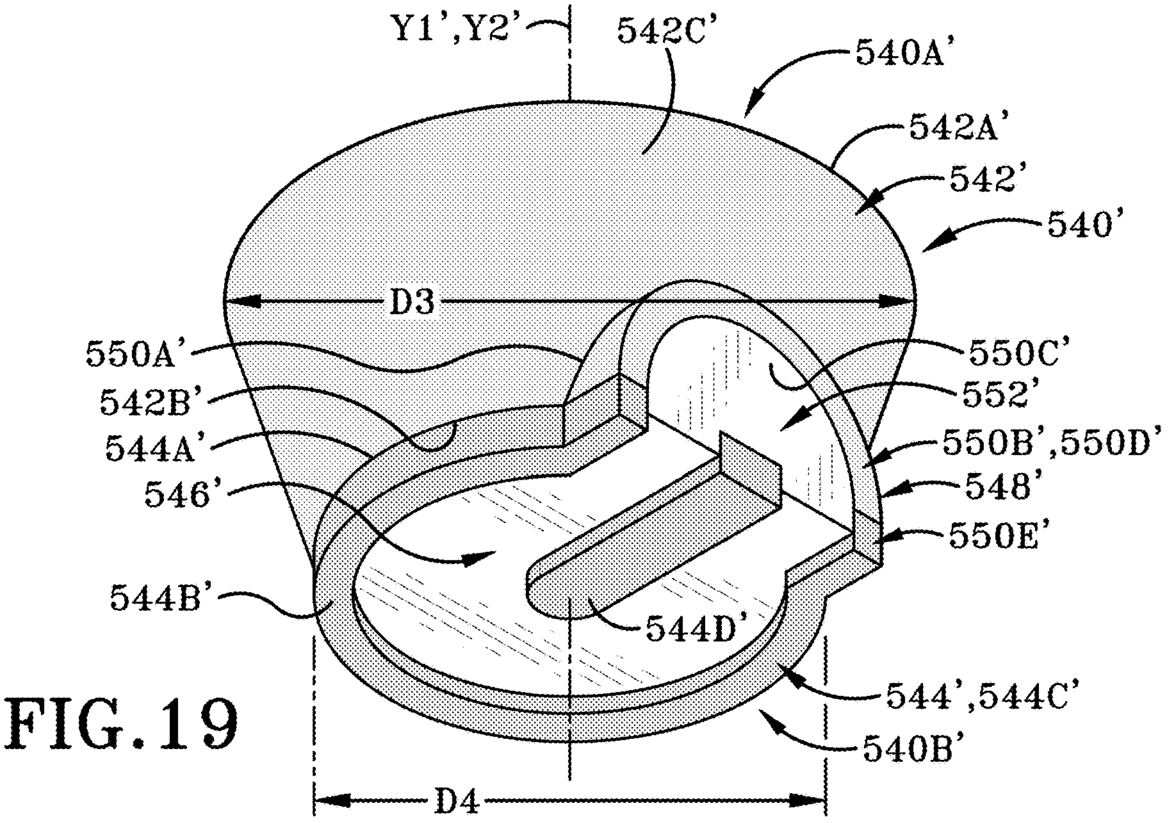
FIG. 19 is a bottom, front, side isometric perspective view of an alternative probe of the probe shown in FIG. 15.

FIG. 19 is another alternative probe 540' that may be used with a preexisting coaxial cable described and illustrated herein (e.g., preexisting coaxial cable 520). Probe 540' is also similar to probe 540 as described above and illustrated in FIGS. 15-6, except as detailed below.

As seen in FIG. 19, probe 540' includes a support structure 542'. Here, support structure 542' include a first end 542A', a second end 5426', a first outer connection 542C', and a first inner connection 542D' similar to first end 542A, second end 5426, first outer connection 542C, and first inner connection 542D of support structure 542. However, support structure 542' defines a third diameter D3 at the first end 542A' and a fourth diameter D4 at the second end 5426' in which the third diameter D3 is greater than the fourth diameter D4. As such, the diameter of the support structure 442' tapers inward from the third diameter D3 to the fourth diameter D5. It should be understood that the tapered configuration is used to taper an outer conductor of a preexisting coaxial cable (e.g., the outer conductor 420C of preexisting coaxial cable 420) and an inner conductor of a preexisting coaxial cable (e.g., the inner conductor 420D of the preexisting coaxial cable 420) down to a size that is compatible with coaxial IO pads provided on a die.

Still referring to FIG. 19, probe 540' also includes a probe tip 544' that operably engages with the support structure 542'. Here, probe tip 544' include a first end 544A', a second end 5446', a first outer connection 544C', and a first inner connection 544D' similar to first end 544A, second end 5446, first outer connection 544C, and first inner connection 544D of probe tip 544. However, probe tip 544' defines the fifth diameter D5 along the entire length of the probe tip 544' from the first end 544A' to the second end 54413'.

Probe 540' also retains similar components and/or elements described in probe 540. Particularly, as best seen in FIG. 19, probe 540' includes a dielectric component 546' similar to dielectric component 546 of probe 546 as well as a protruding structuring 548' having an arch 550' with a first end 550A', a second end 550B', a passageway 550C', a first portion 550D', and a second portion 550E' and a dielectric component 552' similar to protruding structuring 548 having arch 550 with first end 550A, second end 550B, passageway 550C, first portion 550D, and second portion 550E and dielectric component 552.

Figure 20:
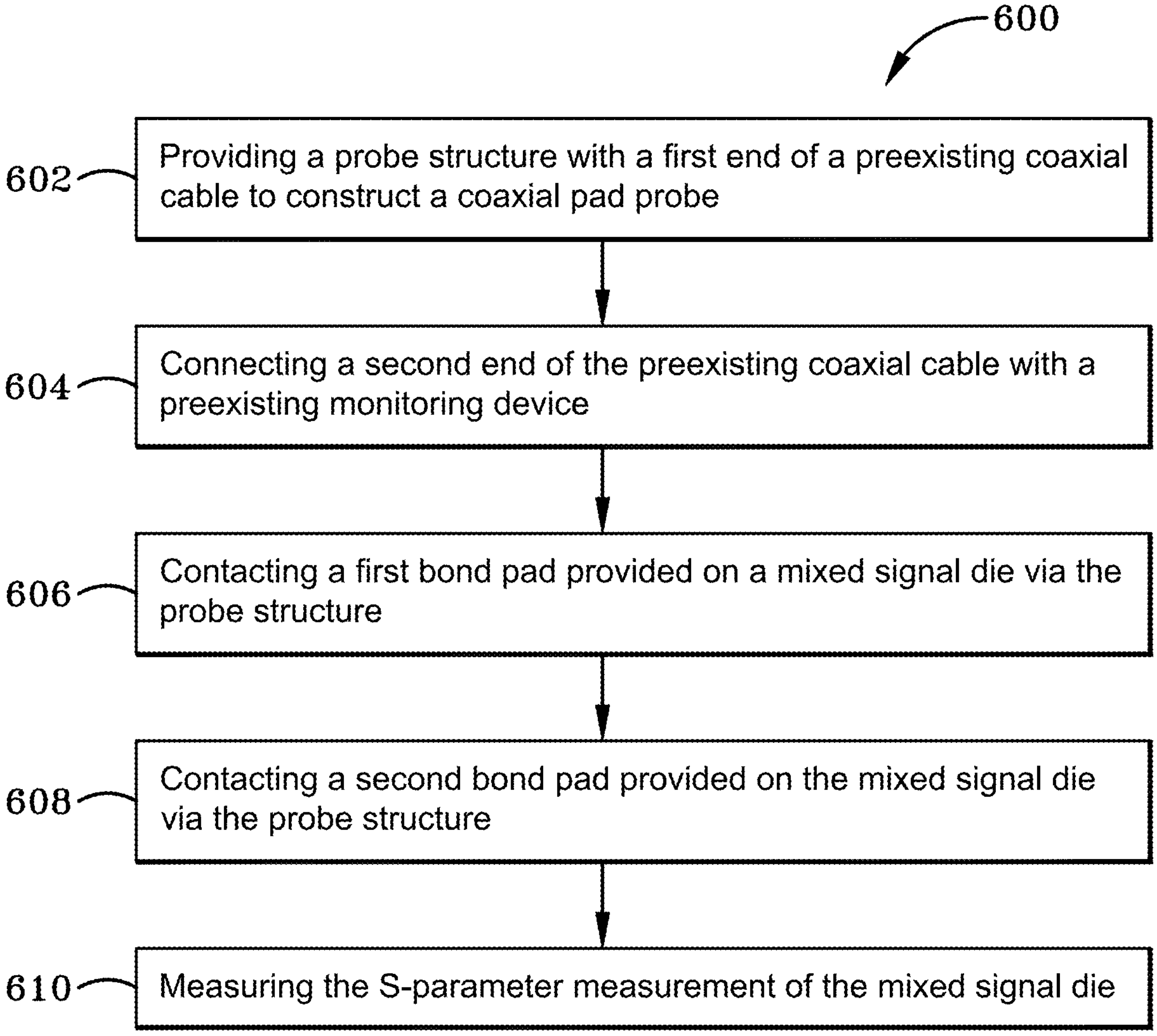
FIG. 20 is another exemplary flowchart. Similar numbers refer to similar parts throughout the drawings.

FIG. 20 illustrates a method 600 for measuring an S-parameter measurement of a mixed signal die. An initial step 602 of method 600 may include connecting a first end of a coaxial cable with an analyzing device. Another step 604 of method 600 may include providing a probe with a second end of the coaxial cable to construct a coaxial pad probe. Another step 606 of method 600 may include contacting a first bond pad provided on the mixed signal die with the probe. Another step 608 of method 600 may include contacting a second bond pad provided on the mixed signal die with the probe. Another step 610 of method 600 may include measuring the S-parameter measurement of the mixed signal die.

In other exemplary embodiments, method 600 may include additional and/or optional steps. An optional step may further include that the step of measuring the S-parameter measurement of the mixed signal die is accomplished by measuring an electrical signal at a coaxial input/output (IO) connection provided on the mixed signal die or a coplanar IO connection provided on the mixed signal die. Optional steps may further include that the step of providing the probe with the first end of the coaxial cable further comprises: providing a first outer connection of a support structure of the probe with an outer conductor of the coaxial cable; providing a first inner connection of the support structure of the probe with an inner conductor of the coaxial cable; providing a second outer connection of a probe tip of the probe with the first outer connection of the support structure; and providing a second inner connection of the probe tip of the probe with the first inner connection of the support structure. Optional steps may further include that the step of contacting the first bond pad provided on the mixed signal die further comprises: contacting the second outer connection with the first bond pad provided on the mixed signal die; and wherein the step of contacting the second bond pad provided on the mixed signal die further comprises: contacting the second inner connection with the second bond pad provided on the mixed signal die; wherein the mixed signal die is a coaxial IO connection. Optional steps may further include that the step of providing the probe with the first end of the coaxial cable further comprises: providing a first outer connection of a support structure of the probe with an outer conductor of the coaxial cable; providing a first inner connection of the support structure of the probe with an inner conductor of the coaxial cable; providing a second outer connection of a probe tip of the probe with the first outer connection of the support structure; providing a second inner connection of the probe tip of the probe with the first inner connection of the support structure; providing a protruding structure with the first outer connection and the second outer connection; wherein the second inner connection is provided inside of the protruding structure. Optional steps may further include that the step of contacting the first bond pad provided on the mixed signal die further comprises: contacting the second outer connection and the protruding structure with the first bond pad provided on the mixed signal die; and wherein the step of contacting the second bond pad provided on the mixed signal die further comprises: contacting the second inner connection with the second bond pad provided on the mixed signal die; wherein the mixed signal die is a coplanar IO connection.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed is:

1. A semiconductor package, comprising:
an interconnect;
a mixed signal die having a first surface operably engaged with the interconnect and a second surface opposite to the first surface; and
at least one set of input/output (IO) connections on the mixed signal die;
wherein the at least one set of IO connections is configured to be electromagnetically shielded in a non-linear geometry from at least another set of IO connections that is different from the at least one set of IO connections;
wherein the at least one set of IO connections further comprises:
at least one radio frequency (RF) connection formed on the mixed signal die; the at least one RF connection comprises:
a first bond pad; and
a second bond pad circumferentially surrounded by the first bond pad in a continuous, non-linear geometry to electromagnetically shield the second bond pad.

2. The semiconductor package of claim 1, wherein the at least one set of IO connections further comprises:
at least one radio frequency (RF) connection formed on the mixed signal die;
wherein at least one bond pad of the at least one RF connection is configured to be electromagnetically shielded in a non-linear geometry from the at least another set of IO connections adjacent to the at least one RF connection.

3. The semiconductor package of claim 1, wherein the at least one set of IO connections further comprises:
at least one radio frequency (RF) connection formed to the second surface of the mixed signal die; the at least one RF connection comprises:
a first bond pad; and
a second bond pad circumferentially surrounded by the first bond pad in a continuous, curvilinear shape to electromagnetically shield the second bond pad.

4. The semiconductor package of claim 1, further comprising:
at least one electromagnetic interference (EMI) fence formed to the second surface of the mixed signal die and formed with the at least one RF connection;
wherein the at least one EMI fence is configured to electromagnetically shield the second bond pad of the at least one RF connection.

5. The semiconductor package of claim 4, wherein the at least one EMI fence comprises:
a first end formed with the first bond pad of the at least one RF connection;
a second end opposite to the first end and remote from the first bond pad of the at least one RF connection; and
at least one curve formed between the first end and the second end.

6. The semiconductor package of claim 5, wherein the at least one set of IO connections further comprises:
at least another RF connection on the mixed signal die and positioned adjacent to the at least one RF connection; the at least another RF connection comprises:

a first bond pad; and a second bond pad circumferentially surrounded by the first bond pad in a continuous, non-linear geometry to electromagnetically shield the second bond pad.

7. The semiconductor package of claim 6, further comprising:

at least another EMI fence on the mixed signal die and formed with the at least another RF connection;

wherein the at least one EMI fence is configured to electromagnetically shield the second bond pad of the at least one RF connection.

8. The semiconductor package of claim 7, wherein the at least another EMI fence comprises:

a first end formed with the first bond pad of the at least another RF connection;

a second end opposite to the first end and remote from the first bond pad of the at least another RF connection; and at least another curve shape formed between the first end and the second end.

9. The semiconductor package of claim 1, wherein the first bond pad further comprises:

a first surface;

a second surface extending from the first surface;

a circumferential wall extending between the first surface and the second surface;

wherein each of the first surface, the second surface, and the circumferential wall is continuous and uninterrupted.

10. The semiconductor package of claim 2, wherein the mixed signal die comprises:

a first peripheral edge;

a second peripheral edge being perpendicular to the first peripheral edge;

a third peripheral edge being parallel with the first peripheral edge and perpendicular to the second peripheral edge; and a fourth peripheral edge being parallel with the second peripheral edge and perpendicular to the third peripheral edge;

wherein the at least one RF connection is located interior to the first peripheral edge, the second peripheral edge, the third peripheral edge, and the fourth peripheral edge.

11. The semiconductor package of claim 2, wherein the mixed signal die comprises:

a first peripheral edge;

a second peripheral edge being perpendicular to the first peripheral edge;

a third peripheral edge being parallel with the first peripheral edge and perpendicular to the second peripheral edge; and a fourth peripheral edge being parallel with the second peripheral edge and perpendicular to the third peripheral edge;

wherein the at least one RF connection is located proximate to at least one of the first peripheral edge, the second peripheral edge, the third peripheral edge, and the fourth peripheral edge.

* * * * *